(12) United States Patent
Müller et al.

(10) Patent No.: US 10,622,051 B2
(45) Date of Patent: Apr. 14, 2020

(54) MEMORY CELL AND METHODS THEREOF

(71) Applicant: Ferroelectric Memory GmbH, Dresden (DE)

(72) Inventors: Stefan Ferdinand Müller, Dresden (DE); Marko Noack, Dresden (DE); Johannes Ocker, Dresden (DE); Rolf Jähne, Ottendorf-Okrilla (DE)

(73) Assignee: Ferroelectric Memory GMBH, Dresden (DE)

( * ) Notice: Subject to any disclaimer, the term of this patent is extended or adjusted under 35 U.S.C. 154(b) by 0 days.

(21) Appl. No.: 16/585,936

(22) Filed: Sep. 27, 2019

(65) Prior Publication Data
US 2020/0027493 A1   Jan. 23, 2020

Related U.S. Application Data

(63) Continuation of application No. 15/796,154, filed on Oct. 27, 2017, now Pat. No. 10,438,645.

(51) Int. Cl.
*H01L 29/76* (2006.01)
*G11C 11/22* (2006.01)
(Continued)

(52) U.S. Cl.
CPC ........ *G11C 11/2275* (2013.01); *G11C 11/221* (2013.01); *G11C 11/223* (2013.01);
(Continued)

(58) Field of Classification Search
CPC ...................................................... H01L 29/76
See application file for complete search history.

(56) References Cited

U.S. PATENT DOCUMENTS 6,559,469 B1   5/2003   Paz De Araujo et al.
7,709,359 B2   5/2010   Boescke et al.
(Continued)

FOREIGN PATENT DOCUMENTS

CN   106537509 A   3/2017
DE   12008024519 B4   12/2009
(Continued)

OTHER PUBLICATIONS

Tilke et al., "Highly Scalable Embedded Flash Memory With Deep Trench Isolation and Novel Buried Bitline Integration for the 90-nm Node and Beyond", IEEE, vol. 54 No. 7, dated Jul. 2007, 8 pages.
(Continued)

*Primary Examiner* — Jason Lappas
(74) *Attorney, Agent, or Firm* — Hickman Palermo Becker Bingham LLP; Malgorzata A. Kulczycka

(57) ABSTRACT

According to various embodiments, a memory cell may include: a field-effect transistor structure comprising a channel region and a gate structure disposed at the channel region, the gate structure comprising a gate electrode structure and a gate isolation structure disposed between the gate electrode structure and the channel region; and a memory structure comprising a first electrode structure, a second electrode structure, and at least one remanent-polarizable layer disposed between the first electrode structure and the second electrode structure; wherein the first electrode structure of the memory structure is electrically conductively connected to the gate electrode structure of the field-effect transistor structure.

20 Claims, 54 Drawing Sheets

(51) Int. Cl.

| | | |
|---|---|---|
| *H01L 29/51* | (2006.01) | |
| *H01L 29/06* | (2006.01) | |
| *H01L 27/11585* | (2017.01) | |
| *G11C 16/04* | (2006.01) | |
| *H01L 29/78* | (2006.01) | |
| *H01L 27/1159* | (2017.01) | |
| *H01L 27/11507* | (2017.01) | |
| *H01L 21/28* | (2006.01) | |

(52) U.S. Cl.
CPC .......... *G11C 11/2273* (2013.01); *G11C 16/04* (2013.01); *H01L 27/1159* (2013.01); *H01L 27/11507* (2013.01); *H01L 27/11585* (2013.01); *H01L 29/0673* (2013.01); *H01L 29/40111* (2019.08); *H01L 29/516* (2013.01); *H01L 29/78391* (2014.09); *H01L 29/76* (2013.01)

(56) References Cited

U.S. PATENT DOCUMENTS

| 8,304,823 | B2 | 11/2012 | Boescke |
| 9,053,802 | B2 | 6/2015 | Muller et al. |
| 9,558,804 | B2 | 1/2017 | Muller |
| 9,608,111 | B2 | 3/2017 | Ramaswamy |
| 2001/0051436 | A1 | 12/2001 | Kim |
| 2004/0129987 | A1* | 7/2004 | Uchiyama ......... H01L 21/02197 257/395 |
| 2014/0254275 | A1 | 9/2014 | Susumu |
| 2014/0355328 | A1 | 12/2014 | Muller et al. |
| 2015/0340372 | A1 | 11/2015 | Pandey et al. |
| 2016/0005961 | A1 | 1/2016 | Ino |
| 2016/0268271 | A1 | 9/2016 | Mueller et al. |
| 2017/0076775 | A1 | 3/2017 | Muller |
| 2017/0154999 | A1* | 6/2017 | Ramaswamy .... H01L 29/78391 |
| 2019/0129992 | A1 | 5/2019 | Ewen |
| 2019/0130956 | A1 | 5/2019 | Muller |

FOREIGN PATENT DOCUMENTS

| EP | 1 134 803 A1 | 9/2001 |
| EP | 1 143 525 A2 | 10/2001 |
| JP | H11 68057 A | 3/1999 |
| WO | WO 2001/071816 A1 | 9/2001 |

OTHER PUBLICATIONS

Shum et al., "Highly Scalable Flash Memory with Novel Deep Trench Isolation Embedded into High-Performance CMOS for the 90nm Node & beyond", dated 2005 IEEE, 4 pages.

Shum et al., "Highly Scalable Flash Memory Embedded into High-Performance CMOS for the 90nm Node & beyond", ICSICT_2006, Shanghai, China, 4 pages.

International Searching Authority, "Search Report" in application No. PCT/EP2018/074611, dated Nov. 19, 2018, 16 pages.

Bruyere S. et al., "Review on High-K Dielectrics Reliability Issues", IEEE Transactions on Device and Materials Reliability, IEEE Service Center, vol. 5, No. 1, dated Mar. 1, 2005 pp. 5-19.

Muller, U.S. Appl. No. 15/796,154, filed Oct. 27, 2017, Restriction Requirement, dated Nov. 13, 2018.

Muller, U.S. Appl. No. 15/796,154, filed Oct. 27, 2017, Office Action, dated Feb. 21, 2019.

Muller, U.S. Appl. No. 15/796,154, filed Oct. 27, 2017, Notice of Allowance, dated Jun. 24, 2019.

Muller, U.S. Appl. No. 15/796,154, filed Oct. 27, 2017, Interview Summary, dated May 13, 2019.

* cited by examiner

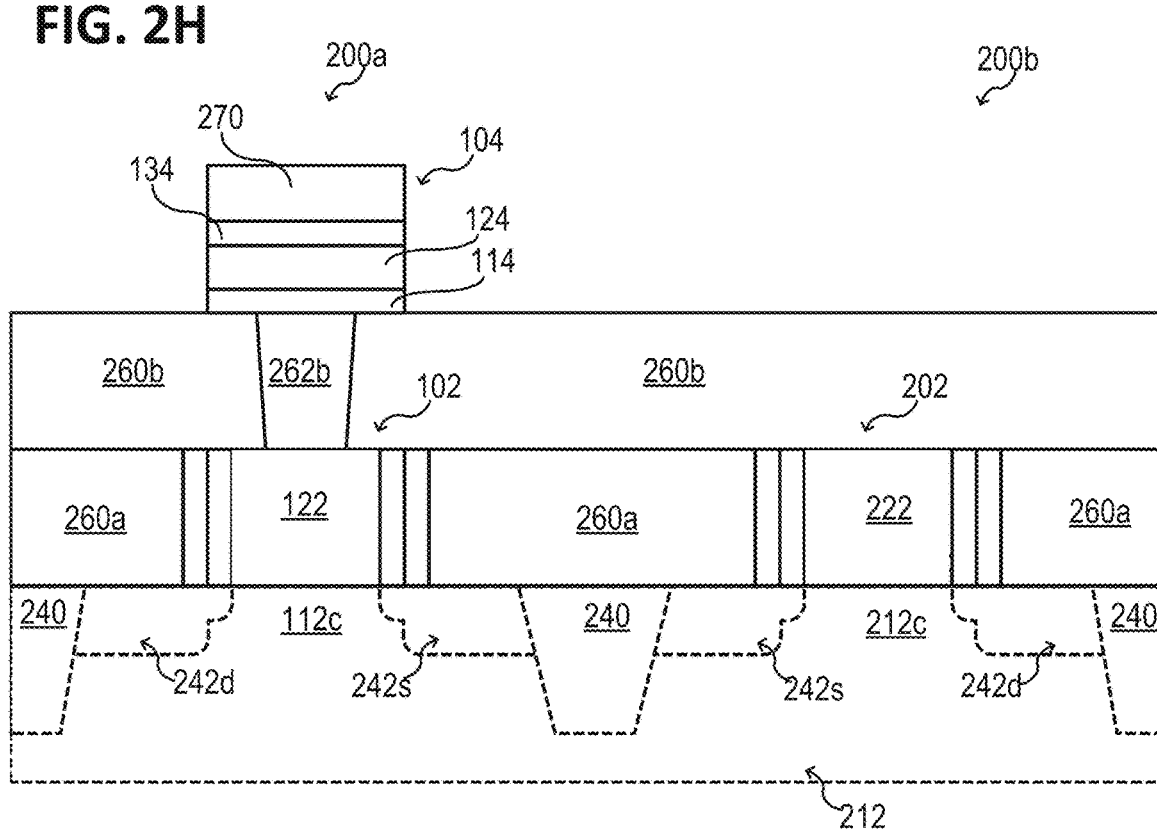
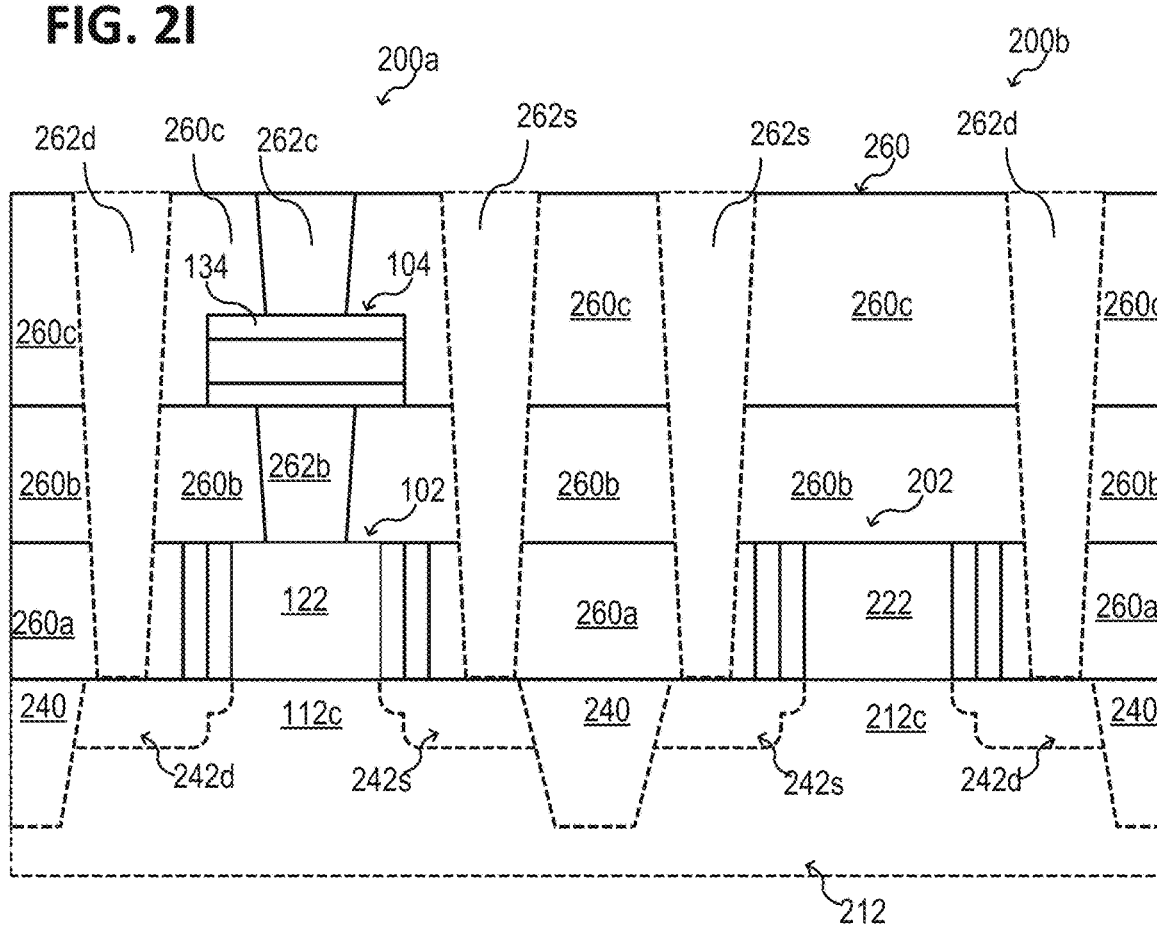

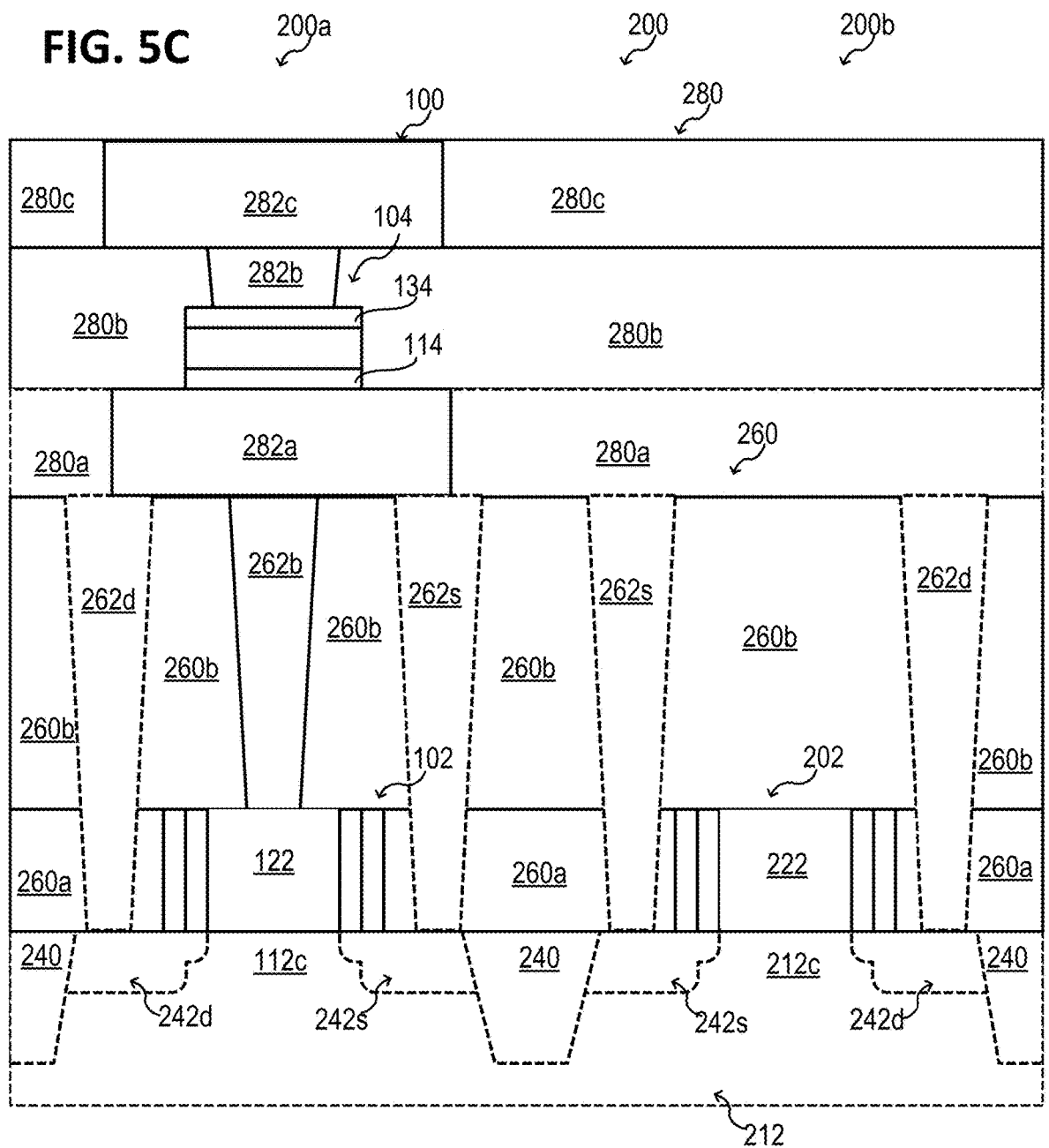

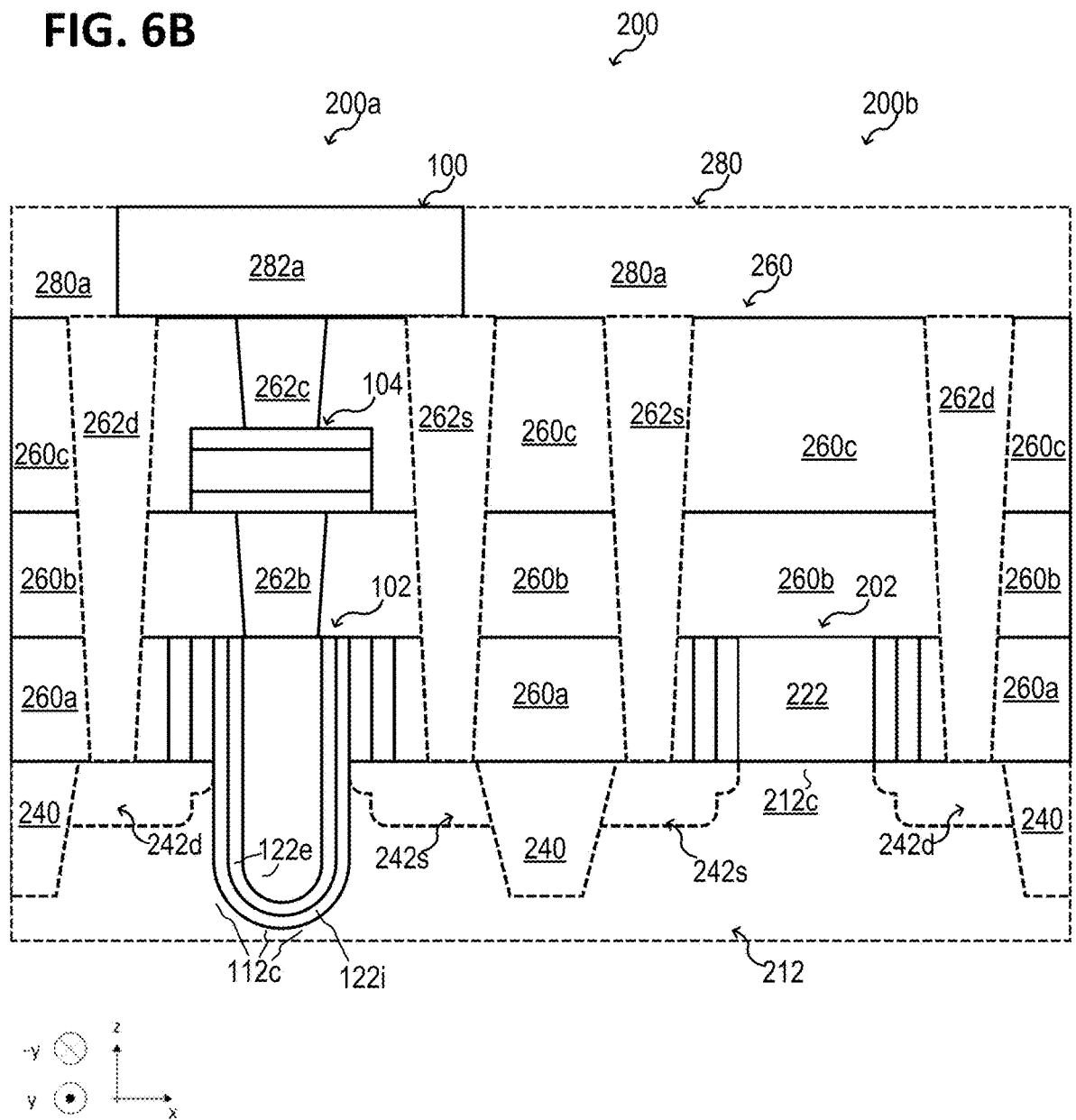

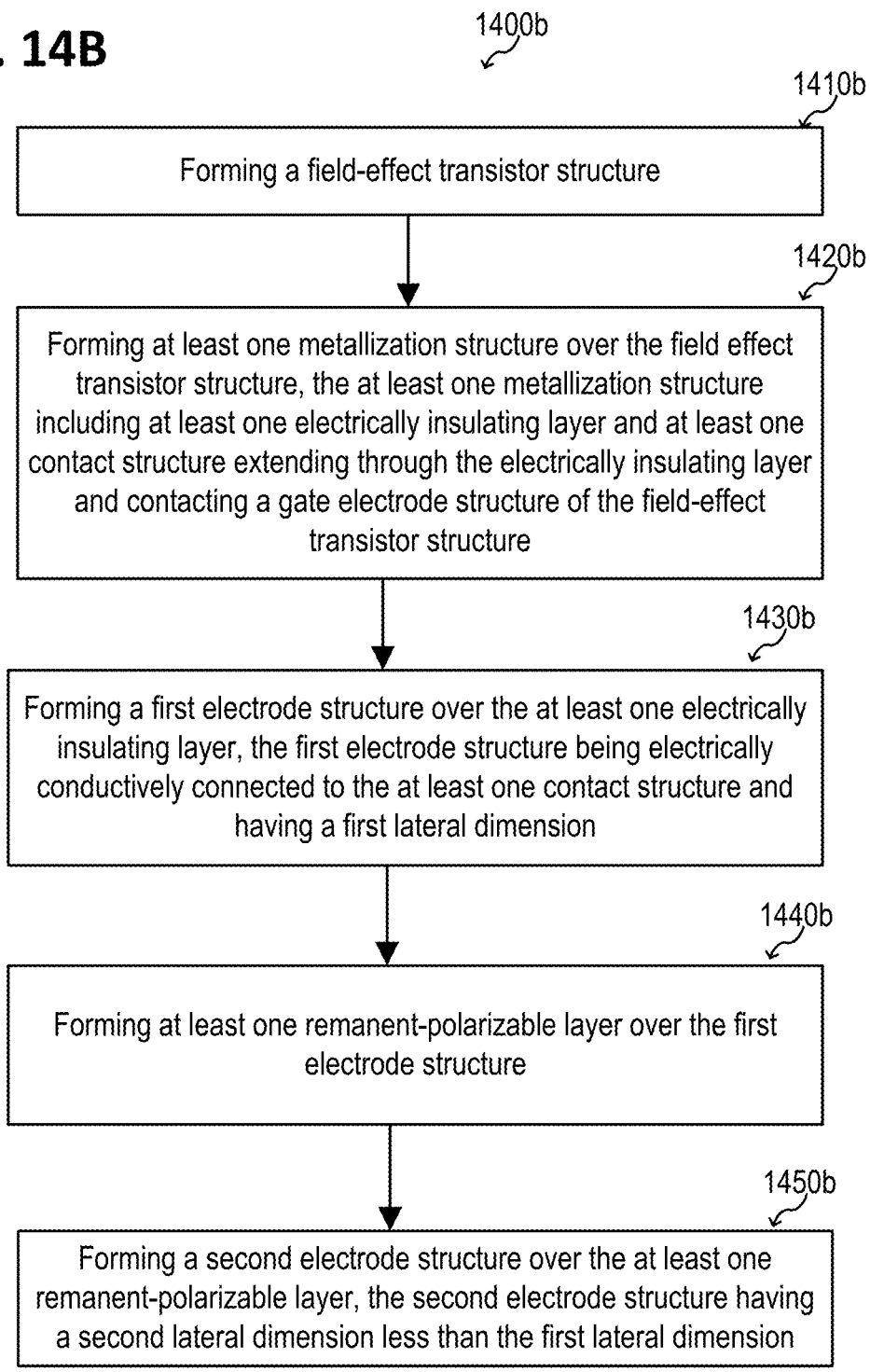

MEMORY CELL AND METHODS THEREOF

CROSS-REFERENCE TO RELATED APPLICATION

This application claims the benefit under 35 U.S.C. § 120 as a Continuation of application Ser. No. 15/796,154, filed on Oct. 27, 2017, the entire contents of which is hereby incorporated by reference for all purposes as if fully set forth herein. The applicants hereby rescind any disclaimer of claim scope in the parent applications or the prosecution history thereof and advise the USPTO that the claims in this application may be broader than any claim in the parent applications.

TECHNICAL FIELD

Various embodiments relate generally to a memory cell, an electronic device, and methods thereof, e.g., a method for processing a memory cell and a method for processing an electronic device.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two states representing a logic 1 and a logic 0. The information may be maintained (stored) until the state of the memory cell is changed, e.g., in a controlled manner. The information stored in the memory cell may be read by determining the state of the memory cell. At present, various semiconductor process flows have been established to integrate various types of memory cells. The memory cells may be, for example, integrated on a wafer or a chip together with one or more logic circuits. In this case, the process flow for integrating the memory cell and the logic circuit may be adapted to manufacture both in an efficient way.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2F to FIG. 2J show a carrier during processing a memory cell or an electronic device including a memory cell in a schematic view, according to various embodiments;

FIG. 5A to FIG. 5C show a memory cell or an electronic device including a memory cell in a schematic view, according to various embodiments;

FIG. 6A and FIG. 6B show a memory cell or an electronic device including a memory cell in a schematic view, according to various embodiments;

FIG. 14A and FIG. 14B show a schematic flow diagram of a method for processing a memory cell, according to various embodiments;

DESCRIPTION

Figure 1A:
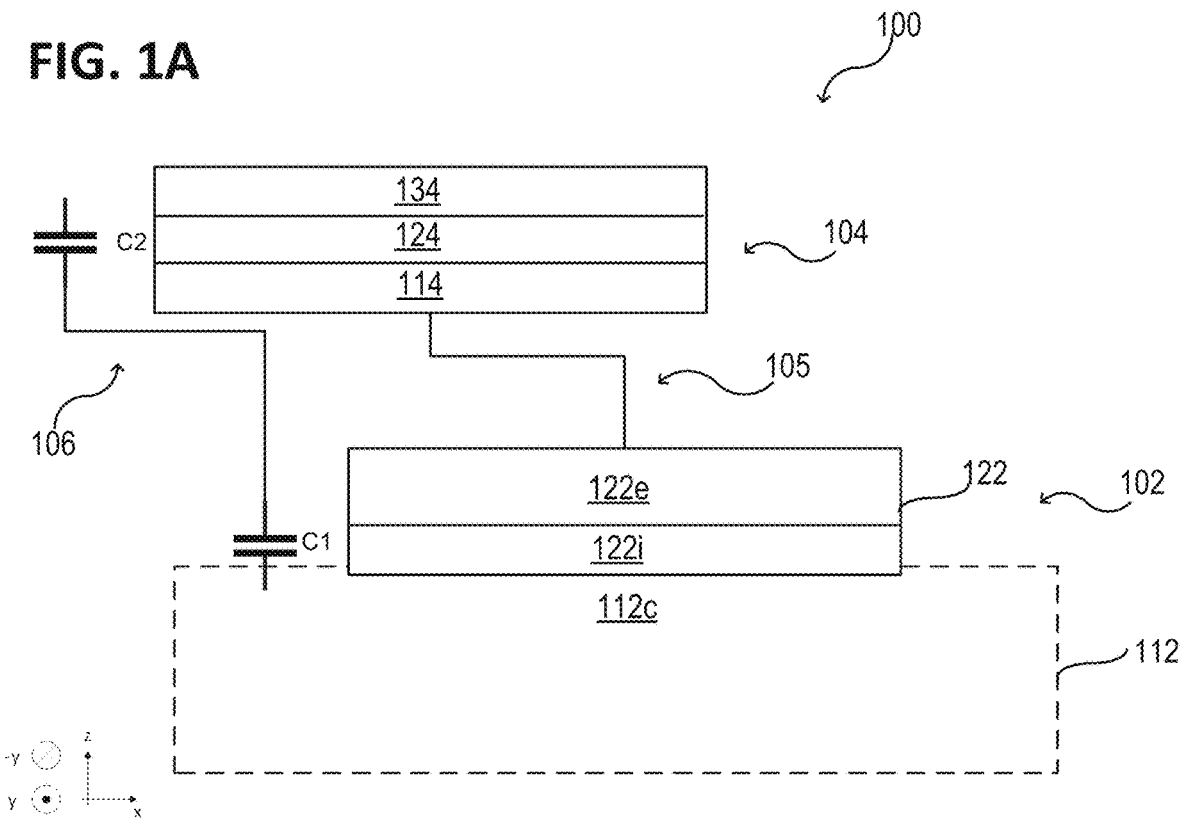
FIG. 1A and FIG. 1B show a memory cell in a schematic view, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier). The term "thickness" used with regards to a "thickness" of a layer may be used herein to mean the dimension (in other words an extent) of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "conform" or "conformally" used with regards to a layer (e.g. a spacer layer, a liner layer, etc.) may be used herein to mean that the layer may have substantially the same thickness along an interface with another structure, e.g. the shape of a surface of a conformal layer may be substantially the same as the shape as of a surface of the underlying structure on which the layer is formed. According to various embodiments, layering processes such as plating or several chemical vapor processes (CVD), e.g. low pressure (LP)-(CVD), atomic layer deposition (ALD), etc., may be used to generate a conformal layer of a material. A conformal deposition process may allow covering sidewalls completely, e.g., even if the sidewall is aligned vertical to the surface of the carrier and/or parallel to the deposition direction. A sidewall may be, for example, generated by an opening (as for example a trench, a recess, a cavity, a through hole, etc.) or by a structure element (as for example a fin, a protrusion, etc.).

The term "electrically coupled" may be used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between two regions, two contacts, etc. may be understood as an electrically conductive connection with, for example, ohmic behavior, e.g. provided by a metal or degenerate semiconductor in absence of p-n junctions in the current path. The term "contacted" that is used herein to describe an electrical contact between a contact structure and a semiconductor region, between a contact structure and an electrically conductive region, etc., may be understood as direct physical and/or direct electrical contact.

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.) with only one doping type.

According to various embodiments, a semiconductor portion may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In an embodiment, the semiconductor portion is a wafer made of silicon (e.g. p-type doped or n-type doped). In an alternative embodiment, the semiconductor portion is a silicon on insulator (SOI) wafer. In an alternative embodiment, the semiconductor portion may be provided by a semiconductor structure, e.g., by one or more semiconductor fins, one or more semiconductor fins one or more semiconductor nanosheets, one or more semiconductor nanowires, etc., disposed at a carrier.

In semiconductor industry, the integration of nonvolatile memory technologies (e.g., next to a processor core) may be useful for System-on-Chip (SoC) products like microcontrollers (MCU), etc. In the case that nonvolatile memory technologies are integrated on the same semiconductor chip as a logic circuit (e.g., next to a processor core), they may be referred to as embedded nonvolatile memories (eNVM). The eNVM market may be at present dominated by embedded Flash (eFlash), however, new emerging memories like magnetic RAM (MRAM), resistive RAM (RRAM), etc., may replace embedded Flash.

Further, another memory technology may be based on a ferroelectric field-effect transistor (FeFET). In this case, a memory cell may include a field-effect transistor (FET) having a ferroelectric material as a gate insulator. Since a ferroelectric material has two stable polarization states, it may be used to shift the threshold voltage of the field-effect transistor in a nonvolatile fashion; and, therefore, to turn the field-effect transistor, that usually loses its logic state, when power is removed, into a nonvolatile field-effect transistor that stores its state in a nonvolatile fashion, when power is removed.

In comparison to other emerging memory technologies, the FeFET memory cell may be in general integrated in the Front-End-of-Line (FEoL) and not in the Back-End-of-Line (BEoL) process flow, since it is a transistor-type of memory.

Accordingly, the integration of the FeFET memory cell may comply with the standard FEoL complementary metal-oxide-semiconductor (CMOS) process flow. Consequently, various different integration schemes may be used for different process technologies, e.g., gate-first technologies, gate-last technologies, fully-depleted silicon-on-insulator (FDSOI) technologies, Fin-FET technologies, nanosheet technologies, nanowire technologies, etc. Those different process technologies may be, for example, relevant for technology nodes with a feature size equal to or less than 45 nm.

The integration of FeFET memory cells on advanced CMOS process platforms may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures.

According to various embodiments, various designs and integration schemes for a memory cell are provided. At least some of the designs and integration schemes may be exemplarily illustrated and described for specific technology, e.g., based on a gate-last process technology. However, the designs and integration schemes described herein may be used in the same or in a similar way for any other suitable process technology.

In the following, various designs and integration schemes for a memory cell are provided. The memory cell may be formed by suitable processes (usually layering, patterning, doping, thermal treatment, etc.) used in or compatible with semiconductor processing. According to various embodiments, atomic layer deposition (ALD) may be used as a layering process. According to various embodiments, atomic layer etching (ALE) and/or reactive ion etching (RIE) may be used in a patterning process, e.g., to partially or completely remove one or more layers, etc.

According to various embodiments, an electrode structure (e.g., one or more electrode structure of a memory cell, a gate electrode structure, etc.) may include an electrode material, which may be a conductor or a highly conducting (e.g., degenerately doped) semiconductor. The electrode structure may include for example at least one material of the following group of materials: titanium nitride (TiN), tantalum nitride (TaN), carbon (C), tungsten (W), platinum (Pt), copper (Cu), aluminum (Al), ruthenium (Ru), ruthenium oxide ($RuO_2$), iridium (Ir), iridium oxide ($IrO_2$), etc. However, any other suitable material may be used to form an electrode structure (e.g., one or more electrode layers, etc.). According to various embodiments, the electrode structure may be adapted (e.g., considering a chemical and/or mechanical stability) for $HfO_2$ (e.g., ferroelectric (FE) $HfO_2$) as an adjacent insulating material.

According to various embodiments, a Back-End-of-Line (BEoL) processing may be described herein as starting from the end of the Front-End-of-Line (FEoL) processing. In this case, FEoL processing may include all process steps until and including contact formation to the active area of a transistor. Illustratively, forming a contact metallization may be the last process of an FEoL processing and forming a single or multilevel metallization may be the first process of a BEoL processing. According to various embodiments, a single or multilevel metallization may be formed in a dual-damascene technique based on copper and/or aluminum; however, any other suitable process may be used to form the single or multilevel metallization.

According to various embodiments, BEoL processing may include forming one or more metallization structures (as part of a single or multilevel metallization). In this case, the one or more metallization structures may include, for example, any type of suitable wiring structures (e.g., within one or more metal and one or more via levels) including a metal (also referred to as BEoL metal). In this case, the metal may include for example copper (Cu), cobalt (Co), aluminum (Al), etc. However, any other suitable electrically conductive material may be used.

According to various embodiments, one or more contact structures (also referred to as contacts) may be used to electrically contact a semiconductor portion, an electrode structure, etc. In this case, any electrically conductive (e.g., metallic) material may be used that is suitable for forming an electrical contact. As an example tungsten (W), cobalt (Co), etc. may be used.

According to various embodiments, a ferroelectric material may be used as part of a memory structure. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

According to various embodiments, a gate structure (e.g., including a gate isolation and a gate electrode) may be used as part of a field-effect transistor. A gate may be a main terminal of a field-effect transistor, e.g., in MOS technology. The material used to form the gate electrode may include, for example, highly doped polysilicon, aluminum, etc. However, any other suitable electrically conductive material may be used.

According to various embodiments, a high-k material may be used, e.g., within the gate isolation. A high-k (HK) material may include, for example, hafnium oxide ($HfO_2$), zirconium oxide ($ZrO_2$), lanthanum oxide ($La_2O_3$) and their doped/modified variants (e.g. doped with silicon) or any suitable insulator material that has a relative permittivity at least as high as silicon dioxide. According to various embodiments, the high-k material may also be replaced by a sacrificial layer (SL) or a combination of high-k material and sacrificial layer. Such an etch stop layer may include, for example, TiN, TaN, or any other material that is stable in contact to its interfacing materials and has a substantial selectivity to the material subject to etching (e.g. polysilicon).

According to various embodiments, one or more field-effect transistor structures may be formed in a HK-last process flow. A HK-last process flow may include forming a dummy gate structure having a dummy gate isolation structure and a dummy gate electrode structure. Further, after the dummy gate isolation structure and the dummy gate electrode structure are removed, the actual a high-k material for the gate isolation structure and one or more materials (e.g., one or more metals) for the gate electrode structure may be deposited.

According to various embodiments, one or more field-effect transistor structures may be formed in a metal-last process flow. A metal-last process flow may include forming a dummy gate structure having a gate isolation structure and a dummy gate electrode structure. Further, after the dummy gate electrode structure is removed, the one or more materials (e.g., one or more metals) for the actual gate electrode structure may be deposited. In contrast to a HK-last process flow, the gate isolation structure (e.g., the high-k material) may remain (may not be substantially removed).

According to various embodiments, an electrical insulator may be or may include any suitable type of electrically non-conductive material or a material that has a substantially lower conductivity as compared to a metal. As an example, silicon nitride (SiN), silicon oxide ($SiO_2$), etc., may be used. According to various embodiments, a ferroelectric material is considered electrically insulating. An electrical insulator may be, in some aspects, also referred to as a dielectric material.

According to various embodiments, one or more patterning processes may be used to form a field-effect transistor structure and/or a memory structure, e.g., at least one of over or in a carrier. Therefore, a mask may be used. A mask may include a material that serves for transferring a photolithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g. wet or dry chemical etching). However, any other suitable process may be used to transfer a desired pattern into one or more material layers.

According to various embodiments, a high-k metal gate (HKMG) field-effect transistor structure may be used within a memory cell and/or as logic transistor. In this case, a metal-based gate electrode structure may be disposed over a high-k material as gate isolation. In this case, the gate electrode structure may include, for example, TiN, TaN, etc. However, one or more other metals or metallic materials may be used, e.g., for adjusting the work-function of a field-effect transistor structure. The gate electrode structure may include a material with one or more incorporated dopant species, as for example, lanthanum, aluminum, etc.

According to various embodiments, a metal-ferroelectric-metal-insulator-semiconductor (MFMIS) FeFET may be provided. In this case, a floating gate, i.e. a metal layer, may be disposed between the ferroelectric material and the gate isolation. In this case, the gate of the transistor may be connected in series to a ferroelectric capacitor.

According to various embodiments, (e.g., highly) doped silicon may be used. In this case, donator (e.g. phosphorous) and/or acceptor (e.g. boron) doping may be used for doping the silicon. Silicon may be used in a single crystalline or polycrystalline microstructure.

According to various embodiments, at least one spacer (also referred to as sidewall spacer or spacer structure) may be used. In this case, a (e.g., electrically insulating) material may be utilized for covering and/or protecting one or more sidewalls of certain structures (e.g., of a gate structure, a memory structure, etc.). The material may be for example silicon nitride (SiN), silicon oxide ($SiO_2$), etc. However, any other material may be used that allows a conformal deposition for providing the spacer.

According to various embodiments, a shallow trench isolation (STI) may be used to separate adjacent field-effect transistor structures.

In the following, various integration schemes and memory cell designs are provided wherein a memory structure is disposed above a field-effect transistor structure. Various embodiments may include an integration of a memory cell in which the functional memory layer (e.g., one or more remanent-polarizable layers, one or more ferroelectric layers, etc.) may be disposed outside (e.g., above) the field-effect transistor structure. In this case, the memory state may be still encoded in the threshold voltage of the field-effect transistor. Since the functional memory layer is provided independently from the processing of the field-effect transistor, (e.g., disposed above the field-effect transistor), the memory cell may be a one-transistor (1T) cell that may be integrated efficiently into any desired process flow.

Various embodiments are related to a remanently-polarizable layer as memory layer or as a functional part of a memory structure. In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. A remanent polarization may be analyzed using capacity spectroscopy, e.g., via a static (C-V) and/or time-resolved measurement or by polarization-voltage (P-V) or positive-up-negative-down (PUND) measurements.

FIG. 1A illustrates a memory cell 100 in a schematic view, according to various embodiments. The memory cell 100 may include a field-effect transistor structure 102 and a memory structure 104. According to various embodiments, the memory structure 104 may be electrically coupled with the field-effect transistor structure 102. The field-effect transistor structure 102 may include any suitable type of field-effect transistor structure 102.

The field-effect transistor structure 102 may include a channel region 112c and a gate structure 122 disposed at the channel region 112c. Illustratively, the gate structure 122 may define a channel region 112c in a semiconductor portion 112. The gate structure 122 may include a gate electrode structure 122e and a gate isolation structure 122i disposed between the gate electrode structure 122e and the channel region 112c. The field-effect transistor structure 102 may be configured, in various embodiments, as a planar structure; however, any suitable field-effect transistor structure 102 may be used in the same or in a similar way. The semiconductor portion 112 may be part of a semiconductor wafer, a semiconductor layer (e.g., an epitaxial semiconductor layer), a semiconductor nanowire disposed on a carrier, a semiconductor nanosheet disposed on a carrier, a semiconductor fin formed at a surface of a carrier, etc.; however, the semiconductor portion 112 may be provided by any suitable material in any suitable shape. In various embodiments, silicon may be used as semiconductor material; however, any other semiconductor material may be used in the same or in a similar way.

According to various embodiments, the gate electrode structure 122e may include one or more electrically conductive layers. The gate electrode structure 122e may include, for example, one or more metal layers (also referred to as metal gate), one or more polysilicon layers (also referred to as poly-Si-gate), etc. A metal gate may include, for example, at least one work-function adaption metal layer disposed over the gate isolation structure 122i and an additional metal layer disposed over the work-function adaption metal layer. A poly-Si-gate may be, for example, p-type or n-type doped.

According to various embodiments, the gate isolation structure 122i may include any suitable single layer or layer stack that allows an electrical separation of the gate electrode structure 122e from the channel region 112c and further to influence the channel region 112c via an electric field generated by the gate electrode structure 122e. The gate isolation structure 122i may include, for example, one or more high-k material layers, a layer stack including one or more high-k material layers disposed over one or more electrically insulating layers, a single electrically insulating layer or a layer stack including two or more electrically insulating layers, etc.

According to various embodiments, the memory structure 104 may include a first electrode structure 114, a second electrode structure 134, and at least one remanent-polarizable layer 124 disposed between the first electrode structure 114 and the second electrode structure 134. The at least one remanent-polarizable layer 124 may include any type of remanent-polarizable and/or spontaneously-polarizable material, e.g., a ferroelectric material, an anti-ferroelectric material, an anti-ferroelectric-like material, etc. The at least one remanent-polarizable layer 124 may be the functional layer of the memory structure 104 to store, for example, an information via at least two remanent polarization states of the at least one remanent-polarizable layer 124. The programming of the memory structure 104 (illustratively the storage of information in the memory structure 104) may be carried out by providing an electric field between the first electrode structure 114 and the second electrode structure 134 to thereby set or change the remanent polarization state of the at least one remanent-polarizable layer 124. The electric field between the first electrode structure 114 and the second electrode structure 134 may be provided by applying a voltage between the channel region 112c and the second electrode structure 134.

According to various embodiments, the first electrode structure 114 of the memory structure 104 may be electrically conductively connected to the gate electrode structure 122e of the field-effect transistor structure 102.

As illustrated in FIG. 1A, the field-effect transistor structure 102 and the memory structure 104 may form a capacitive voltage divider 106. As an example, the channel region 112c, the gate isolation structure 122i, and the gate electrode structure 122e may form a first capacitor C1 (also referred to as first capacitor structure C1, remaining gate stack (e.g., a metal-insulator-semiconductor (MIS) gate stack, etc.) of the capacitive voltage divider 106 and the first electrode structure 114, the at least one remanent-polarizable layer 124, and the second electrode structure 134 may form a second capacitor C2 (also referred to as second capacitor structure C2, a ferroelectric capacitor, FeCap, etc.) of the capacitive voltage divider 106 coupled in series with the first capacitor C1. This configuration may allow adapting the capacitance of the respective capacitors C1, C2 to allow an efficient programming of the memory structure 104, as described in more detail below. As an example, the field-effect transistor structure 102 and the memory structure 104 may be configured to provide the second capacitor C2 with a lower capacitance than the first capacitor C1.

The overall gate voltage required for switching the memory cell 100 from one state into the other (e.g. from high threshold voltage state to low threshold voltage state), i.e. for flipping a ferroelectric dipole from, for example, "up" to "down" or "down" to "up", may become smaller since more of the applied gate voltage drops across at least one remanent-polarizable layer 124 than across the gate isolation structure 122i. The voltage distribution may be determined by voltage divider calculations for a series connection of the capacitors C1, C2. That is, if the capacitance of the second capacitor C2 (i.e. the capacitor of the memory structure 104) is reduced (e.g., by reducing the capacitor area), a higher fraction of the voltage applied to the series connection drops across the second capacitor C2. Accordingly, the electric field generated across the gate isolation structure 122i of the field-effect transistor structure 102 underneath the memory structure 104 reduces because the voltage drop across this region is reduced. This leads to a reduced interfacial field stress, which may lead to a reduced wear out of the interface due to, for example, charge injection. Therefore, the reduced electric field generated across the gate isolation structure 122i may lead to improved endurance characteristics of the memory cell 100, that is, to an increased amount of possible polarization reversals until the memory cell 100 may lose its memory properties.

By reducing the capacitor area of the second capacitor C2 (e.g., by reducing the lateral dimension), the depolarization field, $E_{Dep}$, of the at least one remanent-polarizable layer 124 may be reduced. The depolarization field may be expressed by the following set of equations, wherein the indices "FE" refer to the second capacitor C2 provided by the memory structure 104 and the indices "IS" refer to the first capacitor C1 provided by the field-effect transistor structure 102, as described herein:

$$V_{FE} + V_{IS} = 0,$$
$$D = \varepsilon_0 \varepsilon_{IS} E_{IS} = \varepsilon_0 \varepsilon_{FE} E_{FE} + P,$$
$$E_{FE} \equiv E_{Dep} = -P\left(\varepsilon_0 \varepsilon_{FE} \left(\frac{C_{IS}}{C_{FE}} + 1\right)\right)^{-1}.$$

The depolarization field $E_{Dep}$ may be detrimental to data retention since it may depend on its magnitude that depolarizes the at least one remanent-polarizable layer 124. However, the magnitude may be reduced by increasing the capacitance ratio $C_{IS}/C_{FE}$ (illustratively C1/C2). Accordingly, when the area of the second capacitor C2 is reduced, its overall capacitance is reduced and hence, the depolarization field is reduced. This in turn improves the data retention of the memory cell 100.

Figure 1B:
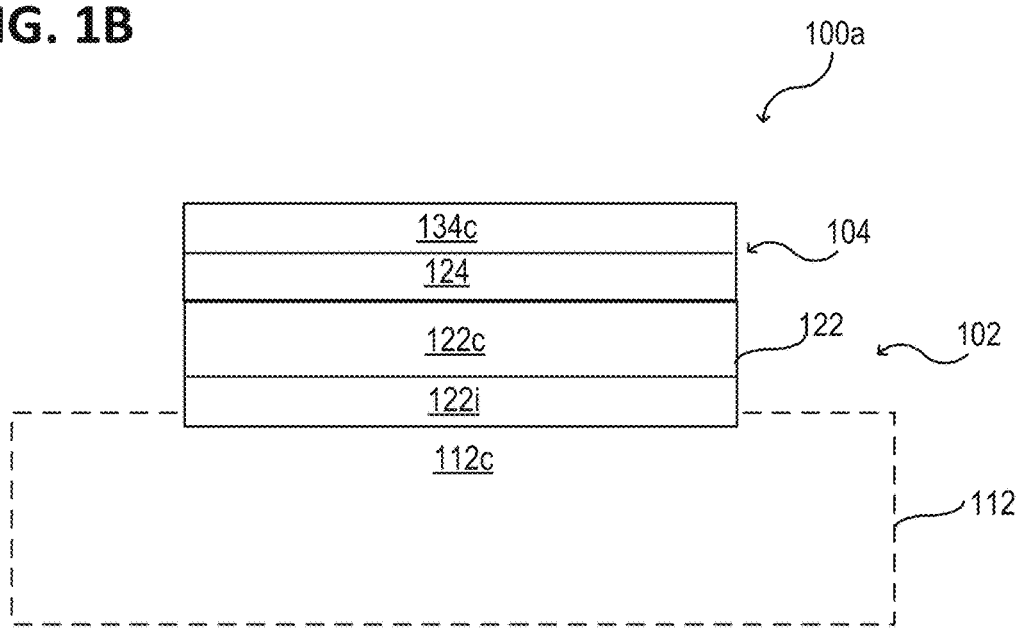

FIG. 1B illustrates a memory cell 100a in a schematic view, according to various embodiments. In this case, the memory cell 100 may include a field-effect transistor structure 102 and a memory structure 104. The field-effect transistor structure 102 may include a channel region 112c and a gate structure 122 disposed at the channel region 112c. The gate structure 122 may include a gate electrode structure 122c and a gate isolation structure 122i disposed between the gate electrode structure 122c and the channel region 112c. The memory structure 104 may include a memory electrode structure 134c and at least one remanent-polarizable layer 124 disposed between the gate electrode structure 122c and the memory electrode structure 134c. According to various embodiments, the memory cell 100a may be configured in the same or in a similar way, as described with reference to FIG. 1A; however, in this case, the gate electrode structure 122c may serve additionally as a further (e.g., bottom) electrode structure of the memory structure 104.

In a similar way, the memory cell 100, as described, for example, with reference to FIG. 1A, may be configured so that the first electrode structure 114 of the memory structure 104 is in direct physical contact with the gate electrode structure 122e of the field-effect transistor structure 102.

The memory cell 100 illustrated, for example, in FIG. 1A may include an electrically conductive (e.g., ohmic) connection 105 between the field-effect transistor structure 102 and the memory structure 104. According to various embodiments, the electrically conductive connection 105 may be provided by one or more metallization structures disposed over the field-effect transistor structure 102, as described in more detail below. The one or more metallization structures may be configured to electrically conductively connect the gate electrode structure 122e of the field-effect transistor structure 102 to the first electrode structure 114 of the memory structure 104, as described above. As an example, the one or more metallization structures may include a contact metallization. The contact metallization may be at least partially disposed between the field-effect transistor structure 102 and the memory structure 104. As another example, the one or more metallization structures may include a contact metallization and a single- or multilevel metallization disposed over the contact metallization. In this case, both the contact metallization and at least one level of the single- or multilevel metallization may be disposed between the field-effect transistor structure 102 and the memory structure 104.

According to various embodiments, the field-effect transistor structure 102 may be processed independently from the memory structure 104, e.g., prior to forming the memory structure 104. The field-effect transistor structure 102 may be, for example, readily processed before the memory structure 104 is formed over the field-effect transistor structure 102. The memory structure 104 may be formed within or on top of the contact metallization that is used to electrically contact the field-effect transistor structure 102. Alternatively, the memory structure 104 may be formed within or on top of the single or multilevel metallization (e.g., in the routing layers, via layers, etc.) in the BEoL processing.

Various exemplary modifications and/or configurations of the memory cell 100 are described in more detail below. The memory cell 100 may be, for example, integrated on a carrier (e.g., a semiconductor wafer, etc.) side-by-side with one or more logic cells, as described in the following based on various integration schemes. However, the memory cell 100 may be integrated in a similar way with any another integrated circuit structure or micro-mechanical structure. Further, the memory cell 100 may be integrated in a similar way solely.

FIGS. 2A to 2J illustrate a carrier 212 during processing, e.g., during processing (e.g., manufacturing) a memory cell 100 or an electronic device 200, according to various embodiments. The carrier 212 may be a semiconductor die, a semiconductor wafer, a semiconductor portion, etc. Further, a memory area 200a and a logic area 200b may be associated with the carrier 212. One or more memory cells 100 may be disposed (e.g., formed) in the memory area 200a. Each of the one or more memory cells 100 may include a field-effect transistor structure 102 and a memory structure 104, as described herein. Further, one or more logic transistor structures 202 (e.g., one or more field-effect transistor structures) may be disposed (e.g., formed) in the logic area 200b. The logic transistor structures 202 disposed in the logic area 200b are illustrated and described herein exemplarily as field-effect transistor structures 202. However, any other suitable type of transistor may be formed in the logic area 200b.

According to various embodiments, the one or more field-effect transistor structures 102 disposed within the memory area 200a may have substantially the same structure as the one or more logic transistor structures 202 disposed within the logic area 200b. However, different types of transistor structures 102, 202 may be used in the memory area 200a and in the logic area 200b in a similar way.

Figure 2A:
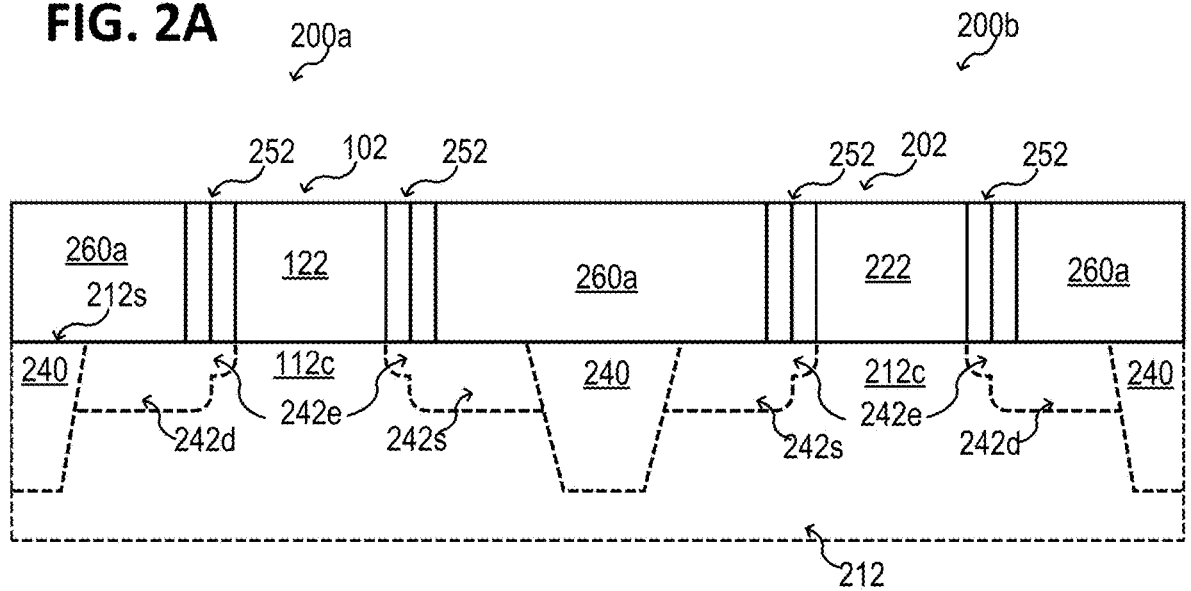
FIG. 2A shows a carrier during processing a memory cell or an electronic device including a memory cell in a schematic view, according to various embodiments.
Figure 2B:
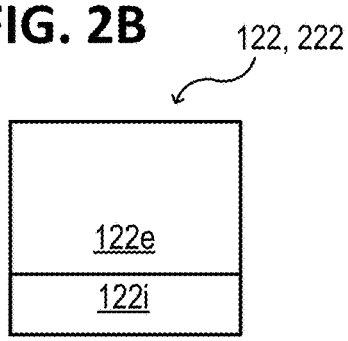
FIG. 2B to FIG. 2E show a gate structure of a field-effect transistor structure in a schematic view, according to various embodiments.

FIG. 2A shows the carrier 212 in a schematic cross-sectional view at an initial processing stage, according to various embodiments. A first field-effect transistor structure 102 may be formed in the memory area 200a of the carrier 212 and second field-effect transistor structure 202 may be formed in the logic area 200b of the carrier 212.

The first field-effect transistor structure 102 in the memory area 200a may include a first channel region 112c disposed in the carrier 212 and a first gate structure 122 disposed at the first channel region 112c. The second field-effect transistor structure 202 in the logic area 200b may include a second channel region 212c disposed in the carrier 212 and a second gate structure 222 disposed at the second channel region 212c.

Further, each of the field-effect transistor structures 102, 202 may include at least two corresponding source/drain regions 242d, 242s. The respective channel regions 112c, 212c may be disposed between the corresponding source/drain regions 242d, 242s. According to various embodiments, at least two source/drain regions 242d, 242s may be associated with each of the field-effect transistor structures 102, 202, wherein one may be used as a source and the other one may be used as a drain for operating the respective field-effect transistor structure 102, 202. The source/drain regions 242d, 242d may include source/drain extensions 242e. The carrier 212 may have a main processing surface 212s. The respective gate structures 122, 222 may be disposed above (e.g., directly on) the main processing surface 212s. According to various embodiments, the source, drain and the respective extension regions may be modified as desired, e.g., the source, drain and the respective extension regions in the memory area 200a may be different from the source, drain and the respective extension regions in the logic area 200b.

FIG. 2B to FIG. 2E show various designs for a gate structure 122, 222 in schematic cross-sectional views, according to various embodiments. The respective gate structure 122, 222 may be used as the first gate structure 122 of the memory cell 100 in the memory area 200a and/or as the second gate structure 222 of a logic transistor structure 202 in the logic area 200b.

The respective gate structure 122, 222 may include a gate electrode structure 122e and a gate isolation structure 122i. The gate isolation structure 122i may be disposed between the gate electrode structure 122e and the respective channel region 112c, 212c.

According to various embodiments, the gate electrode structure 122e may include a first metal layer (e.g., a liner layer) 122e-1 and a second metal layer 122e-2 disposed over the first metal layer. As an example, the first metal layer 122e-1 may include an electrically conductive liner material, e.g., titanium nitride, etc., and may have a thickness in the range from about 0.5 nm to about 5 nm, e.g. a thickness of about 2 nm. Further, the second metal layer 122e-2 may include, for example, aluminum. However, other suitable materials and designs may be used as gate electrode structure 122e, e.g., polysilicon.

According to various embodiments, the gate isolation structure 122i may include a first gate isolation layer 122i-1 and a second gate isolation layer 122i-2 disposed over the first gate isolation layer 122i-1. As an example, the first gate isolation layer 122i-1 may include an electrically insulating material, e.g., silicon oxide ($SiO_2$), and may have a thickness in the range from about 0.5 nm to about 5 nm, e.g. a thickness of about 1 nm. The second gate isolation layer 122i-2 may include a high-k material, e.g. $HfO_2$, and may have a thickness in the range from about 0.5 nm to about 5 nm, e.g. a thickness of about 1.5 nm. The first gate isolation layer 122i-1 may be disposed directly on the channel region and may provide an interface for forming the second gate isolation layer 122i-2. However, other suitable materials and designs may be used as gate isolation structure 122i, e.g., a single silicon oxide layer, an ONO-(silicon oxide/silicon nitride/silicon oxide)-layer stack, etc. According to various embodiments, one of the gate isolation layers 122i-1, 122i-2 may be optional.

Figure 2C:
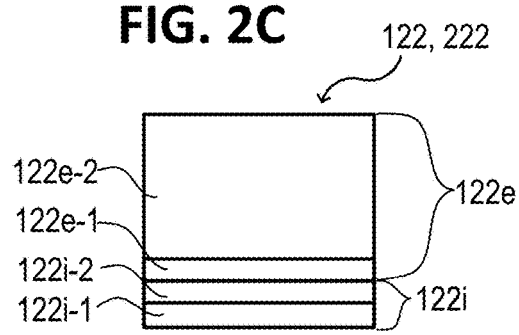
Figure 2D:
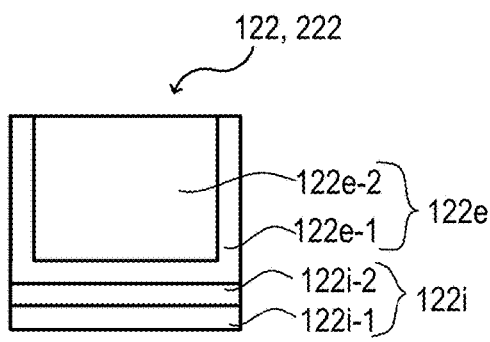
Figure 2E:
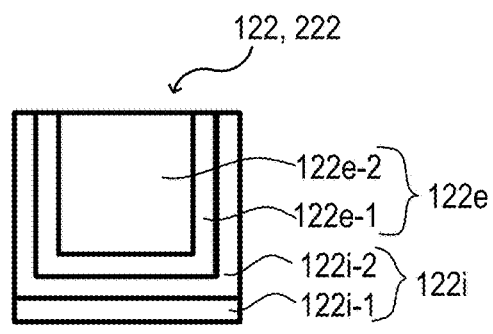

As an example, FIG. 2C shows a gate structure 122, 222 formed via a gate first process flow, FIG. 2D shows a gate structure 122, 222 formed via a metal last process flow, and FIG. 2E shows a gate structure 122, 222 formed via a high-k last process flow. According to various embodiments, the gate structure 122, 222 may be formed in a single process flow at the same time.

According to various embodiments, the respective gate structure 122, 222 may be formed between one or more spacer structures 252, between two single or two pairs of spacers including, for example, silicon nitride (SiN), silicon oxide ($SiO_2$), etc. having a width in the range from about 0.5 nm to about 5 nm, e.g., a width of 3 nm. The one or more spacer structures 252 may be used for forming (e.g., doping via ion implantation, etc.) the source/drain regions 242d, 242s and/or the source/drain extensions 242e. The one or more spacer structures 252 may be formed by one or more conformal deposition processes (e.g., using ALD) and one or more anisotropic etch processes (e.g., using RIE).

The source/drain regions 242d, 242s and/or the source/drain extensions 242e may include, for example in an NFET configuration, phosphorous (P) or arsenic (As) doped silicon, or, for example in a PFET configuration, boron (N) doped silicon. The doped silicon may be doped to have a dopant concentration in the range from about $10^{17}$ $cm^{-3}$ to about $10^{21}$ $cm^{-3}$, e.g. about $10^{18}$ $cm^{-3}$.

According to various embodiments, the first channel region 112c of the memory area 200a and the second channel region 212c of the logic area 200b may be separated by at least one isolation structure 240, e.g., by an STI.

According to various embodiments, the gate structures 122, 222 may be embedded in (e.g., may be laterally surrounded by) a first insulator layer 260a. The first insulator layer 260a may include a dielectric material, e.g., silicon oxide ($SiO_2$), silicon nitride ($SiN_x$), etc.

Figure 2F:
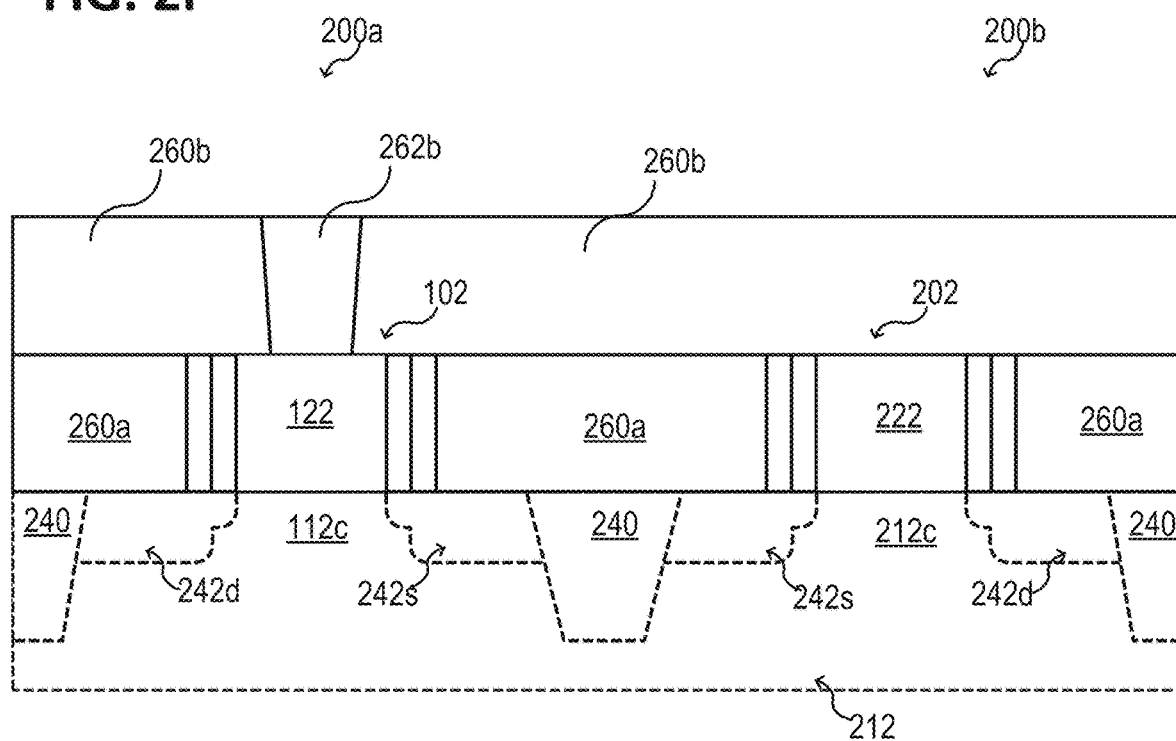

FIG. 2F shows the carrier 212 in a schematic cross-sectional view at a further processing stage, according to various embodiments. A metallization structure may be formed over the field-effect transistor structure 102 and the logic transistor structure 202 in the memory area 200a and in the logic area 200b. The metallization structure may include a gate contact structure 262b (also referred to as gate contact). The gate contact structure 262b may be embedded in (e.g., may be laterally surrounded by) a second insulator layer 260b. The second insulator layer 260b may include a dielectric material, e.g., silicon oxide ($SiO_2$), silicon nitride ($SiN_x$), etc., having, for example, a thickness in the range from about 10 nm to about 100 nm, e.g., a thickness of 40 nm. The gate contact structure 262b may include at least one metal layer, e.g., including tungsten (W), cobalt (Co), etc. The gate contact structure 262b may be in direct physical contact with the gate structure 122 (e.g., with the gate electrode structure 122e) of the field-effect transistor structure 102 in the memory area 200a.

Figure 2G:
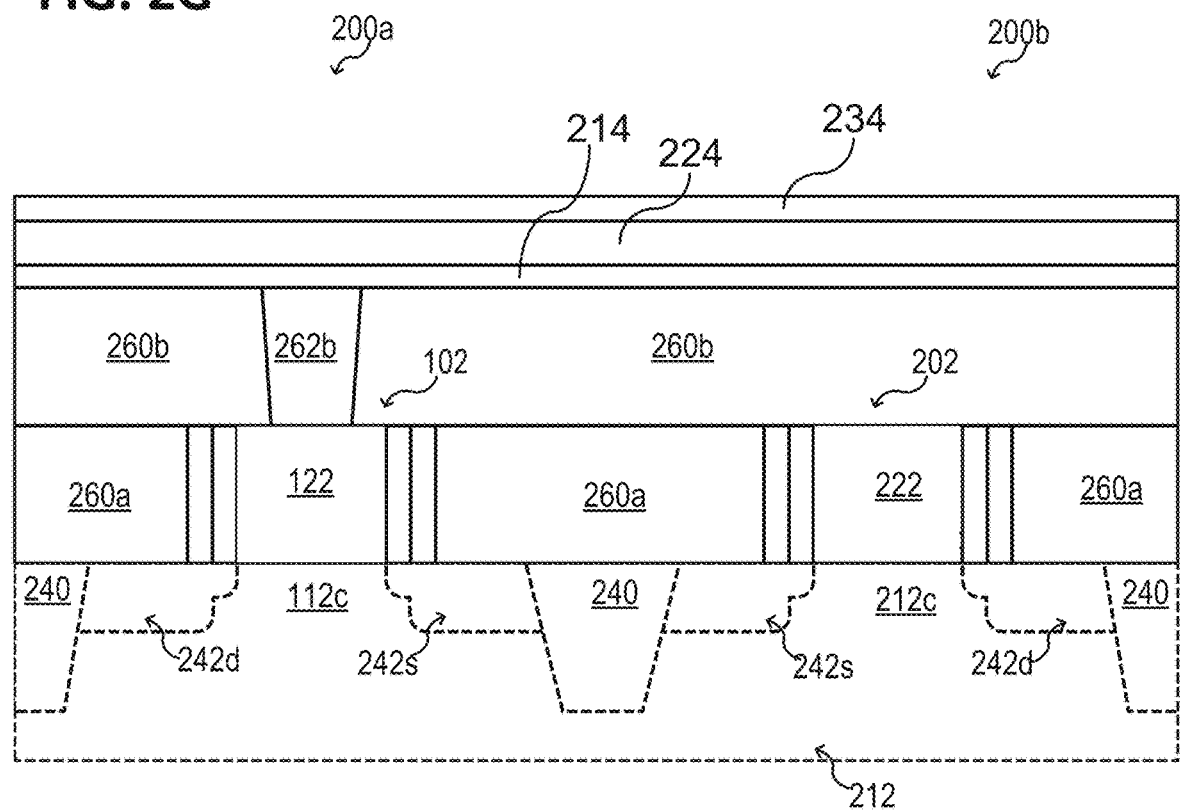

FIG. 2G and FIG. 2H show the carrier 212 in a schematic cross-sectional view at further processing stages, according to various embodiments. A memory structure 104 may be formed over the field-effect transistor structure 102 in the memory area 200a. The memory structure 104 may be configured as described herein with reference to the memory cell 100. The memory structure 104 may include a first electrode structure 114 (e.g., a bottom electrode layer), a second electrode structure 134 (e.g., a top electrode layer), and at least one remanent-polarizable layer 124 disposed between the two electrode structures 114, 134. The first electrode structure 114 of the memory structure 104 may be electrically conductively connected to the gate electrode structure 122e of the field-effect transistor structure 104 in the memory area. According to various embodiments, the electrical connection between the first electrode structure 114 of the memory structure 104 and the gate electrode structure 122e may be formed by the gate contact structure 262b. In other words, the first electrode structure 114 of the memory structure 104 may be formed over (e.g., directly on) the gate contact structure 262b. According to various embodiments, the field-effect transistor structure 102 and the memory structure 104 in the memory area 200a may form a memory cell 100, as described herein.

As illustrated in FIG. 2G and FIG. 2H show, the memory structure 104 may be formed by layering and patterning. The layering may include forming a first electrode layer 214 (e.g., a bottom electrode layer), a second electrode layer 234 (e.g., a top electrode layer), and at least one remanent-polarizable layer 224 disposed between the two electrode layers 214, 234. The patterning may include forming a mask 270 (e.g., a silicon nitride hard mask having a thickness in the range from about 5 nm to about 100 nm) defining the lateral dimension of the memory structure 104 and partially removing the electrode layers 214, 234 and the at least one remanent-polarizable layer 224 to form the memory structure 104. The memory structure 104 may be formed over the metallization structure (illustratively the contact metallization) including the gate contact structure 262b. The logic area 200b may be free of the memory structure 104 after the respective layers were patterned via the mask 270. According to various embodiments, the first electrode structure 114 (or layer 214) may include titanium nitride and may have a thickness in the range from about 1 nm to about 15 nm, e.g. a thickness of about 8 nm. According to various embodiments, the at least one remanent-polarizable layer 124, 224 may include ferroelectric $HfO_2$, e.g. $Hf_xZr_{1-x}O_2$ (e.g., with x=0.5) and may have a thickness in the range from about 3 nm to about 40 nm, e.g., a thickness of about 10 nm. According to various embodiments, the second electrode structure 134 (or layer 234) may include titanium nitride and may have a thickness in the range from about 1 nm to about 15 nm, e.g. a thickness of about 8 nm.

FIG. 2I shows the carrier 212 in a schematic cross-sectional view at a further processing stage, according to various embodiments. A further metallization structure may be formed over the memory structure 104 in the memory area 200a and in the logic area 200b. The metallization structure may include a memory contact structure 262c (also referred to as memory contact). The memory contact structure 262c may be embedded in (e.g., may be laterally surrounded by) a third insulator layer 260c. The third insulator layer 260c may include a dielectric material, e.g., silicon oxide ($SiO_2$), silicon nitride ($SiN_x$), etc., having, for example, a thickness in the range from about 10 nm to about 100 nm, e.g., a thickness of 40 nm. The memory contact structure 262c may include at least one metal layer, e.g., including tungsten (W), cobalt (Co), etc. The memory contact structure 262c may be in direct physical contact with the memory structure 104 (e.g., with the second electrode structure 134) in the memory area 200a.

According to various embodiments, the gate contact structure 262b and the memory contact structure 262c may be part of a contact metallization 260. The contact metallization 260 may further include one or more source/drain contact structures 262d, 262s electrically contacting the respective source/drain regions 242s, 242d of the field-effect transistor structures 102, 202. The one or more source/drain contact structures 262d, 262s may be illustrated in dashed lines since they may be disposed in a different plane with respect to the cross section illustrated in FIG. 2I.

Figure 2J:
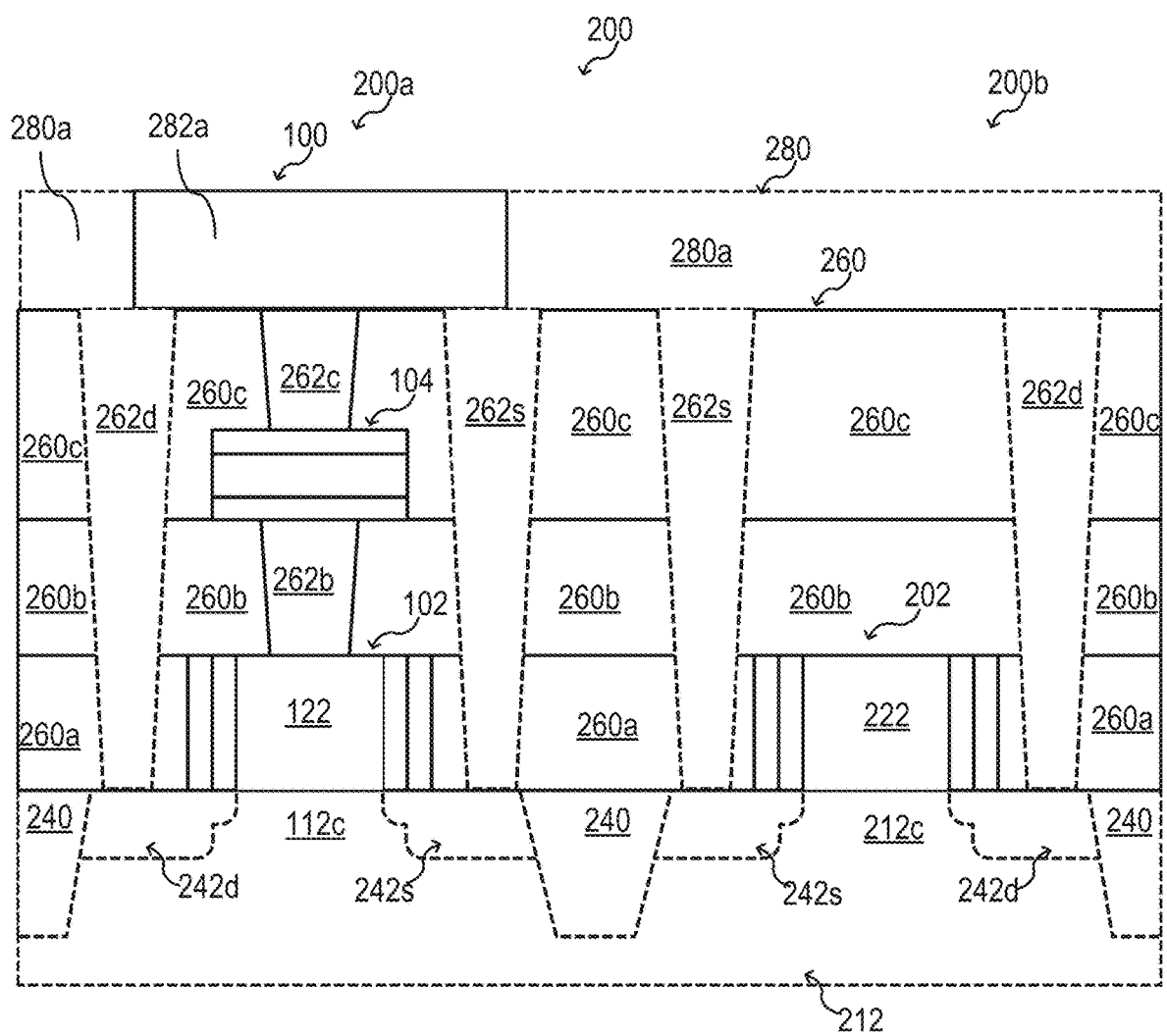

FIG. 2J shows the carrier 212 in a schematic cross-sectional view at a further processing stage, according to various embodiments. A further metallization structure 280 may be formed over the contact metallization structure 260. The further metallization structure 280 may be a BEoL metallization, e.g., a single level or multilevel metallization including, for example, a copper wiring 282a, a copper contact pad 282a, etc. The further metallization structure 280 may have a thickness in the range from about 10 nm to about 100 nm, e.g. a thickness of 60 nm.

As illustrated with reference to FIGS. 2A to 2J, the carrier 212 may be processed in a metal-last or high-k last process flow or any other suitable process flow. According to various embodiments, both the memory area 200a and the logic area 200b may be processed identical until the field-effect transistor structure formation is finished (see FIG. 2A). According to various embodiments, the field-effect transistor structures 102, 202 may be formed in a metal-last CMOS process flow.

According to various embodiments, the gate contact structure 262b may be formed by depositing an insulator material (for example $SiO_2$ or SiN) across the whole carrier 212 and by forming a contact hole above the gate structure 122 for each field-effect transistor structure 102 of the memory cell 100 (e.g., by one or more lithography processes and wet or dry chemical etching). The contact hole may be either directly be formed above the gate structure 122, i.e. above the active area, or, if this is not possible (e.g. because of design rules), then the contacting of the gate structure 122 may be done with an offset to the active area. This offset to the active area is indicated in the figures by the dashed lines of the bulk and STI regions, which might not necessarily be located in the same cutline plane (this is the case for all regions highlighted with dashed lines in the following sections). The contact hole may be filled with a metal (e.g. tungsten) (see FIG. 2F).

After the contact to the gate structure 122 is formed, a ferroelectric capacitor stack 214, 224, 234 is formed (see FIG. 2G). The ferroelectric capacitor stack 214, 224, 234 may include or consist of a bottom electrode layer 214, a ferroelectric layer 224 and a top electrode layer 234. In the case that an additional adhesive film may be used disposed between the bottom electrode and the gate contact structure 262b, this may be deposited before the ferroelectric capacitor stack is formed. Any material that promotes the contact between, for example, titanium nitride of the bottom electrode and tungsten of the gate contact structure 262b may be used, as for example, titanium.

After the ferroelectric capacitor stack 214, 224, 234 is deposited, a mask may be deposited and patterned such that the capacitor areas to be defined are covered with the mask (see FIG. 2H). A ferroelectric capacitor (e.g., as the memory structure 104) may be formed by etching the ferroelectric capacitor stack 214, 224, 234. This may be carried out by either wet etching, dry etching, a combination of wet and dry etching or any type of etching process capable of etching the respective material combination. As an example, reactive-ion-etching (RIE) could be utilized.

After the etching of the capacitor stack is carried out, the mask 270 on top of the capacitor stack may be removed (e.g. by wet chemical etching). Further, another insulating layer, e.g. silicon dioxide or an insulating material in general, may be deposited and, if required, planarized (for example by chemical mechanical polishing, CMP). A mask layer may be deposited and patterned by lithography such that the areas within which the contacts (e.g., the source/drain contacts 262d, 262s) to the active area shall be formed, are revealed. Contact holes to the active area may be etched, e.g. by RIE, whereas the etching may form a contact hole to the top electrode of the ferroelectric capacitor (see FIG. 2I). The contact holes may be filled with a contact material, for example tungsten, and, for example, planarized by CMP.

Further, a metal layer may be formed. For this, e.g. copper may be deposited onto the carrier 212. A lithography step may be used to pattern the copper wires of the first level of the metallization layer 280 (see FIG. 2J).

According to various embodiments, a ferroelectric capacitor (also referred to as memory structure 104) may be integrated on top of a gate-last (nodes <45 nm) logic transistor's gate 122e (e.g., metal-last; e.g., high-k last, etc.). To integrate the ferroelectric capacitor on top of the transistor gate 122e ferroelectric $HfO_2$ may be used that allows the integration of a ferroelectric capacitor in a gate-last process flow since it is still ferroelectric at a film thickness of about 10 nm or less. Other ferroelectric materials may lose their ferroelectric properties for film thicknesses of around and below 10 nm.

For small technology nodes (e.g., <28 nm) an integration of a ferroelectric film in the range of about 10 nm or less into the transistor geometries may become more and more difficult (compare e.g. a template scheme in which the ferroelectric film thickness at some point stops the channel length scaling). By arranging the memory structure 104 (e.g., as ferroelectric capacitor) above the transistor structure 102, the full scaling potential may be maintained.

Further, the memory window (the separation of the memory states in terms of the threshold voltage shift) may be estimated at MW=2*$E_C$*$t_{FE}$ (with $E_C$ being the coercive field and $t_{FE}$ the thickness of a ferroelectric $HfO_2$ layer), therefore, in order to increase the memory window the film thickness may be increased. The integration of the memory structure 104 (e.g., as ferroelectric capacitor) above the transistor structure 102 may result in a full flexibility in modifying the memory window size.

According to various embodiments, integrating the memory structure 104 (e.g., as ferroelectric capacitor) independently from the respective transistor structures 102, 202 may be less complex comparted to an integration into the transistor structures 102 directly.

Illustratively, in the case that the ferroelectric layer is positioned above the transistor, the surface area of the ferroelectric capacitor may not be bound to the transistor geometry, as it is for example the case if the ferroelectric film would be directly integrated into the transistor. Accordingly, the capacitor area may be made smaller than the area of the underlying transistor (which may be defined by the product of channel length times channel width). According to one or more embodiment, the dimension of the capacitor in lateral direction (e.g., in the drawing plane) may be similar to the channel length of the transistor underneath, which may be, in this case, close to the lithographic limit. However, when for example the channel width (perpendicular to the drawing plane) of the transistor has to have a certain size (e.g. to provide larger drain currents), the ferroelectric capacitor dimension in this direction may be less, i.e. down to the lithographic limit at least. This may lead to a smaller area of the ferroelectric capacitor as compared to the area of the transistor underneath which may allow a more efficient programming, etc., as described above with reference to FIG. 1A.

Various configurations and/or modifications with respect to the memory structure 104, the memory cell 100, the metallization structures, etc., may be described in the following. For sake of brevity, with respect to similar or same structures and/or processes as described above reference is made thereto.

According to various embodiments, the memory structure 104 exemplarily illustrated in FIG. 2H to 2J may have a planar shape, e.g., the shape of a parallel-plate capacitor. However, other shapes may be implemented in the same or in a similar way, as described in the following in more detail with reference to FIG. 3A to FIG. 3C.

Figure 3A:
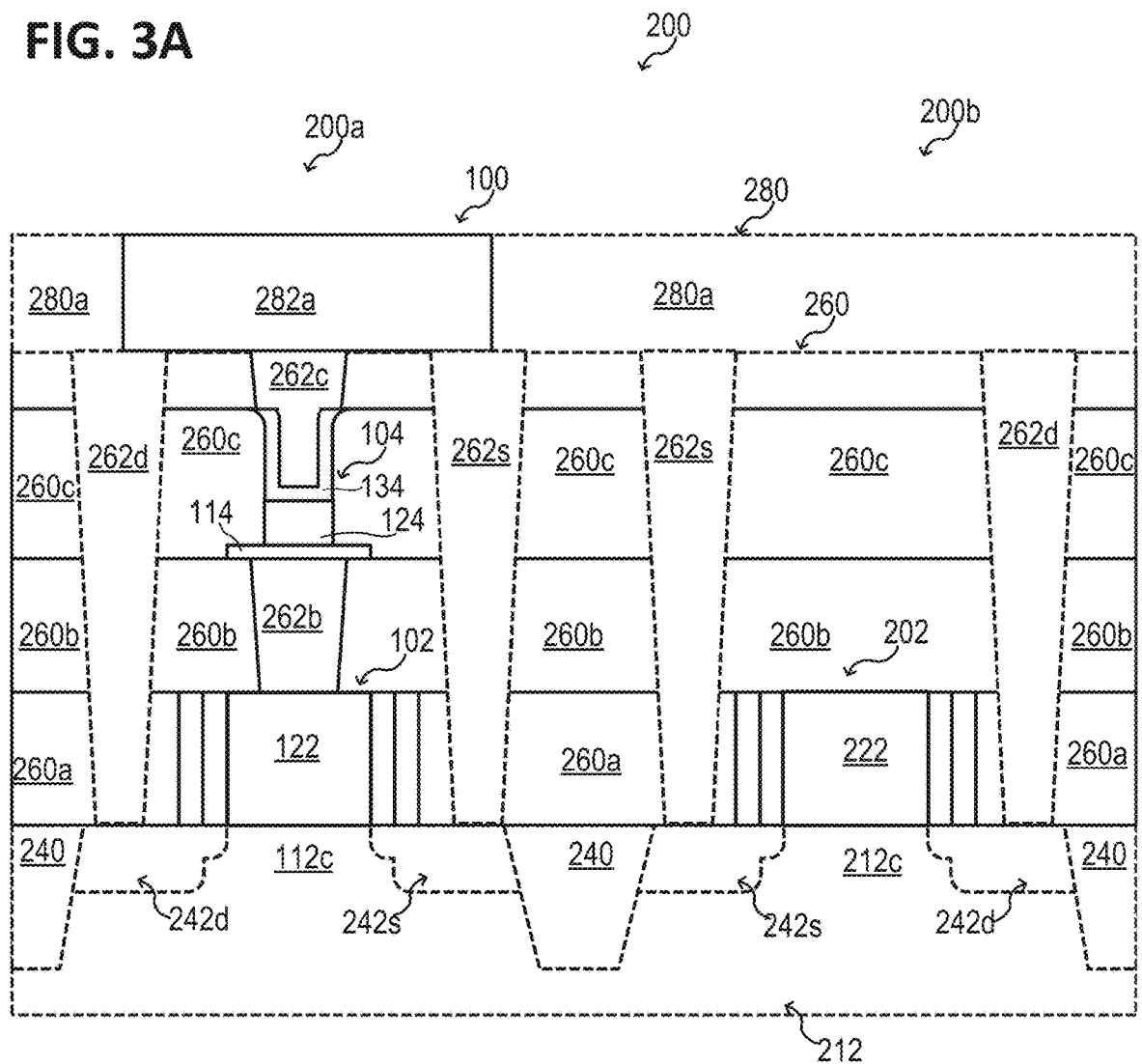
FIG. 3A to FIG. 3C show a memory cell or an electronic device including a memory cell in a schematic view, according to various embodiments.

FIG. 3A illustrates a memory cell 100 or an electronic device 200, according to various embodiments. According to various embodiments, the first electrode structure 114 of the memory structure 104 may include at least one layer of an electrically conductive material. The first electrode structure 114 (e.g., the at least one layer of an electrically conductive material) may have a lateral dimension that may be greater than a lateral dimension of the at least one remanent-polarizable layer 124. Illustratively, the at least one remanent-polarizable layer 124 may be formed to have a sub-lithographic lateral dimension, e.g., width (e.g., perpendicular to the drawing plane) and/or length (in the drawing plane). An exemplary integration scheme is described in more detail below with reference to FIGS. 4A to 4H. Illustratively, the size and/or shape of the memory structure 104 may be modified to influence the capacitor area of the memory structure 104 caused by the arrangement of the electrode structures 114, 134 and the, e.g., ferroelectric, layer 124 in between. This may have the advantage that the capacitive voltage divider (C1/C2) between ferroelectric capacitor and transistor gate stack (see FIG. 1A) changes in favor of the ferroelectric capacitor (i.e. more voltage may drop across the ferroelectric capacitor).

Figure 3B:
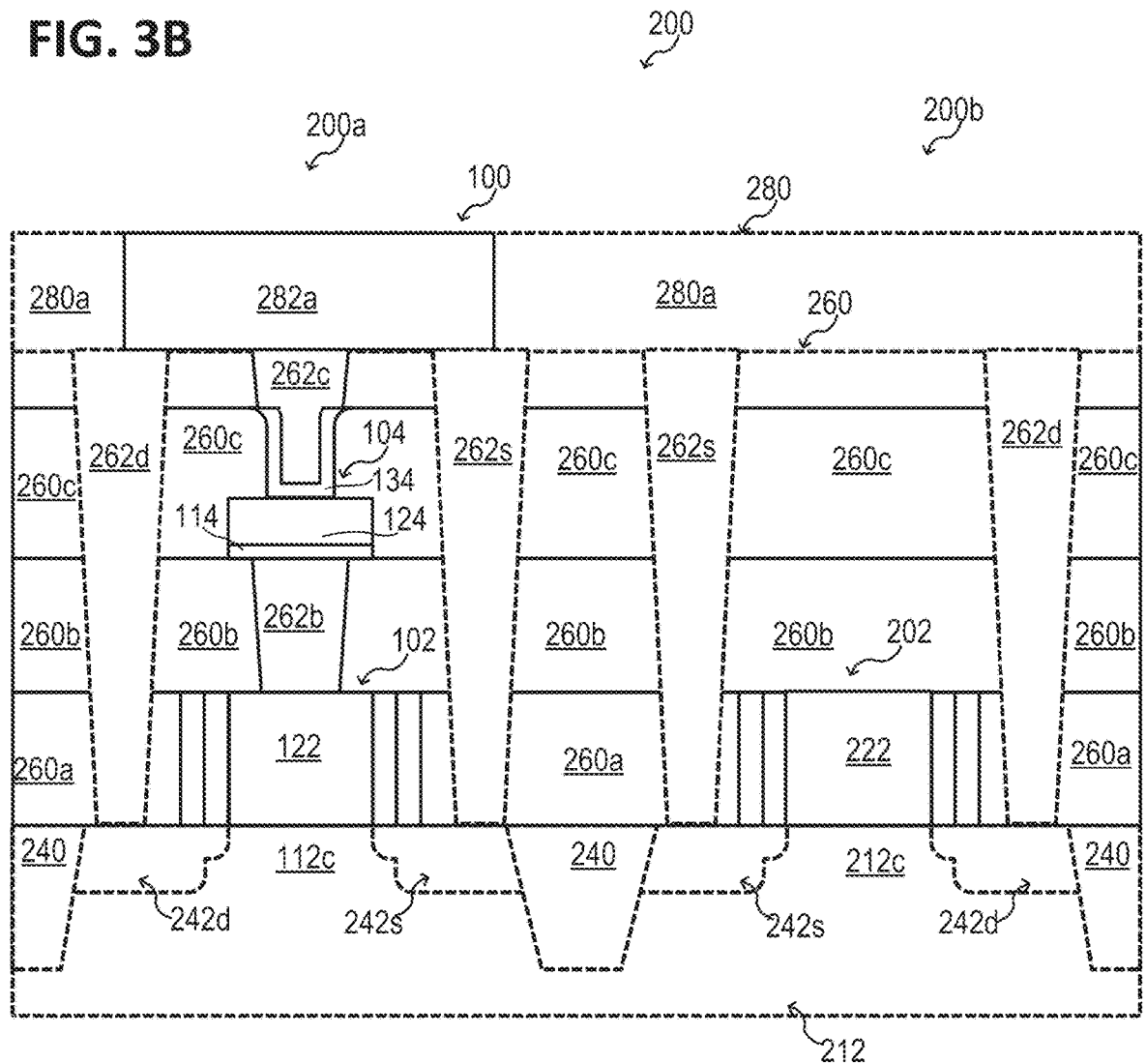

FIG. 3B illustrates a memory cell 100 or an electronic device 200, according to various embodiments. According to various embodiments, the first electrode structure 114 of the memory structure 104 may include at least one layer of an electrically conductive material. The first electrode structure 114 (e.g., the at least one layer of an electrically conductive material) may have a lateral dimension that may be substantially the same as (or may be greater than) a lateral dimension of the at least one remanent-polarizable layer 124. However, the second electrode structure 134 (e.g., at least one layer of an electrically conductive material contacting the at least one remanent-polarizable layer 124) may have a lateral dimension that may be less than a lateral dimension of the at least one remanent-polarizable layer 124. Illustratively, the second electrode structure 134 may be formed to have a sub-lithographic lateral dimension, e.g., width (e.g., perpendicular to the drawing plane) and/or length (in the drawing plane). Illustratively, the size and/or shape of the memory structure 104 may be modified to influence the capacitor area of the memory structure 104 caused by the arrangement of the electrode structures 114, 134 and the, e.g., ferroelectric, layer 124 in between. This may have the advantage that the capacitive voltage divider (C1/C2) between ferroelectric capacitor and transistor gate stack (see FIG. 1A) changes in favor of the ferroelectric capacitor (i.e. more voltage may drop across the ferroelectric capacitor).

Figure 3C:
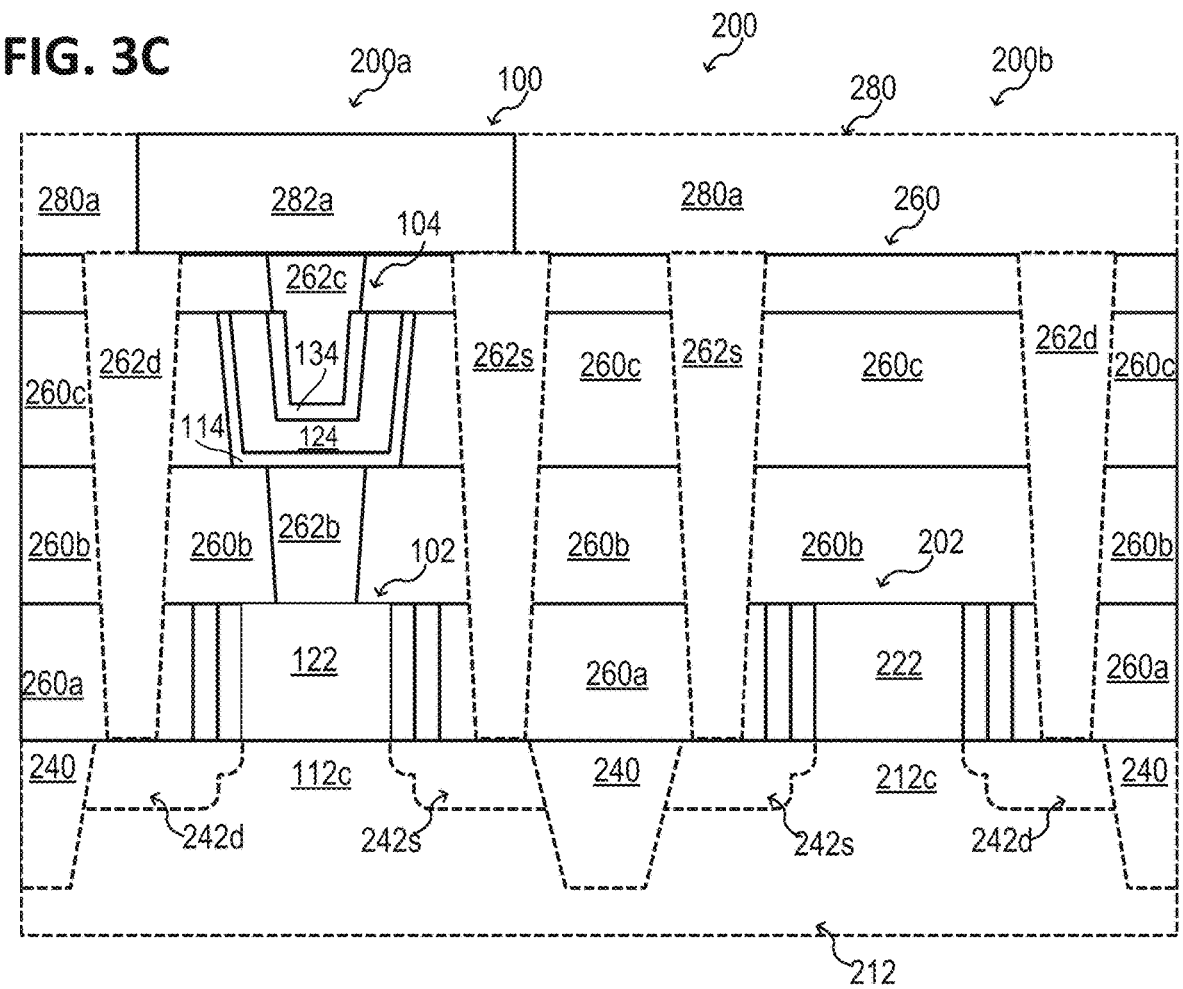

FIG. 3C illustrates a memory cell 100 or an electronic device 200, according to various embodiments. According to various embodiments, the memory structure 104 may have a concave shape. The memory structure 104 may have, for example, one or more angled sections and/or one or more arcuated sections. As an example, in this case, a greater capacitor size (e.g., a greater capacitor area) may be provided while at the same time the scaling of the transistor structure underneath may not be hindered.

Figure 6A:
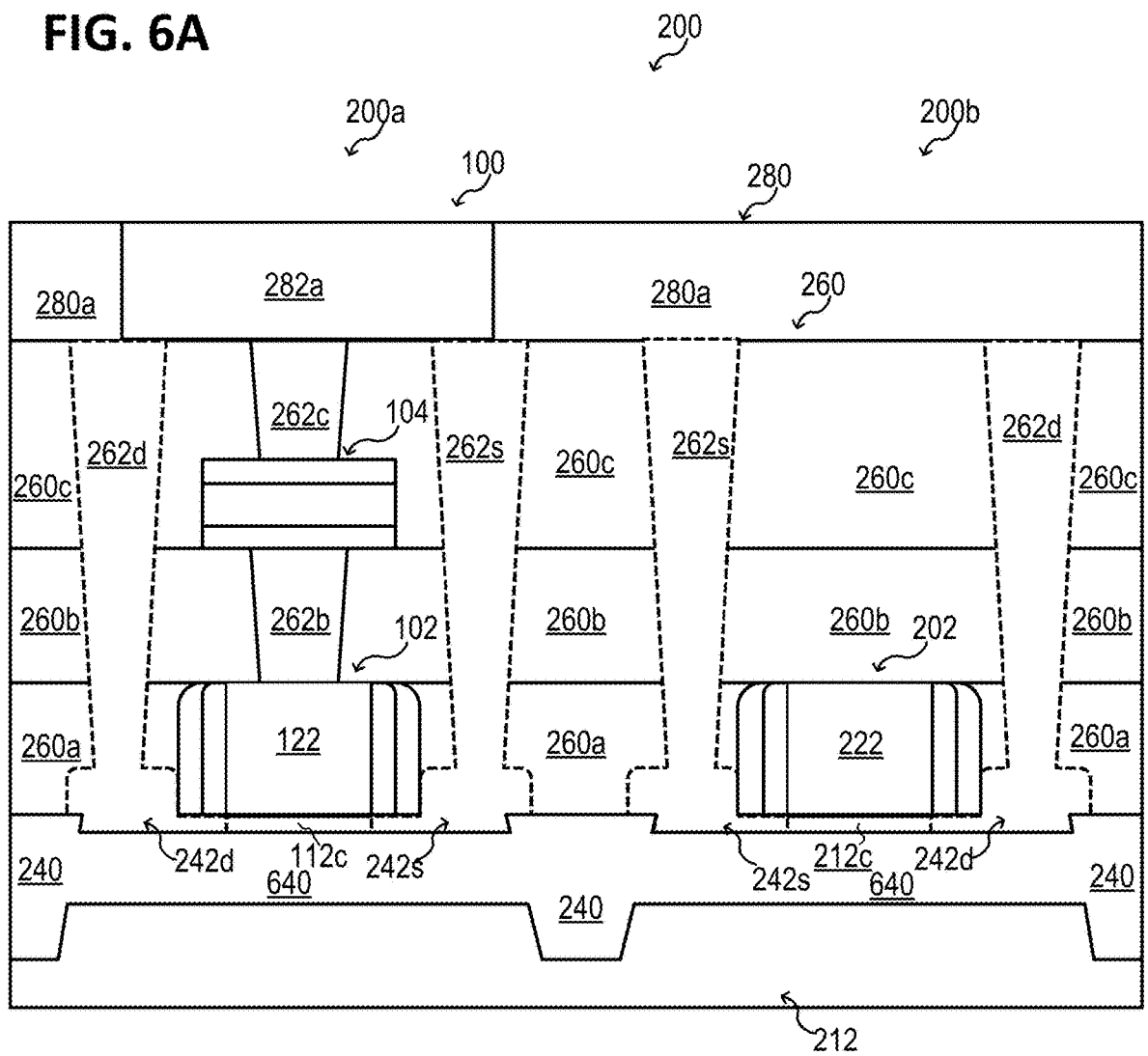
Figure 6C:
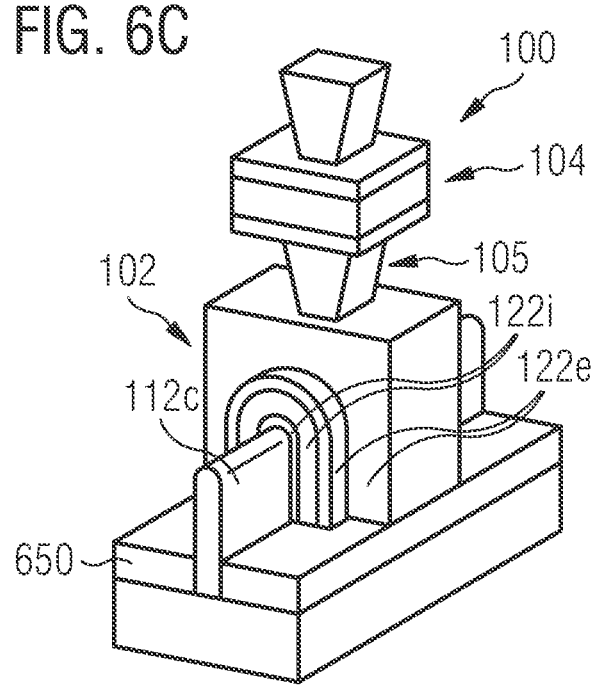
FIG. 6C and FIG. 6D show a memory cell in a schematic view, according to various embodiments.
Figure 6D:
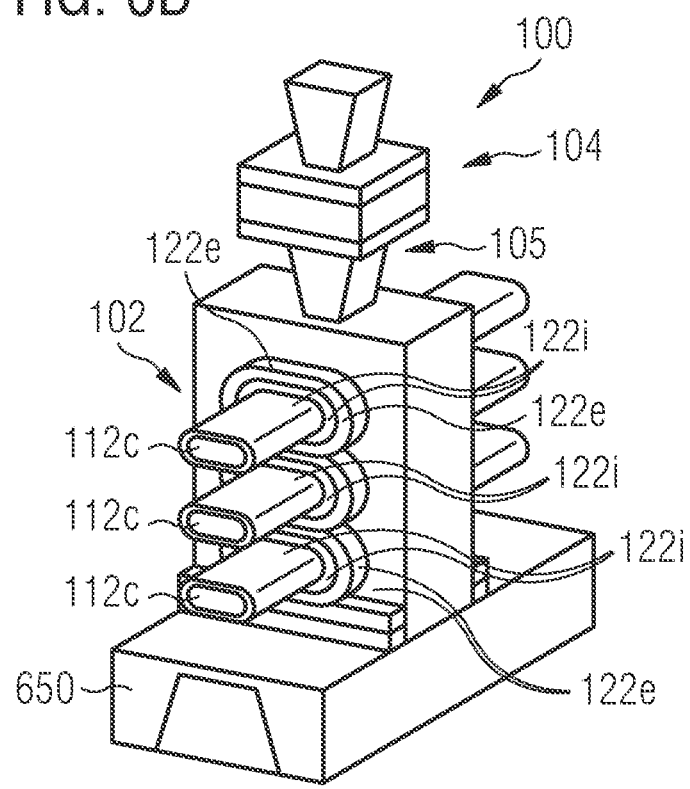

Further, a ratio C2/C1 between the capacitor area of the memory structure 104 and of the transistor gate area may be modified by increasing the area of the transistor gate area (see, for example, FIG. 6B to FIG. 6D). This may be combined with a decrease of the capacitor area of the memory structure 104, as illustrated in FIG. 3A and FIG. 3B, or an increase of the capacitor area of the memory structure 104, as illustrated in FIG. 3C.

In the following, an exemplary integration scheme is provided with reference to FIGS. 4A to 4H for processing a carrier 212, e.g., for manufacturing a memory cell 100 or an electronic device 200, as illustrated exemplarily in FIG. 3A, according to various embodiments.

According to various embodiments, the integration scheme may use the carrier 212 at the process stage illustrated in FIG. 2F as a starting point.

Figure 4A:
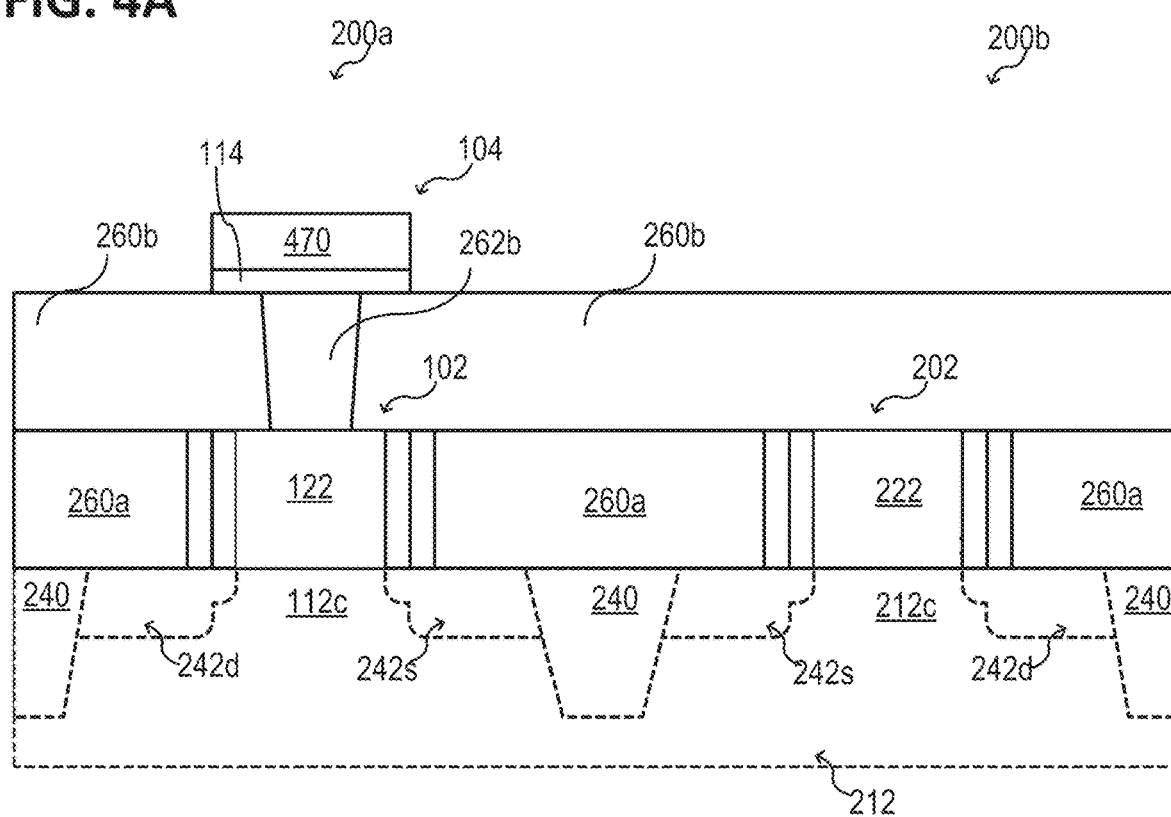
FIG. 4A to FIG. 4H show a carrier during processing a memory cell or an electronic device including a memory cell in a schematic view, according to various embodiments.

FIG. 4A shows the carrier 212 in a schematic cross-sectional view at a further processing stage, according to various embodiments. After the gate contact 262b is formed, the first electrode structure 114 is formed, e.g., via a patterning using a mask 470. The mask 470 may be deposited and patterned via one or more lithography processes. The mask 470 may serve for parting the first electrode structure 114, e.g. by wet or dry chemical etching or a combination of both.

Figure 4B:
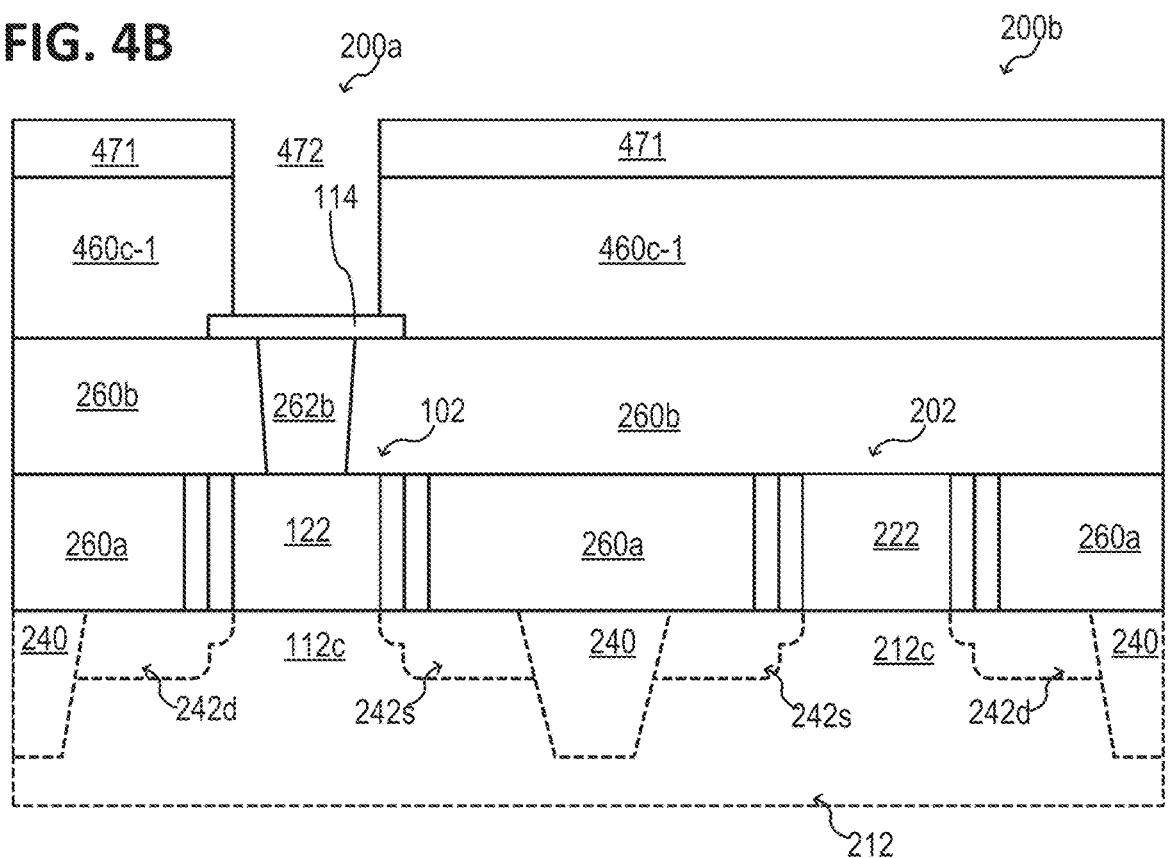

FIG. 4B shows the carrier 212 in a schematic cross-sectional view at a further processing stage, according to various embodiments. A third insulator layer 460c-1 may be formed over the carrier and patterned via an additional mask 471 (e.g., via a hard mask). The third insulator layer 460c-1 may include a dielectric material, e.g., silicon oxide ($SiO_2$), silicon nitride ($SiN_x$), etc., having, for example, a thickness in the range from about 10 nm to about 100 nm, e.g., a thickness of 40 nm. Illustratively, an auxiliary opening 472 may be etched (e.g. via wet or dry chemical etching or a combination of both) into the third insulator layer 460c-1 to at least partially expose the first electrode structure 114 formed over the gate contact 262b. In this case, the first electrode structure 114 mays itself serves as etch stop layer for forming the auxiliary opening 472. The auxiliary opening 472 may be used to form at least one remanent-polarizable layer 124 having a lateral dimension less than the lateral dimension of the first electrode structure 114. This may be used to reduce the capacitor area of the memory structure 104, as described herein.

Figure 4C:
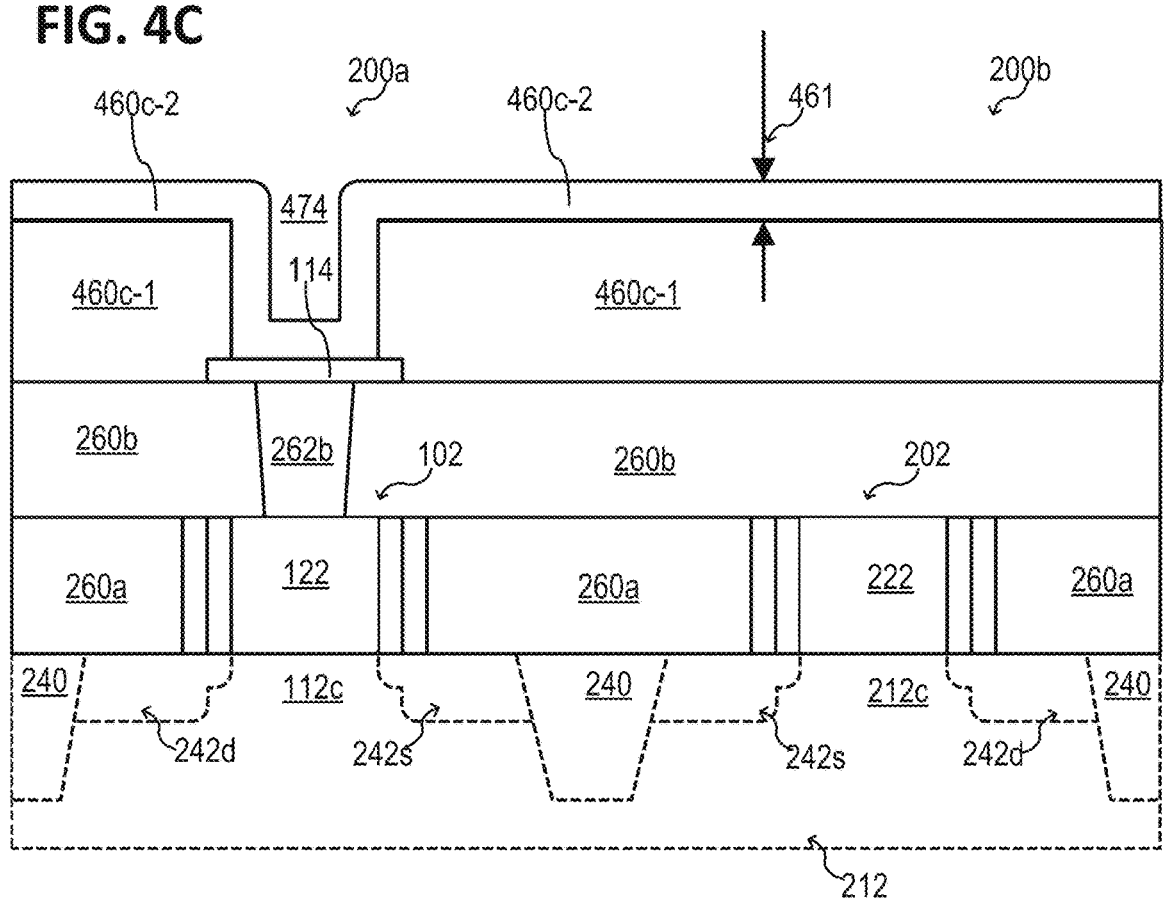
Figure 4D:
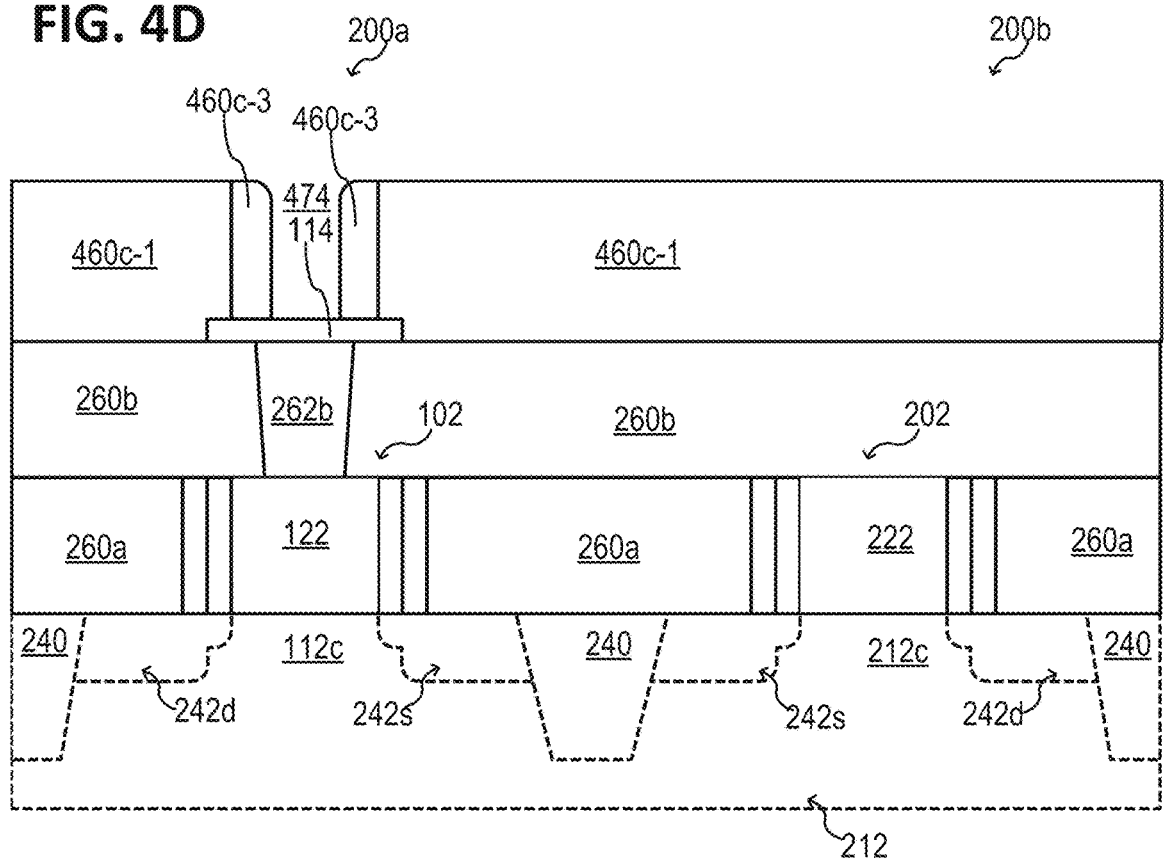
Figure 4E:
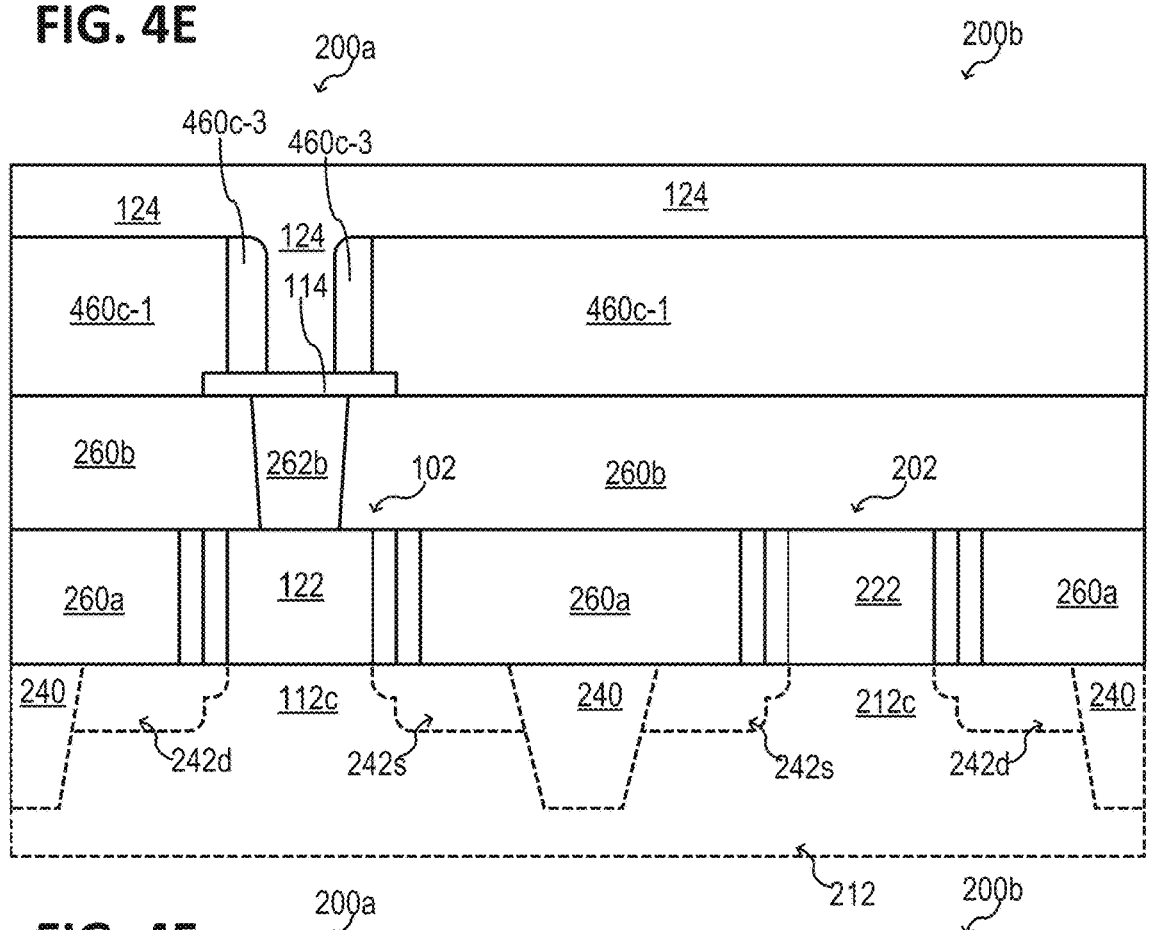
Figure 4F:
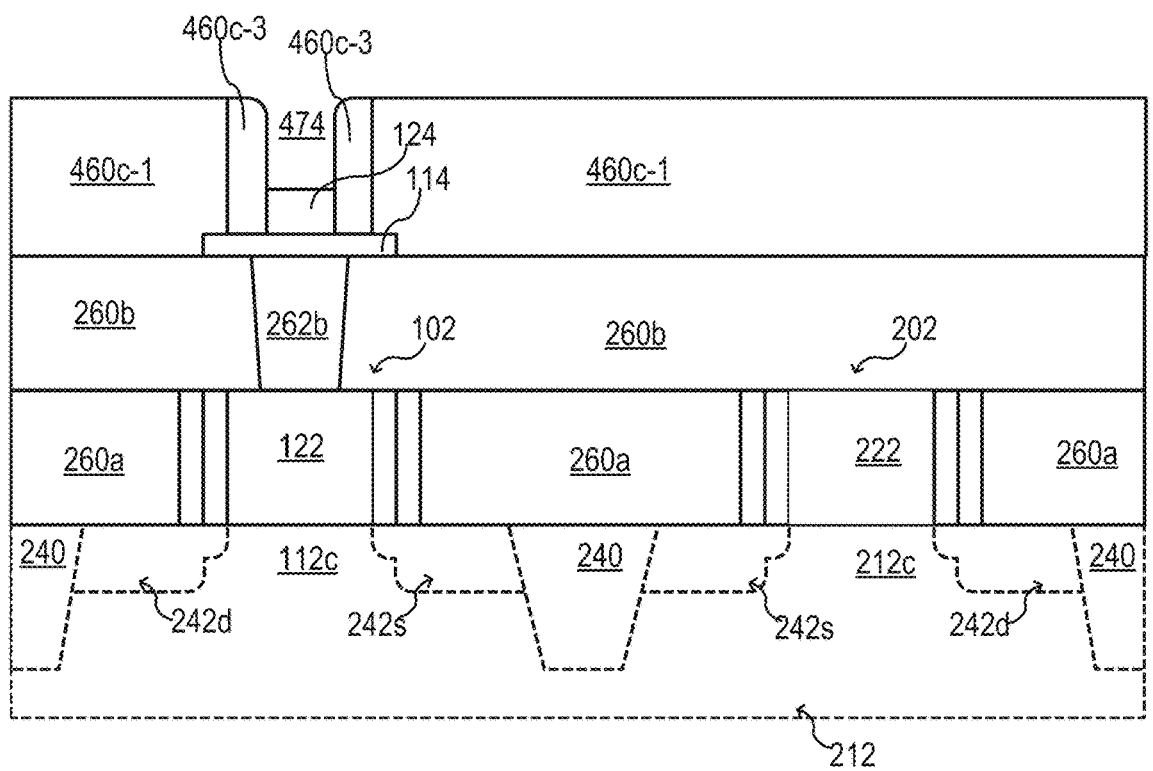
Figure 4G:
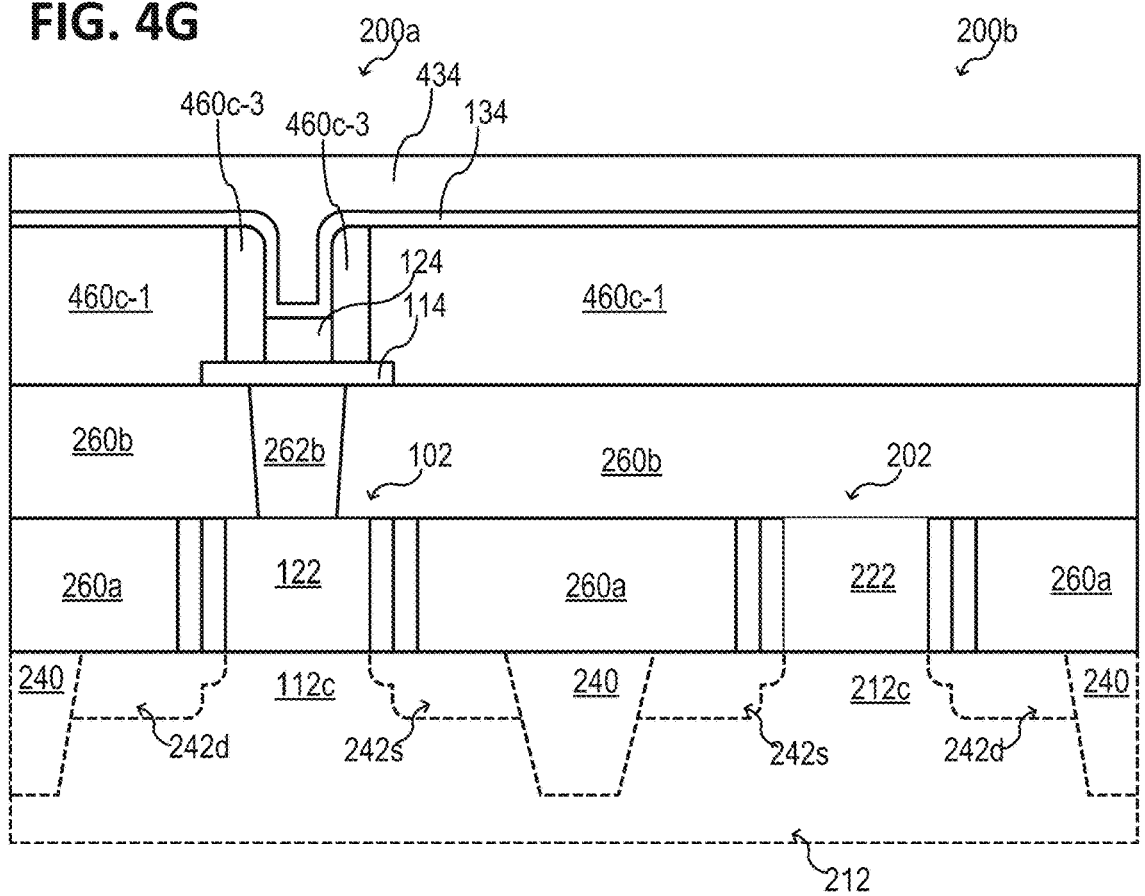

FIG. 4C and FIG. 4D show the carrier 212 in a schematic cross-sectional view at further processing stages, according to various embodiments. A sidewall spacer 460c-3 may be formed at the sidewalls of the auxiliary opening 472 may forming an additional insulator layer 460c-2 over the third insulator layer 460c-1. The additional insulator layer 460c-2 may formed as a conformal layer having, for example, a thickness 461 in the range from about 1 nm to about 30 nm. The thickness 461 of the additional insulator layer 460c-2 may be less than half of the width of the auxiliary opening 472 to provide an opening 474 to form the at least one remanent-polarizable layer 124 in opening 474.

According to various embodiments, the mask 471 that is used to pattern the third insulator layer 460c-1 is removed before the additional insulator layer 460c-2 (e.g. including silicon nitride or silicon oxide) is deposited. Illustratively, the deposition of the additional insulator layer 460c-2 may be carried out in a conformal manner such that the insulator properly covers the sidewalls of the auxiliary opening 472. This can for example be achieved by a deposition method like atomic layer deposition or molecular layer deposition.

According to various embodiments, the auxiliary opening 472 may formed close to the lithographic limit, wherein the width of the resulting opening 474 may be less than the width of the auxiliary opening 472, e.g., the width reduction may be about two times the thickness of the additional insulator layer 460c-2. Accordingly, this method allows for producing cavities below the lithographic limit.

As illustrated in FIG. 4D, the additional insulator layer 460c-2 is etched back until the opening 474 reaches the first electrode structure 114. This may be carried out by one or more etching processes that provide a highly anisotropic etch rate like reactive-ion-etching.

FIG. 4E to FIG. 4H show the carrier 212 in a schematic cross-sectional view at further processing stages, according to various embodiments. The at least one remanent-polarizable layer 124 and the second electrode structure 134 may be formed in the opening 474. The at least one remanent-polarizable layer 124 and the second electrode structure 134 may be formed using layers, materials, etc. as described before. However, the width of the at least one remanent-polarizable layer 124 and the second electrode structure 134 may be less than the width of the first electrode structure 114 due to the sidewall spacer 460c-3.

According to various embodiments, ferroelectric hafnium oxide or any other suitable material may be deposited (see reference sign 124 in FIG. 4E) over the third insulator layer 460c-1 and the sidewall spacer 460c-3. This may be carried out by various layering processes, e.g., atomic layer deposition, chemical vapor deposition, physical vapor deposition etc. The layering processes may be used to fill the opening 474 completely (e.g. without any voids).

Then the ferroelectric hafnium oxide may be planarized and removed from the whole surface area such that only the opening 474 remains at least partially filled with the ferroelectric material (see, for example, FIG. 4F) to form the functional layer of the memory structure 104. This may be carried out, for example, via CMP or wet/dry chemical etching or a combination of thereof. According to various embodiments, the ferroelectric hafnium oxide may be further recessed by one or more etching processes to the desired film thickness and recess depth to provide the at least one remanent-polarizable layer 124 of the memory structure 104. This may be carried out, for example, by RIE or ALE.

Figure 4H:
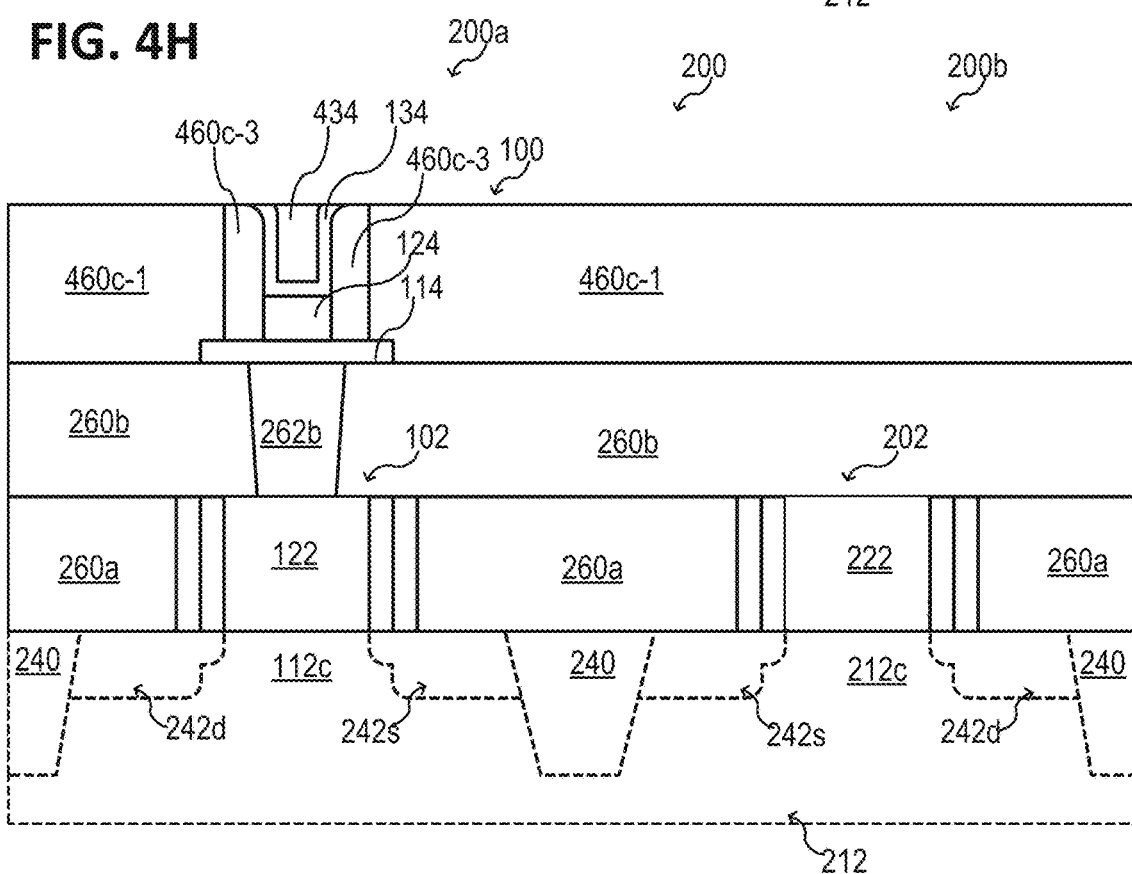

Subsequently, the second electrode structure 134, e.g. a titanium nitride layer, may be deposited over the at least one remanent-polarizable layer 124 by a conformal deposition process, e.g., ALD. Afterwards a gate material 434, e.g. an aluminum layer is deposited over the titanium nitride layer (see FIG. 4G). Further, a planarization process may be used to partially remove one or more materials, that where deposited to form the second electrode structure 134 together with the gate material 434 respectively, e.g., from areas in between the transistor structures 102, 202 such that the topography as shown in FIG. 4H may be revealed. Subsequently, the carrier 212 may be processed further, as, for example, described in FIG. 2I and FIG. 2J, to generate the memory cell 100 (or the electronic device 200) as illustrated exemplarily in FIG. 3A. That is, an additional insulating layer may be formed and patterned by lithography such that contact holes are formed. These contact holes may be filled with a metal, e.g. W, which then provides the conducting path to both source/drain regions and the memory structure 104; and via the memory structure 104 the gate structure 122 of the field-effect transistor structure 102. Afterwards, another insulator is deposited and patterned which may define the areas within which the metal wiring (e.g., M1) is formed. The metal deposition may be carried out by dual-damascene processing, etc., until the point when the full carrier processing is finished.

The method for forming sub-lithographic features may be applied to phase-change-memory (PCM) devices in which a certain portion of the resistance changing memory element has to have a very small (sub-lithographic) diameter in order to provide the necessary functionality to heat up the material through which a current is flowing. However, as illustrated in FIG. 3A and FIG. 4A to FIG. 4H, neither this approach may be used for enabling the heating of the material nor is the memory structure 104 used as a conducting element through which current is flowing. The special combination of etching of an auxiliary opening 472 and forming the opening 474 filled with the at least one remanent-polarizable layer 124 may be used for creating an insulating capacitor (not a conducting material), whereas the insulator is represented by the at least one remanent-polarizable layer 124 (e.g., by ferroelectric $HfO_2$), which may have a diameter below the actual lithographic limit. Since the capacitor may be connected in series to the gate capacitance of the transistor underneath, a voltage applied to the top electrode of the capacitor is divided according to the capacitive voltage divider of the whole stack. The capacitance may be directly influenced by the capacitor area (the smaller the area, the smaller the capacitance). The relative voltage drop across the ferroelectric capacitor may be increased in the case that its capacitance is decreased relative to the remaining capacitance that is connected in series to the ferroelectric capacitor. Accordingly, the integration of the potentially sub-lithographic capacitor may lead to an overall reduction in the required write voltage, improved endurance characteristics and better retention properties of the memory cell 100.

Illustratively, by utilizing this approach it may be in principle possible to decrease the area and the volume of the ferroelectric material such that the film consists of only one grain and therefore the film may be in a monocrystalline state that may reduce the variation from device to device.

Further, by decreasing the volume of the ferroelectric material in such a strong manner, the ferroelectric crystal phase may be stabilized which may help improving the device performance.

Figure 5A:
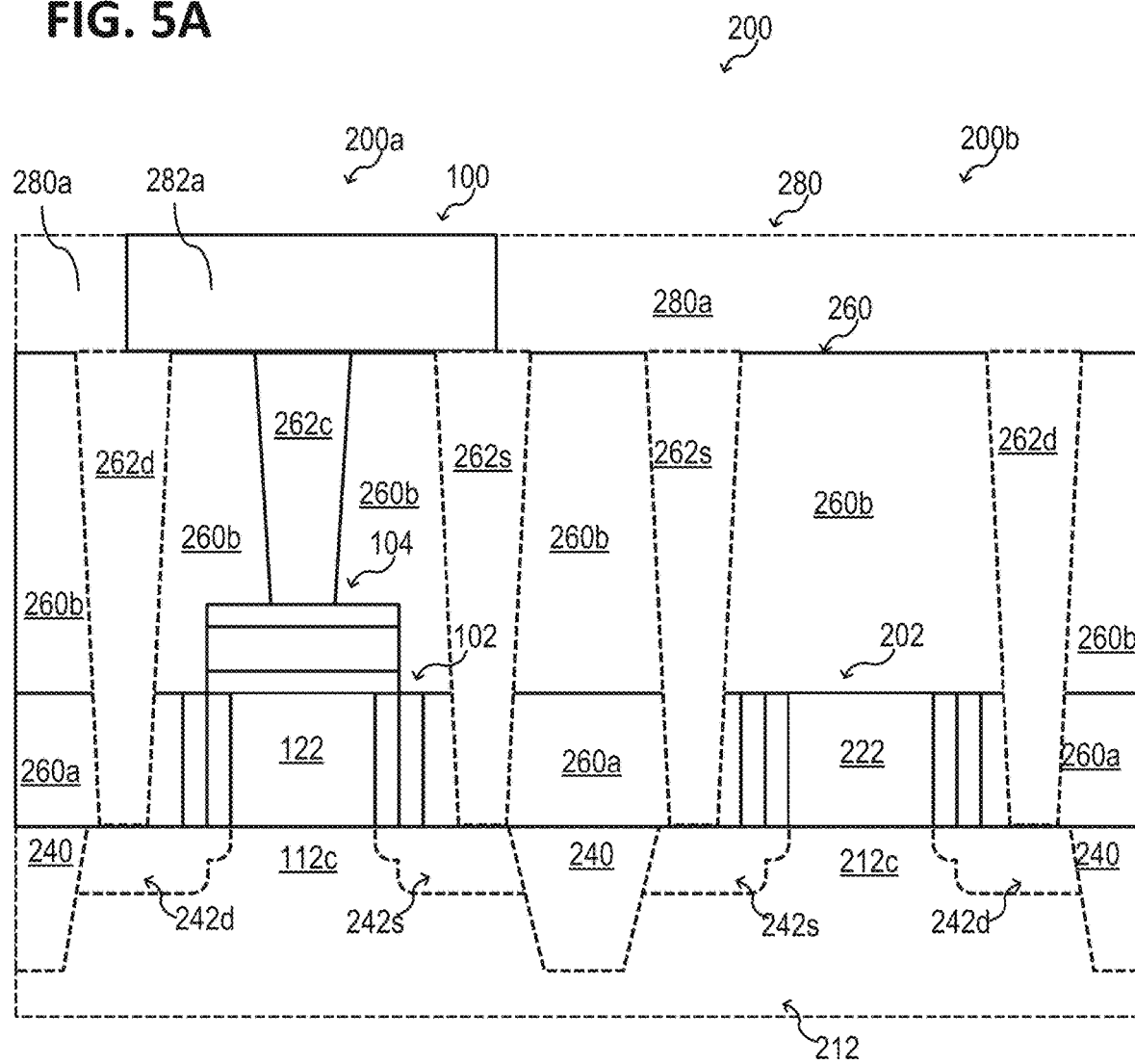
Figure 5B:
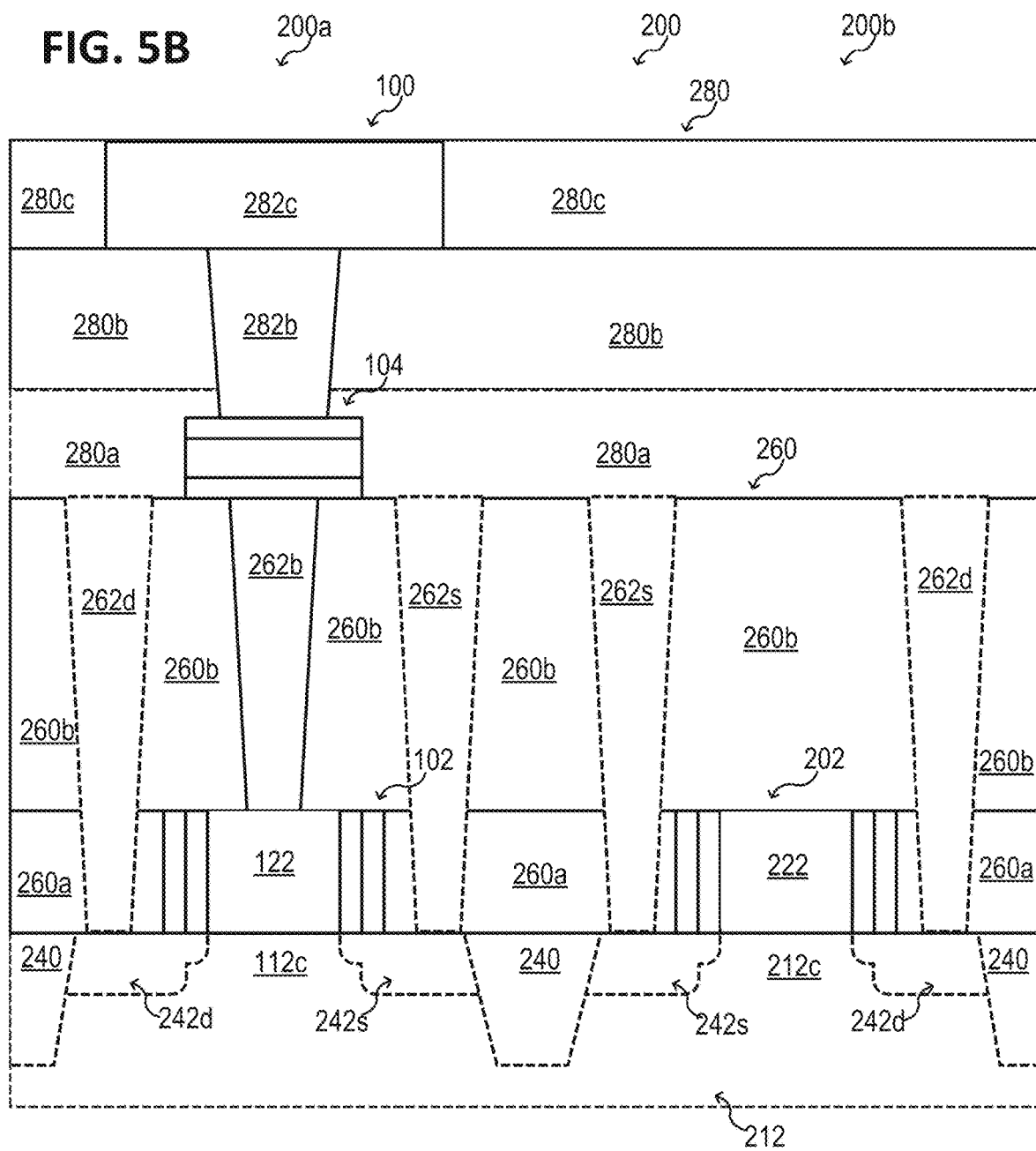

According to various embodiments, the memory structure 104 may be integrated in different relative positions to the field-effect transistor structure 102 of the memory cell 100, as illustrated in FIGS. 5A to 5C in more detail for exemplary embodiments. Besides the integration of the memory structure 104 (e.g., as ferroelectric capacitor) into the contact level metallization 260, as described above, the memory structure 104 may be positioned into different metallization levels above the field-effect transistor structure 102 in a similar way.

FIG. 5A illustrates the memory cell 100 (or the electronic device 200) in a schematic cross-sectional view, according to various embodiments. In this case, the memory structure 104 may be integrated directly on top of the gate structure 122 (e.g., on top of the gate electrode structure 122e) of the field-effect transistor structure 102.

FIG. 5B illustrates the memory cell 100 (or the electronic device 200) in a schematic cross-sectional view, according to various embodiments. In this case, the memory structure 104 may be integrated into the first level of the metallization structure 280, e.g., directly on top of the contact metallization 260. The memory structure 104 (e.g., the first electrode structure 114) may be electrically connected to the field-effect transistor structure 102 via the gate contact 262b of the contact metallization 260. The memory structure 104 (e.g., the second electrode structure 134) may be electrically contacted by a memory contact 282b of the metallization 280 disposed over the contact metallization 260. The metallization 280 may include several insulator layers 280a, 280b, 280c and wirings 282c, pads 282c, contacts 282b, vias (vertical interconnect accesses), etc.

FIG. 5C illustrates the memory cell 100 (or the electronic device 200) in a schematic cross-sectional view, according to various embodiments. In this case, the memory structure 104 may be integrated over (e.g., directly on) the first level of the metallization structure 280, e.g., directly on top of a metal structure 282a of the first level of the metallization structure 280.

According to various embodiments, the metallization structure 280 may be a multilevel metallization including a plurality of metal levels (e.g., M1, M2, M3, etc.) and a plurality of via levels (V1, V2, V3, etc.). A via level may be disposed between two metal levels to connect the wiring structures of the metal levels accordingly.

According to various embodiments, the memory structure 104 may be integrated, for example, in any desired structural level above the field-effect transistor structure 102, for example, in the middle of a V1 level, on top of a V1 level into an M2 level, on top of an M2 level, in the middle of a V2 level, on top of a V2 level into an M3 level, on top of an M3 level, etc.), depending, for example, on the layout scheme of the memory cell 100. Further, it is noted that the various memory structures 104 described herein may be integrated in all possible positions, as described herein.

In various embodiments, both the various memory structures 104 and the respective memory structure 104 positions may be combined with various transistor process platforms, as described, for example, in the following in more detail.

As an alternative to an integration of memory structure 104 onto a HK-last transistor, a metal last or a gate-first transistor, see FIG. 2B to FIG. 2E, the memory structure 104 may be integrated over any other suitable field-effect transistor structure, as described in more detail below.

FIG. 6A illustrates a memory cell 100 (e.g., an electronic device 200) in a schematic cross-sectional view, according to various embodiments. In this integration scheme, the channels 112c, 212c of the respective field-effect transistor structures 102, 202 may be provided over an insulating layer 640 (illustratively the field-effect transistor structures 102, 202 are formed on a semiconductor (e.g., silicon) over insulator (SOI) carrier). Illustratively, at least the field-effect transistor structure 102 of the memory cell 100 may be configured as a FDSOI transistor.

FIG. 6B illustrates a memory cell 100 (e.g., an electronic device 200) in a schematic cross-sectional view, according to various embodiments. In this integration scheme, at least the field-effect transistor structure 102 of the memory cell 100 may be configured as trench gate transistor. This integration scheme is described in more detail below with reference to FIGS. 7A to 7E.

FIG. 6C illustrates a memory cell 100 in a schematic cross-sectional view, according to various embodiments. In this integration scheme, at least the field-effect transistor structure 102 of the memory cell 100 may be configured as a fin field-effect transistor (FinFET). The semiconductor portion in which the channel region 112c is provided may have the shape of a vertical fin, wherein the gate isolation structure 122i and the gate electrode structure 122e at least partially surround the fin.

FIG. 6D illustrates a memory cell 100 in a schematic cross-sectional view, according to various embodiments. In this integration scheme, at least the field-effect transistor structure 102 of the memory cell 100 may be configured as a nanosheet or nanowire field-effect transistor. The one or more semiconductor portions, in which a channel region 112c is provided, may each have the shape of a nanosheet or nanowire. The gate isolation structure 122i and the gate electrode structure 122e may at least partially surround the respective nanosheets or nanowires.

The gate isolation structure 122i and the gate electrode structure 122e illustrated exemplarily in FIG. 6C and FIG. 6D may include the same materials, layers, etc. as described above with reference to the planar transistor designs.

For ferroelectric $HfO_2$, its ferroelectric properties may likely disappear when the layer thickness is reduced to below 2 nm or at least when the reduction in film thickness leads to an unacceptable increase of the crystallization temperature such that the ferroelectric phase in $HfO_2$ cannot be stabilized anymore. Therefore, according to various embodiments, a layer thickness for a ferroelectric $HfO_2$ layer used in the memory structure 104 may be selected greater than or equal to 2 nm. For the most advanced transistor platforms, e.g., illustrated exemplarily in FIG. 6C and FIG. 6D, it may be beneficial to arrange the ferroelectric $HfO_2$ layer above the transistor structure, so that the ferroelectric $HfO_2$ layer can be implemented with the desired layer thickness in these process platforms.

In the following, an exemplary integration scheme is provided with reference to FIGS. 7A to 7E for processing a carrier 212, e.g., for manufacturing a memory cell 100 as illustrated exemplarily in FIG. 6B, according to various embodiments.

According to various embodiments, the integration scheme may use the carrier 212 at the process stage illustrated in FIG. 2A as starting point.

Figure 7A:
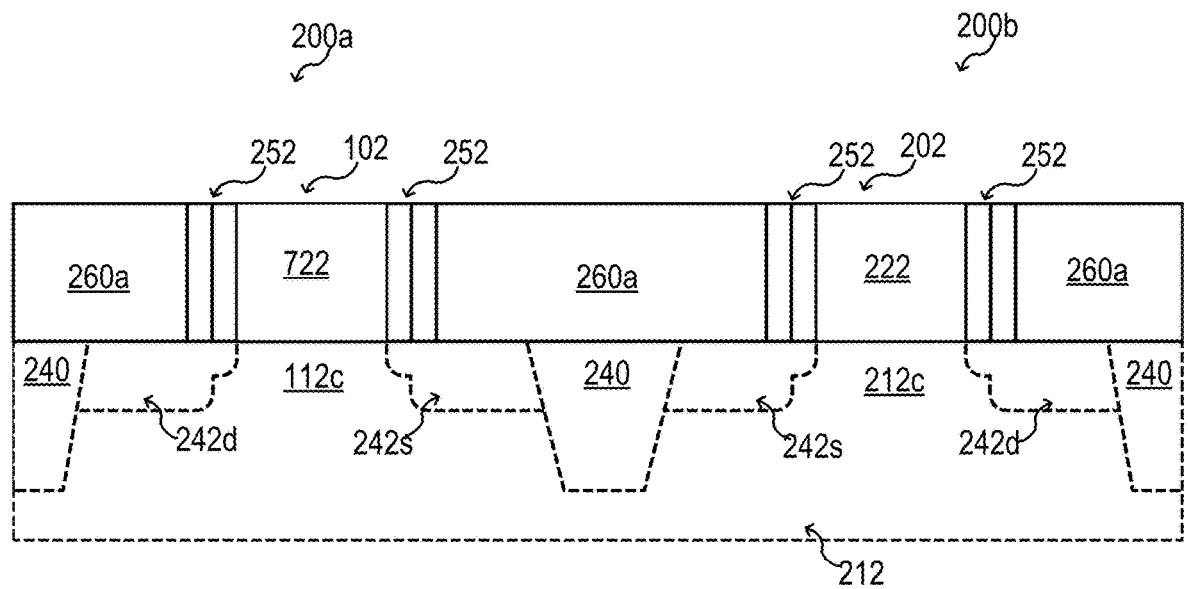
FIG. 7A to FIG. 7E show a carrier during processing a gate structure of a field-effect transistor structure in a schematic view, according to various embodiments.

FIG. 7A shows the carrier 212 in a schematic cross-sectional view at an initial processing stage, according to various embodiments.

The baseline integration flow may be carried out until a dummy gate stack 722 is provided at least in the memory area 200a of the carrier 212. According to various embodiments, a similar or the same dummy gate stack 722 may be used in the logic area 200b. By way of example, a metal-last process flow may be used to form the dummy gate stack 722, as exemplarily illustrated in FIG. 7A. However, any other suitable process flow may be uses to form the dummy gate stack 722.

Figure 7B:
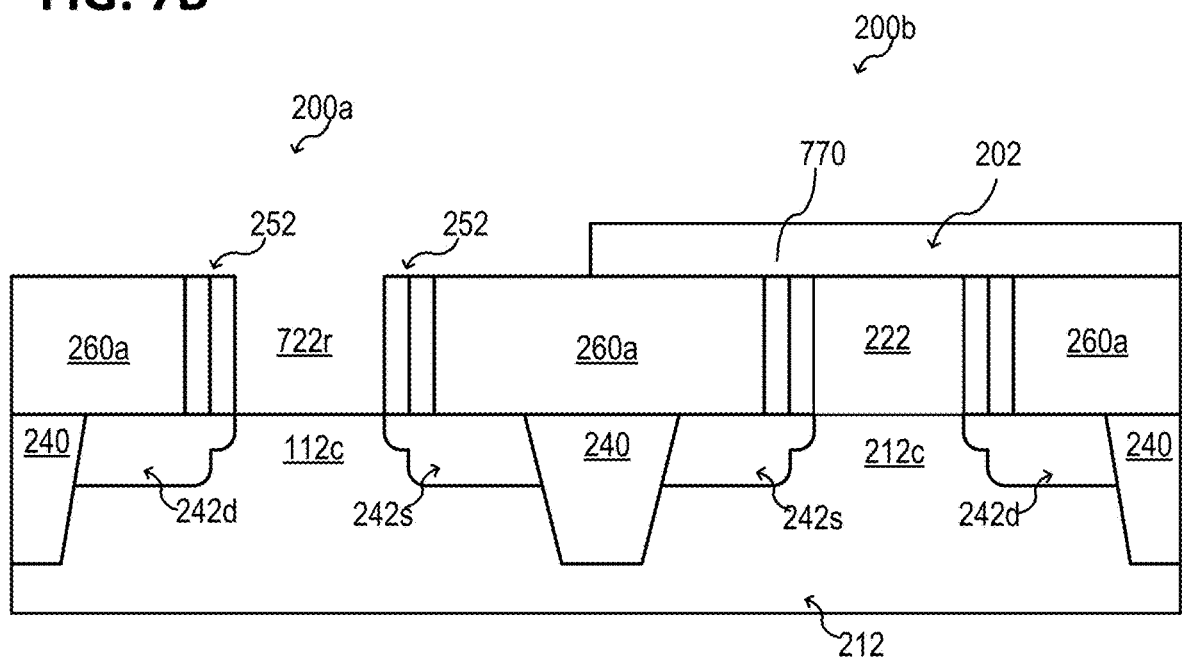

FIG. 7B shows the carrier 212 in a schematic cross-sectional view at a further processing stage, according to various embodiments. According to various embodiments, a mask 770 may be formed (e.g., deposited and patterned) to protect the logic area 200b from subsequent processes carried out to process the field-effect transistor structure 102 in the memory area 200a. After the mask 770 is formed, the dummy gate, which might for example consist of a gate material (e.g. polysilicon), a gate metal or sacrificial layer (e.g. TiN), the HK (e.g. HfO$_2$) and the interface-protecting insulator (e.g. SiO$_2$) may be etched by wet or dry chemical etching or a combination of both. This reveals the silicon bulk material for the next processing step. Illustratively, the dummy gate stack 722 in the memory area 200a may be removed, e.g., completely.

Figure 7C:
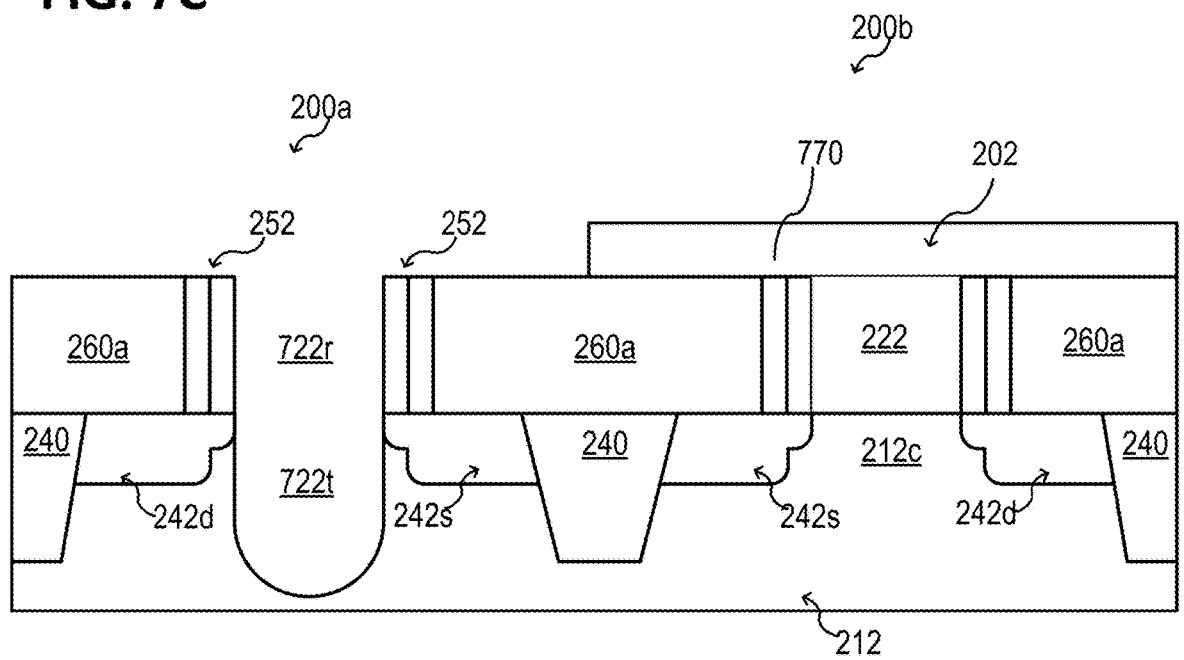

FIG. 7C shows the carrier 212 in a schematic cross-sectional view at a further processing stage, according to various embodiments. According to various embodiments, a trench 722t may be formed using the opening 722r generated by removing the dummy gate stack 722. The trench 722t may be formed by an etching process that selectively etches the semiconductor material (e.g., silicon) in the carrier 212. The trench 722t may have a depth in the range from about 20 nm to about 400 nm, e.g., a depth of 50 nm. Due to the trench 722t, the channel length of the generated field-effect transistor structure 102 is increased. Accordingly, the deeper the trench 722t is etched, the longer the effective channel length and therefore the larger the gate capacitance of the generated field-effect transistor structure 102.

Figure 7D:
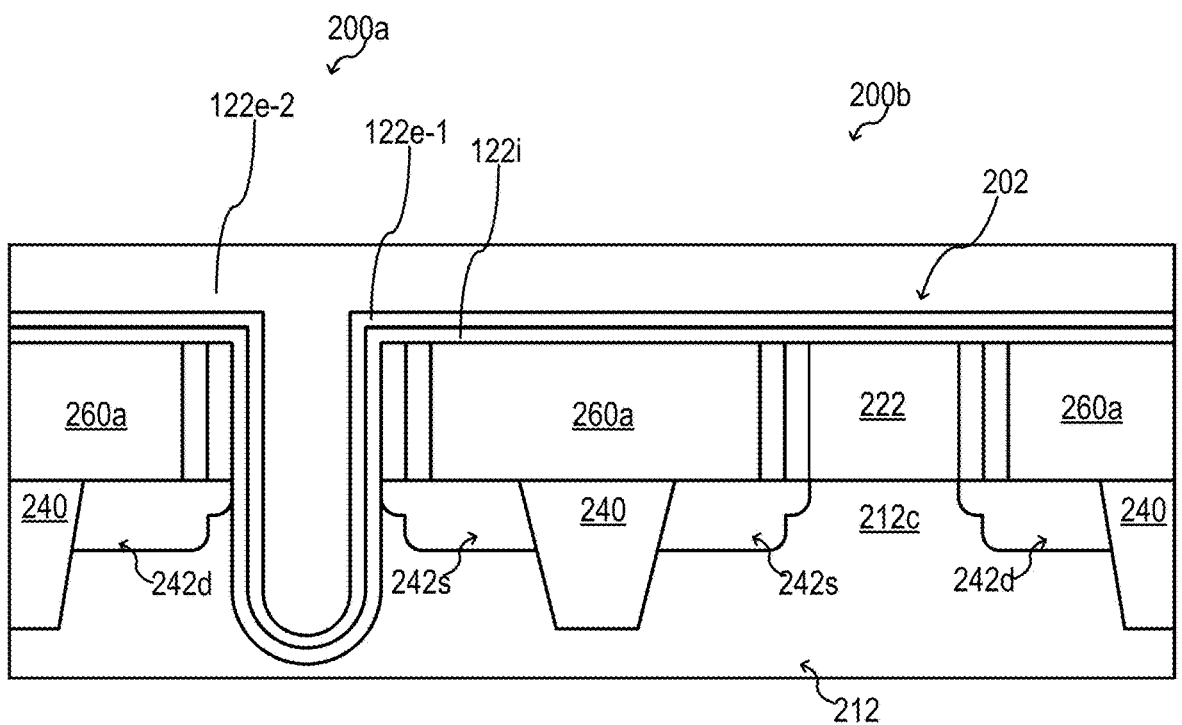

FIG. 7D shows the carrier 212 in a schematic cross-sectional view at a further processing stage, according to various embodiments. According to various embodiments, a gate structure 122 (e.g., a stack similar to the gate stack described above) may be formed into the trench 722t. Therefore, the mask 770 protecting the logic area 200b may be removed, if desired. According to various embodiments, the gate isolation structure 122i (e.g., including a high-k material layer 122i-2, e.g. HfO$_2$) and the gate electrode structure 122e (e.g., including a metal layer 122e-1, e.g. TiN) may be formed. Forming the gate isolation structure 122i and the gate electrode structure 122e may include depositing the respective layers into the trench 722t by conformal deposition process (e.g. ALD). Afterwards a gate material (e.g. an aluminum layer 122e-2) may be deposited to fill the trench 722t completely, if desired.

According to various embodiments, any type of gate stack may be filled into the trench 722t. If it might be more desirable, for example, to deposit/grow a SiO$_2$ interface and utilize a polysilicon gate material (without the intermediate insertion of a metal material), this may be done as well.

Figure 7E:
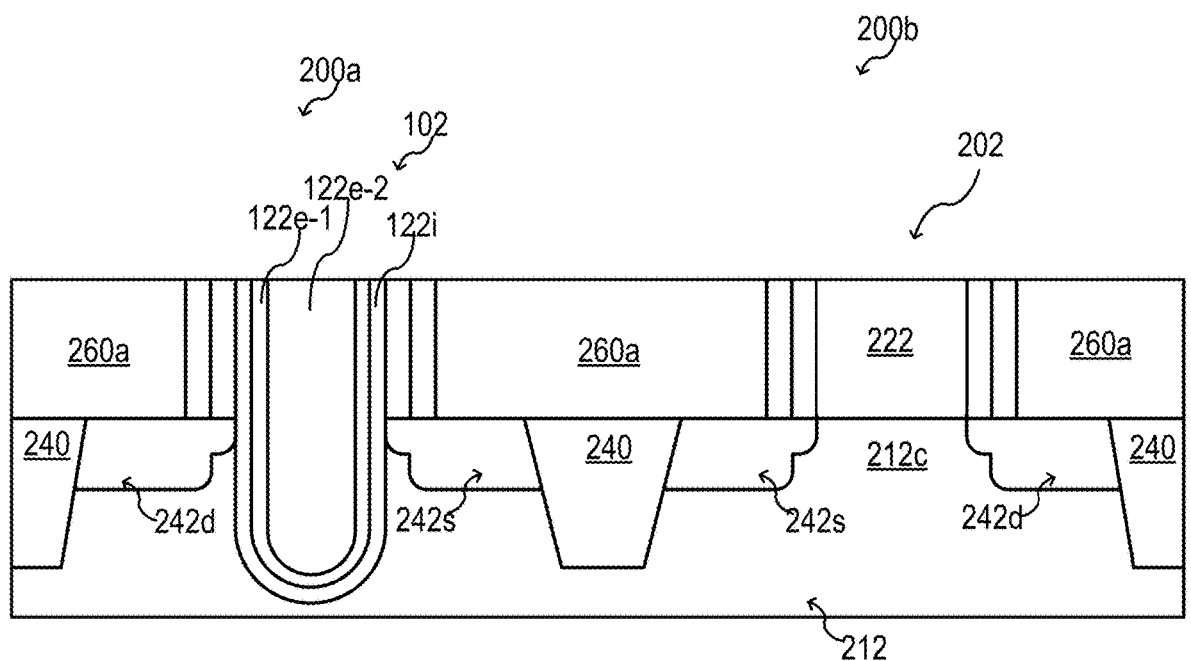
Figure 8A:
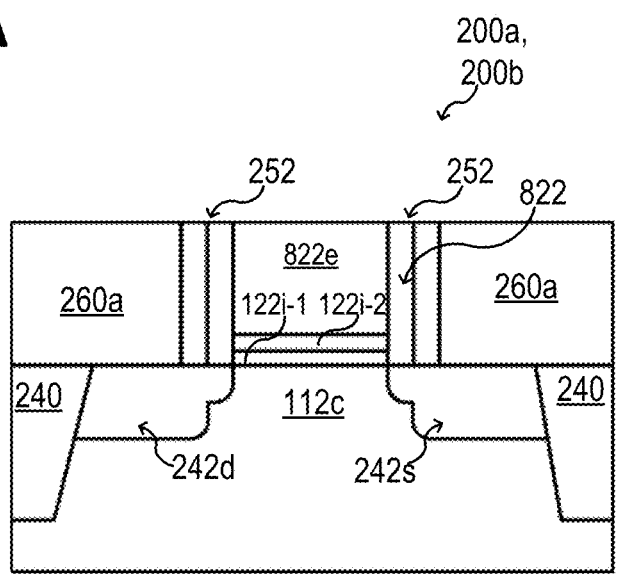
FIG. 8A to FIG. 8D show a carrier during processing a gate structure of a field-effect transistor structure in a schematic view, according to various embodiments.
Figure 8B:
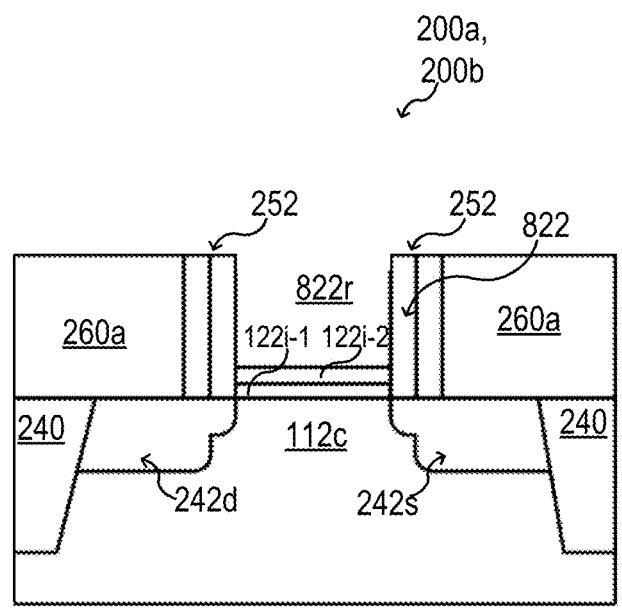
Figure 8C:
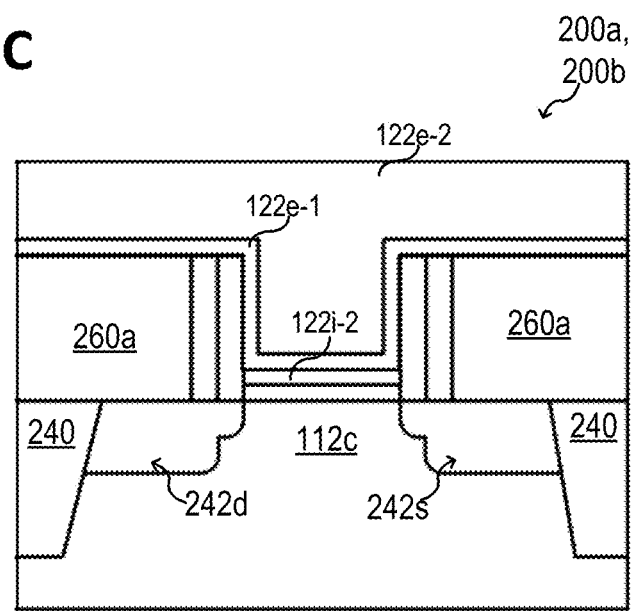
Figure 8D:
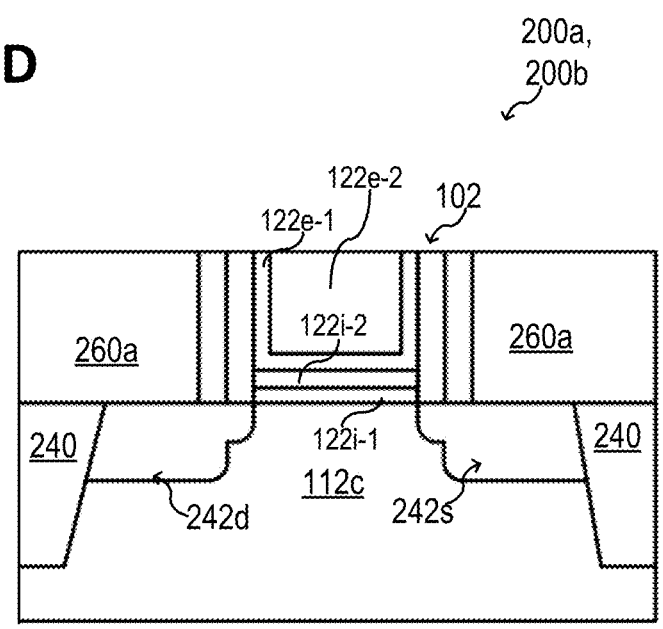
Figure 9A:
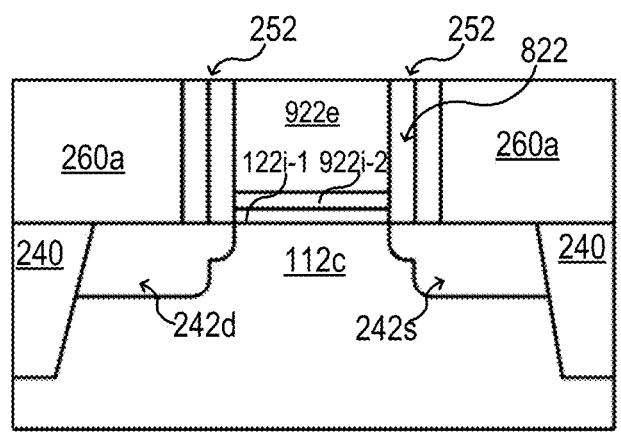
FIG. 9A to FIG. 9D show a carrier during processing a gate structure of a field-effect transistor structure in a schematic view, according to various embodiments.
Figure 9B:
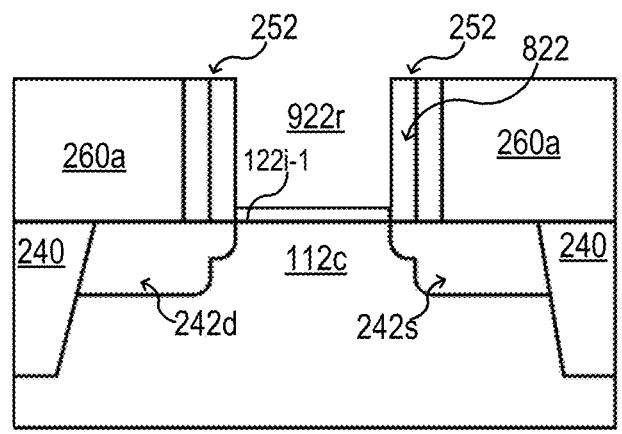
Figure 9C:
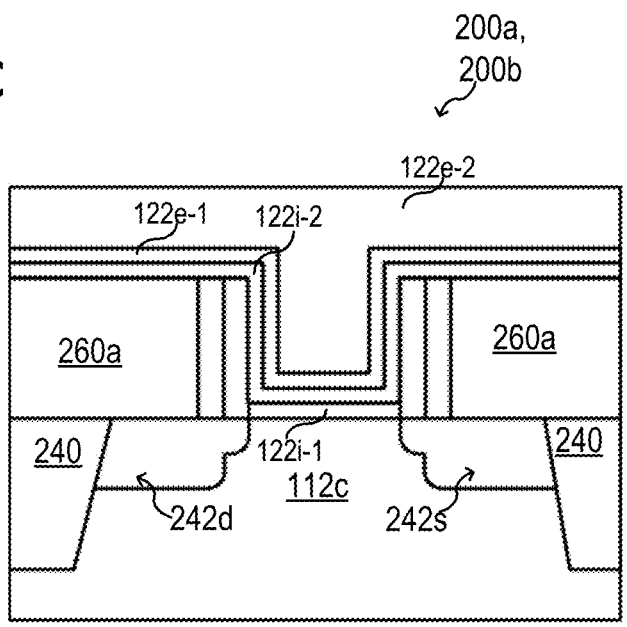
Figure 9D:
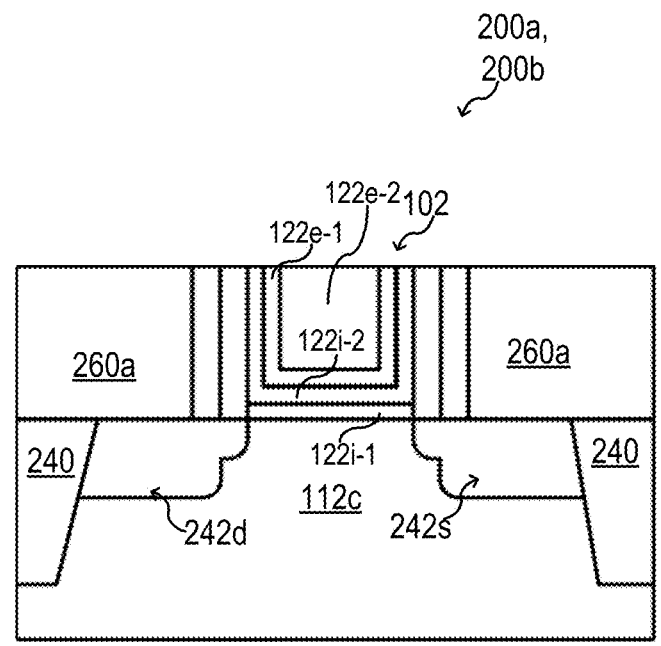
Figure 10A:
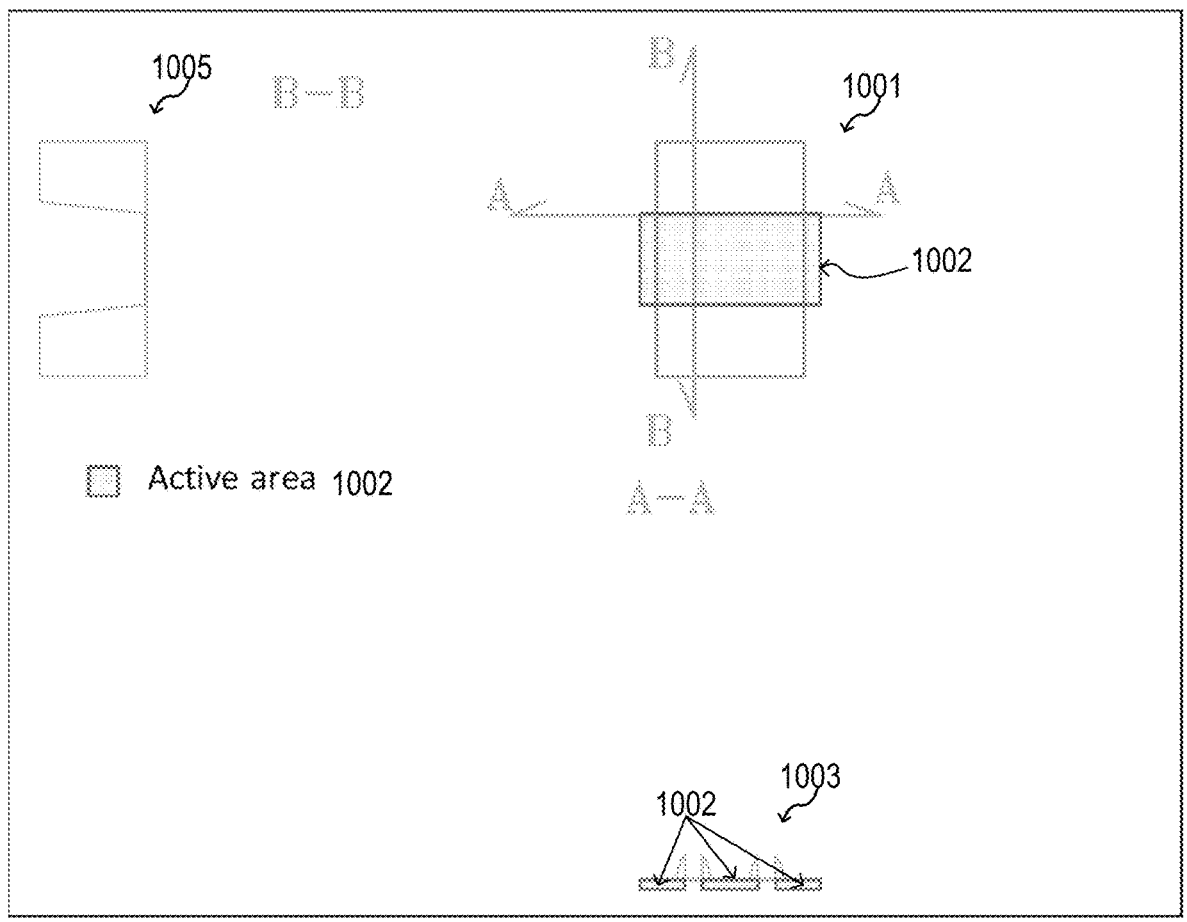
FIG. 10A to FIG. 10I show a layout for processing a memory cell or an electronic device including a memory cell in a schematic view, according to various embodiments.
Figure 10B:
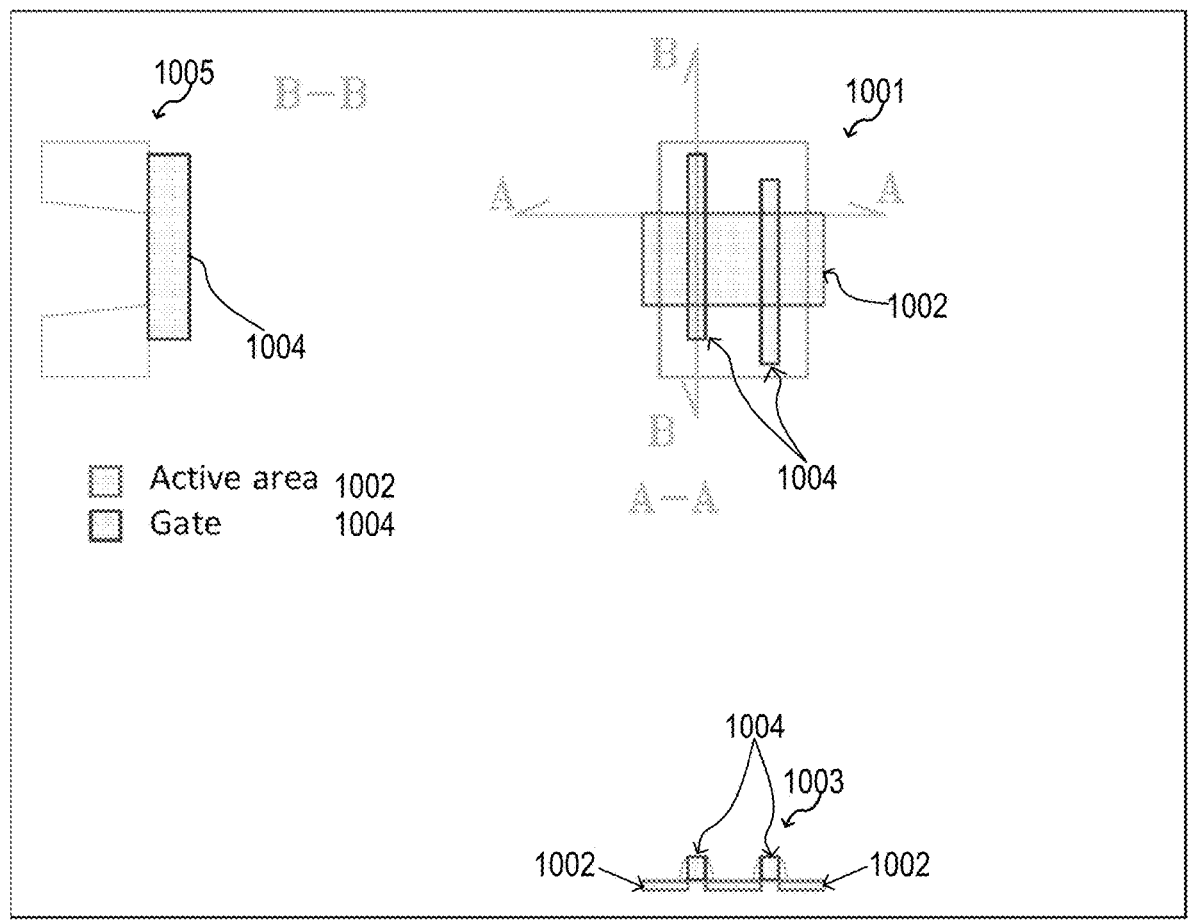
Figure 10C:
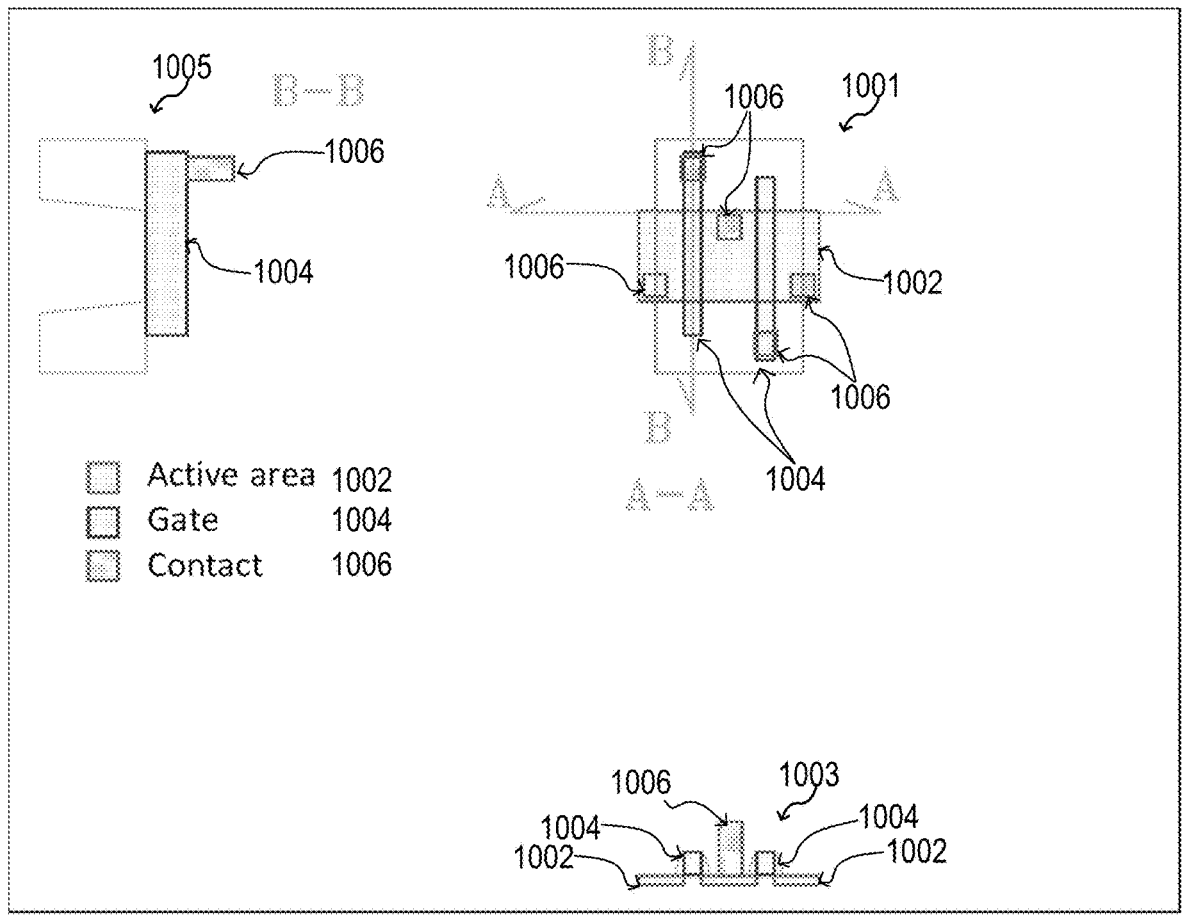
Figure 10D:
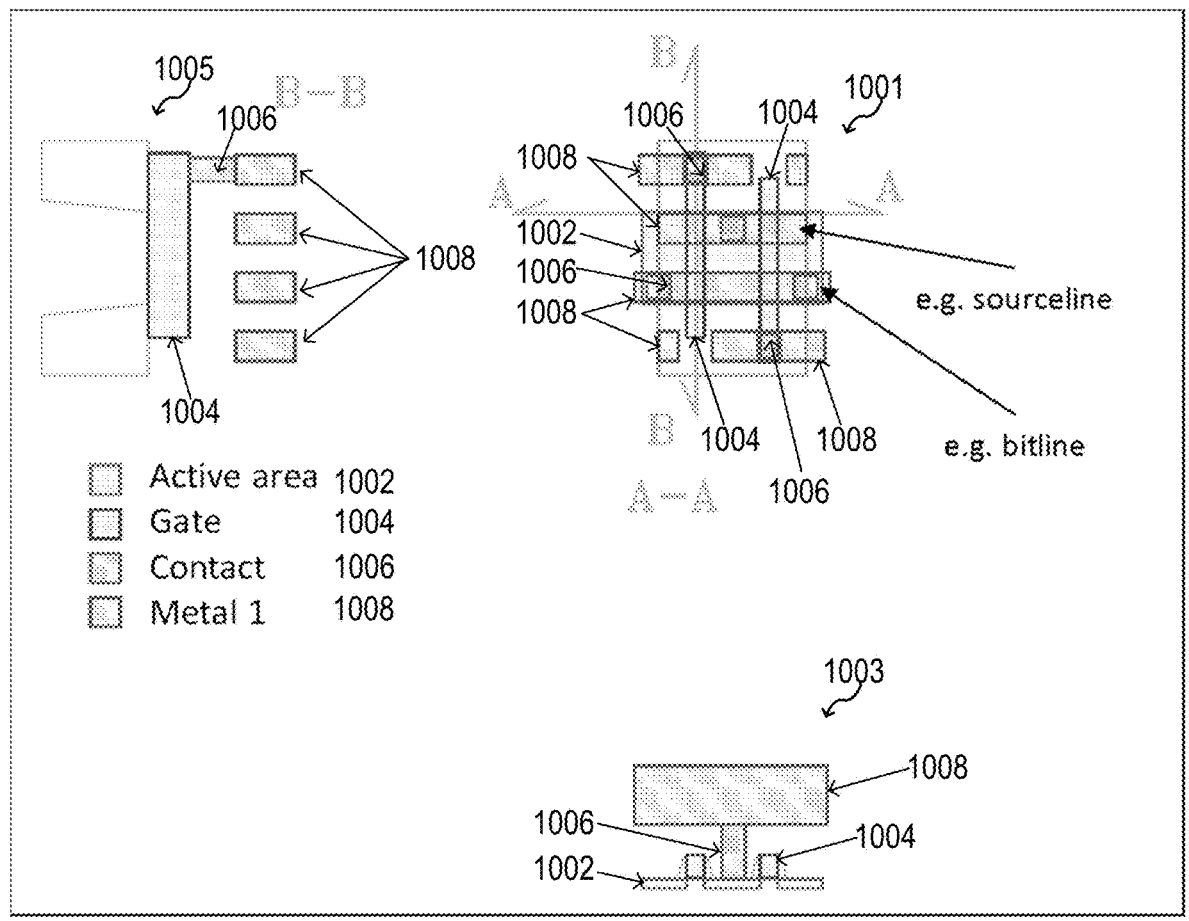
Figure 10E:
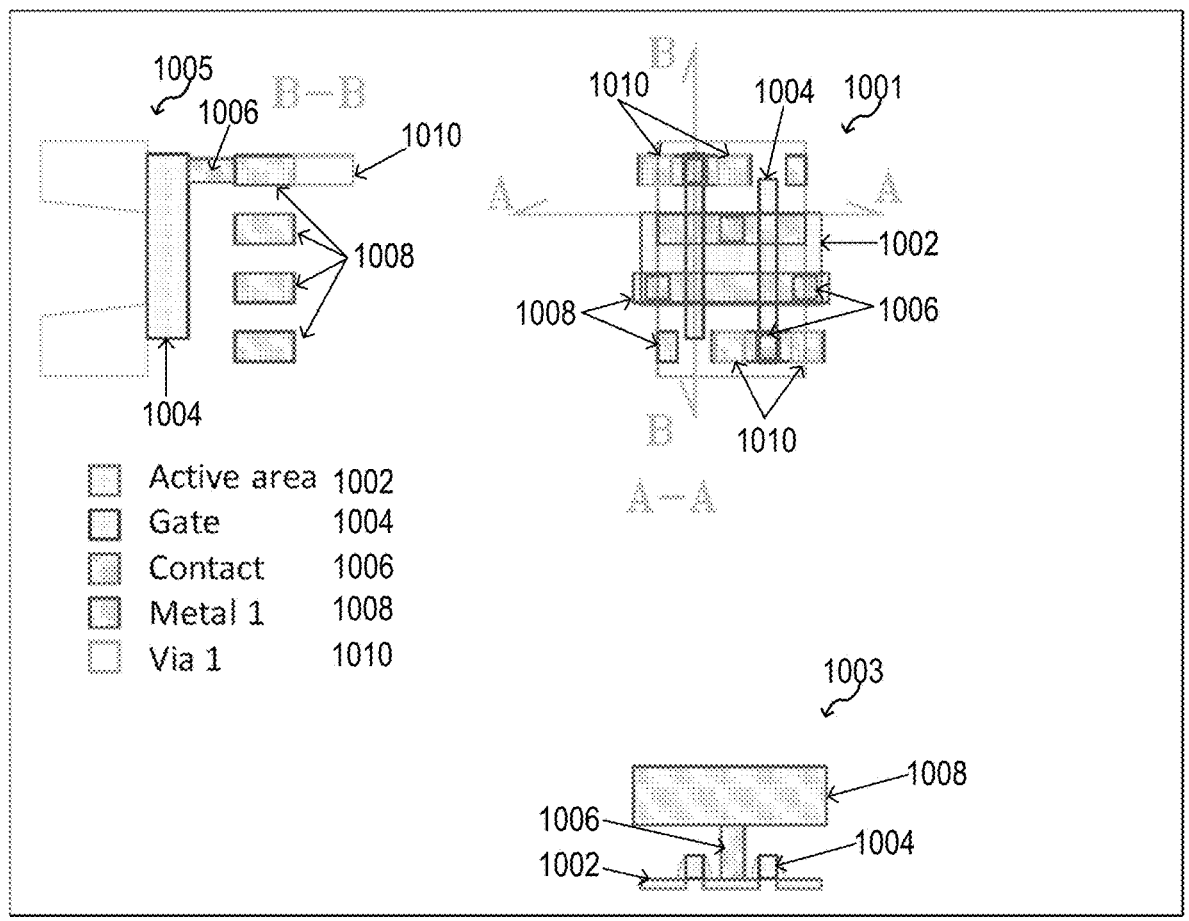
Figure 10F:
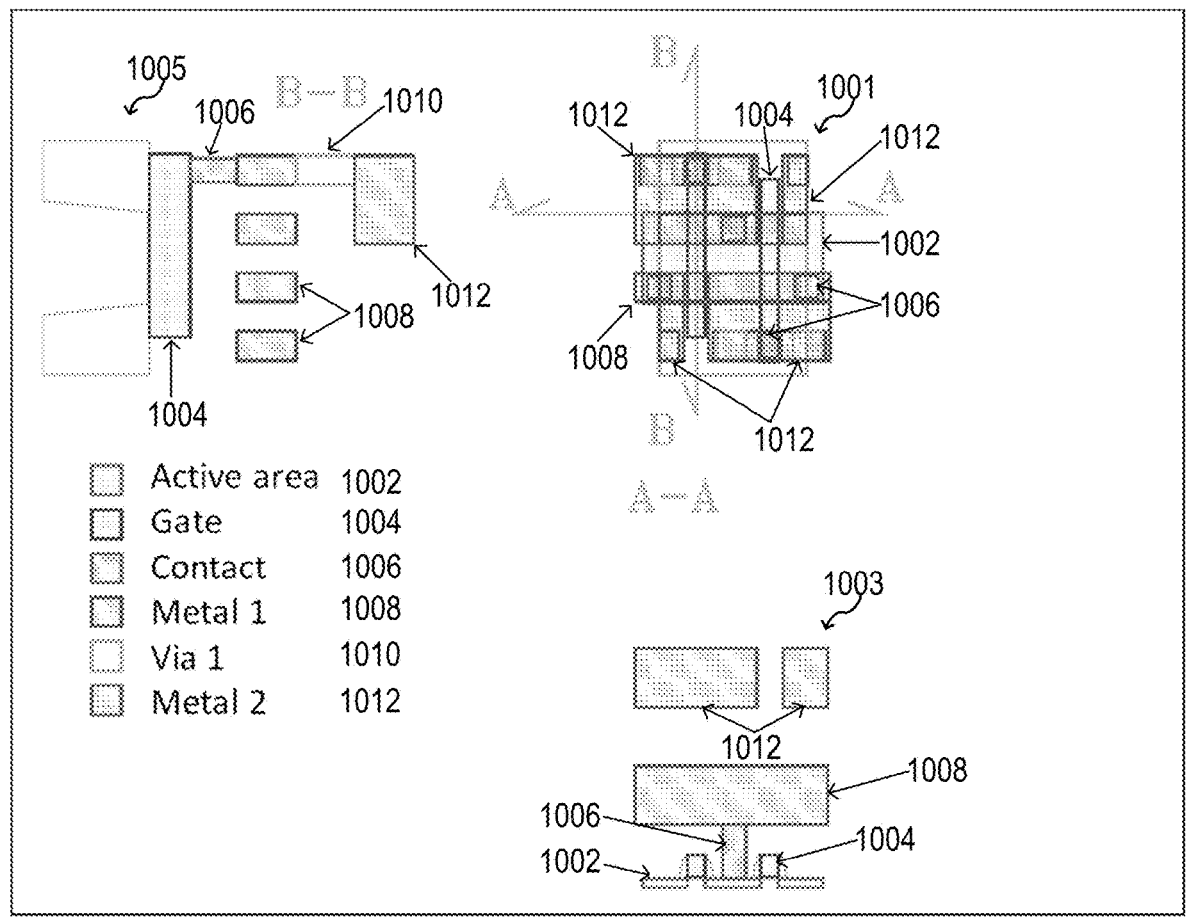
Figure 10G:
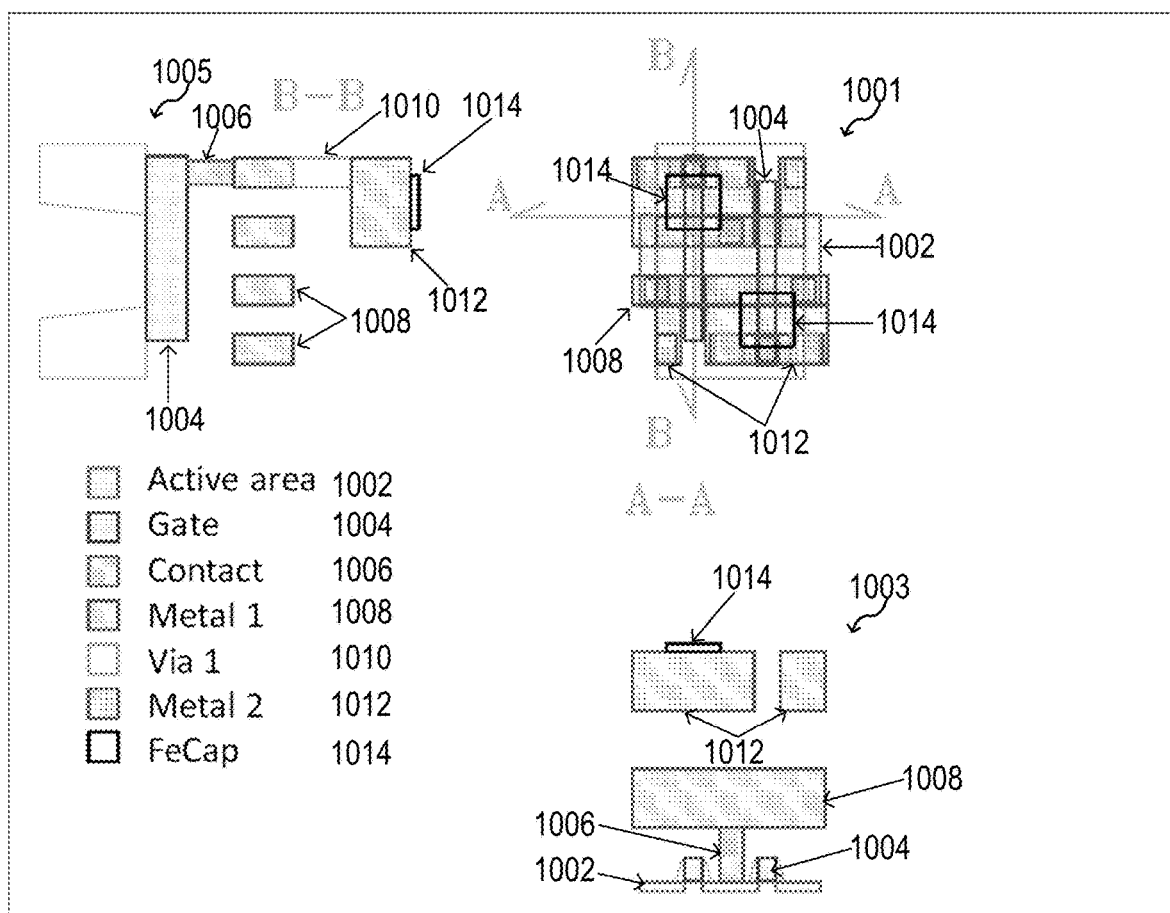
Figure 10H:
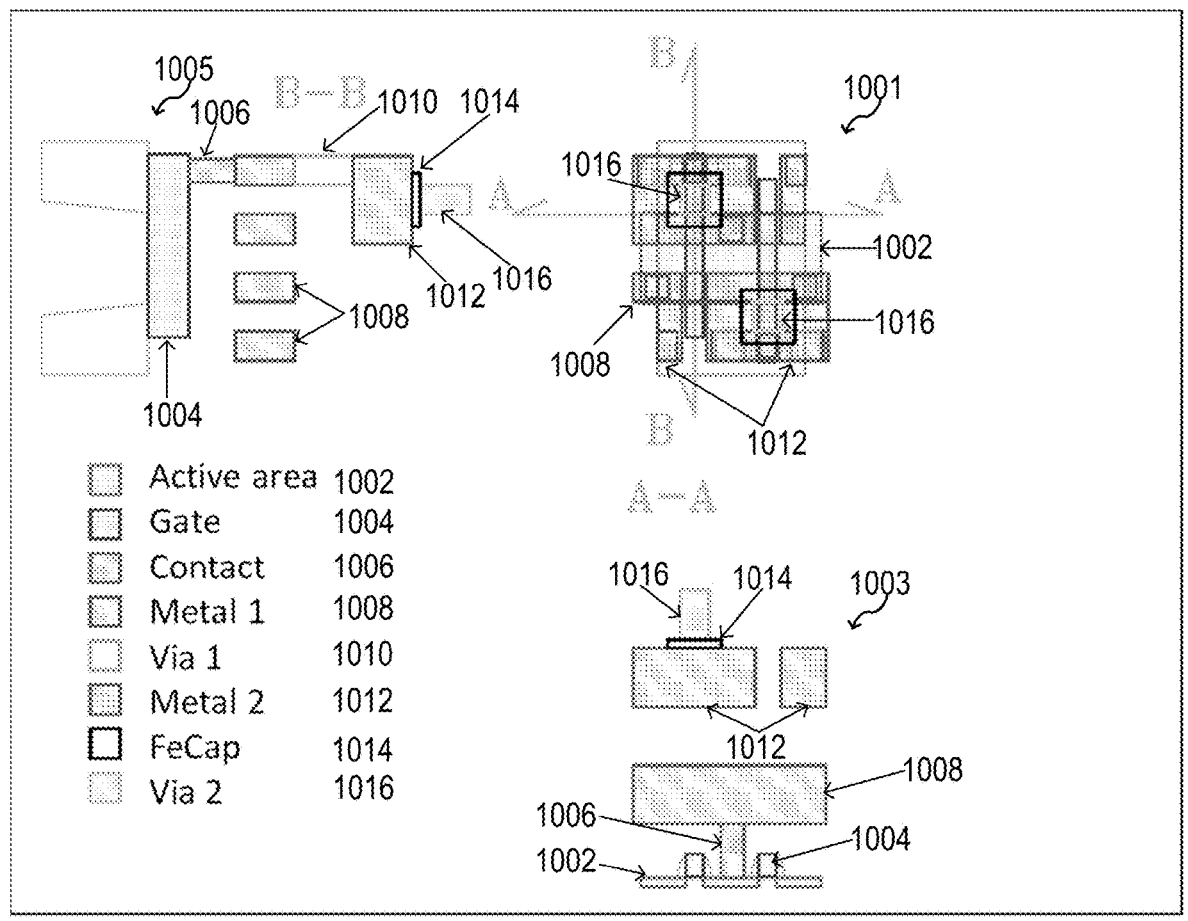
Figure 10I:
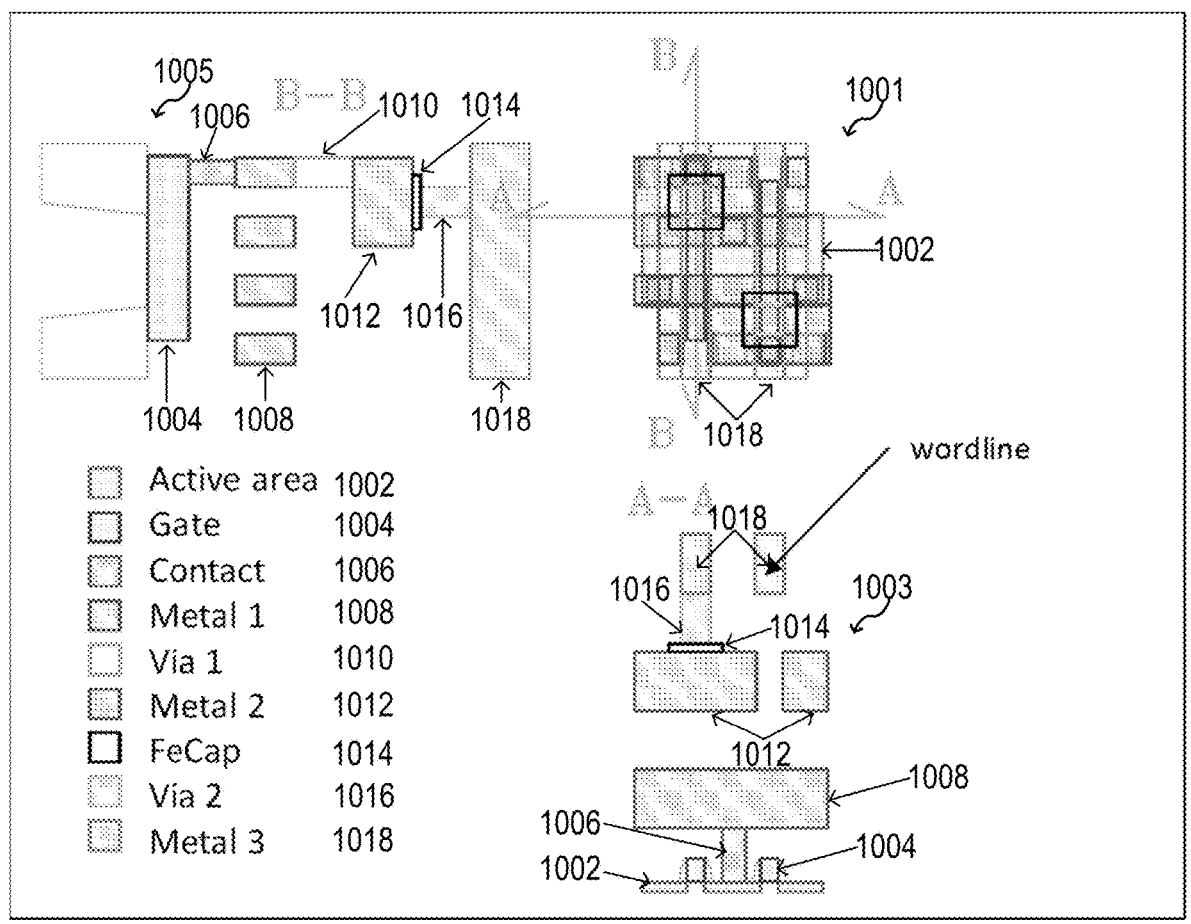
Figure 11A:
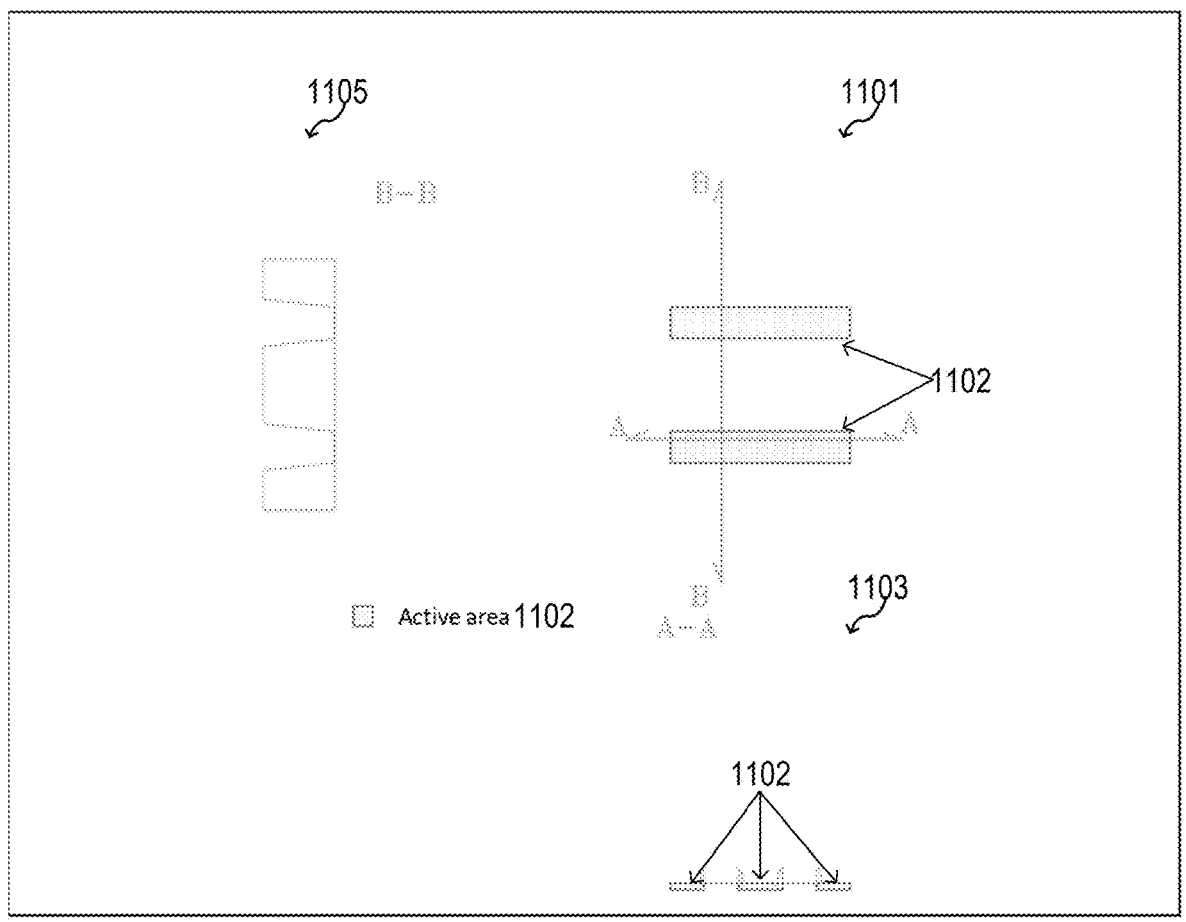
FIG. 11A to FIG. 11I show a layout for processing a memory cell or an electronic device including a memory cell in a schematic view, according to various embodiments.
Figure 11B:
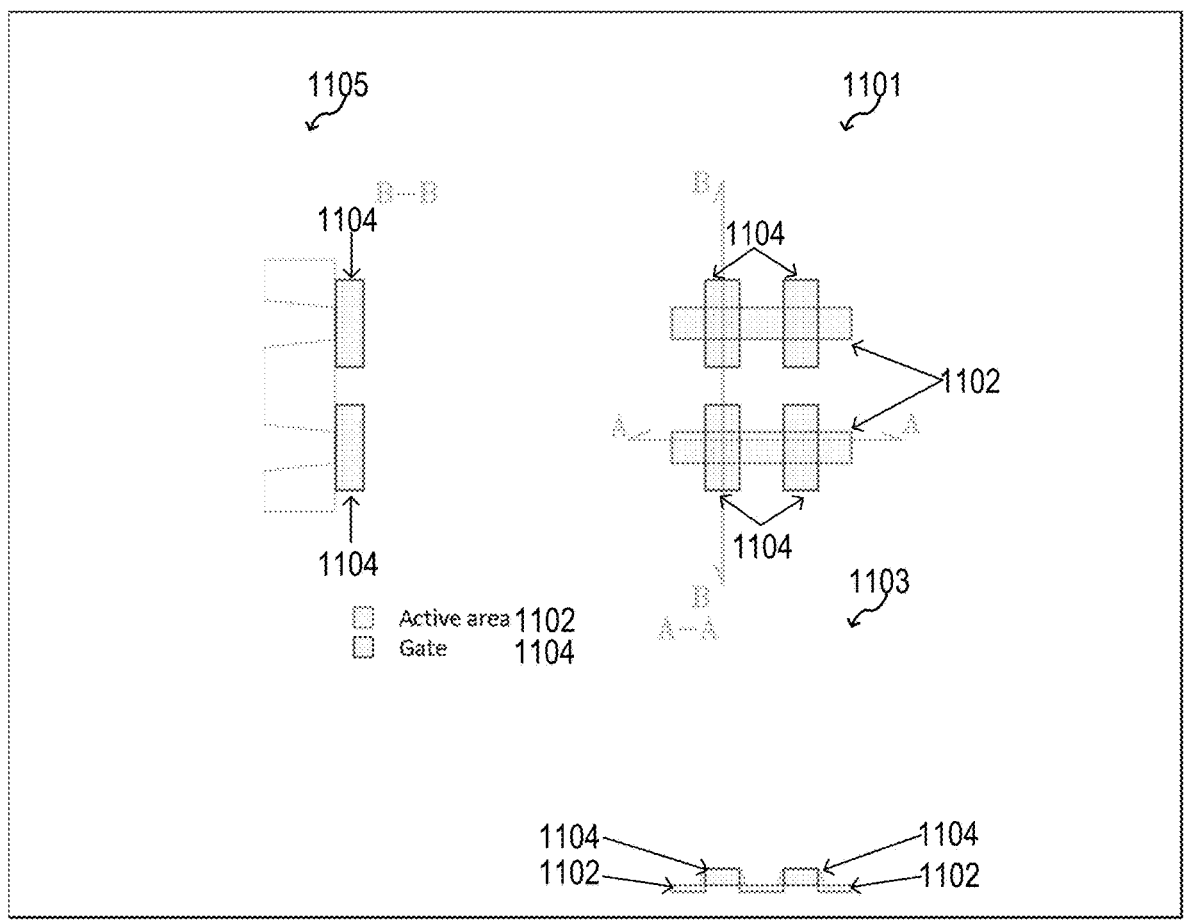
Figure 11C:
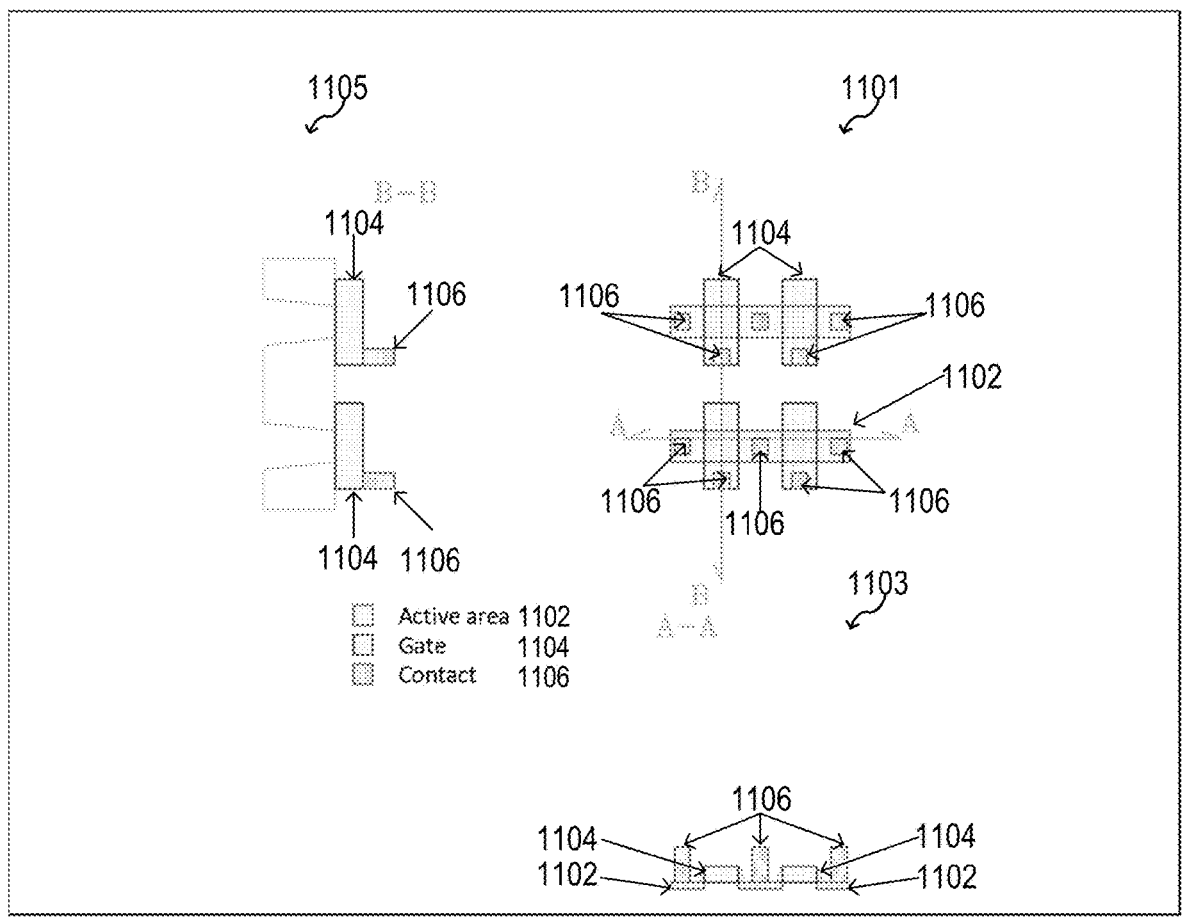
Figure 11D:
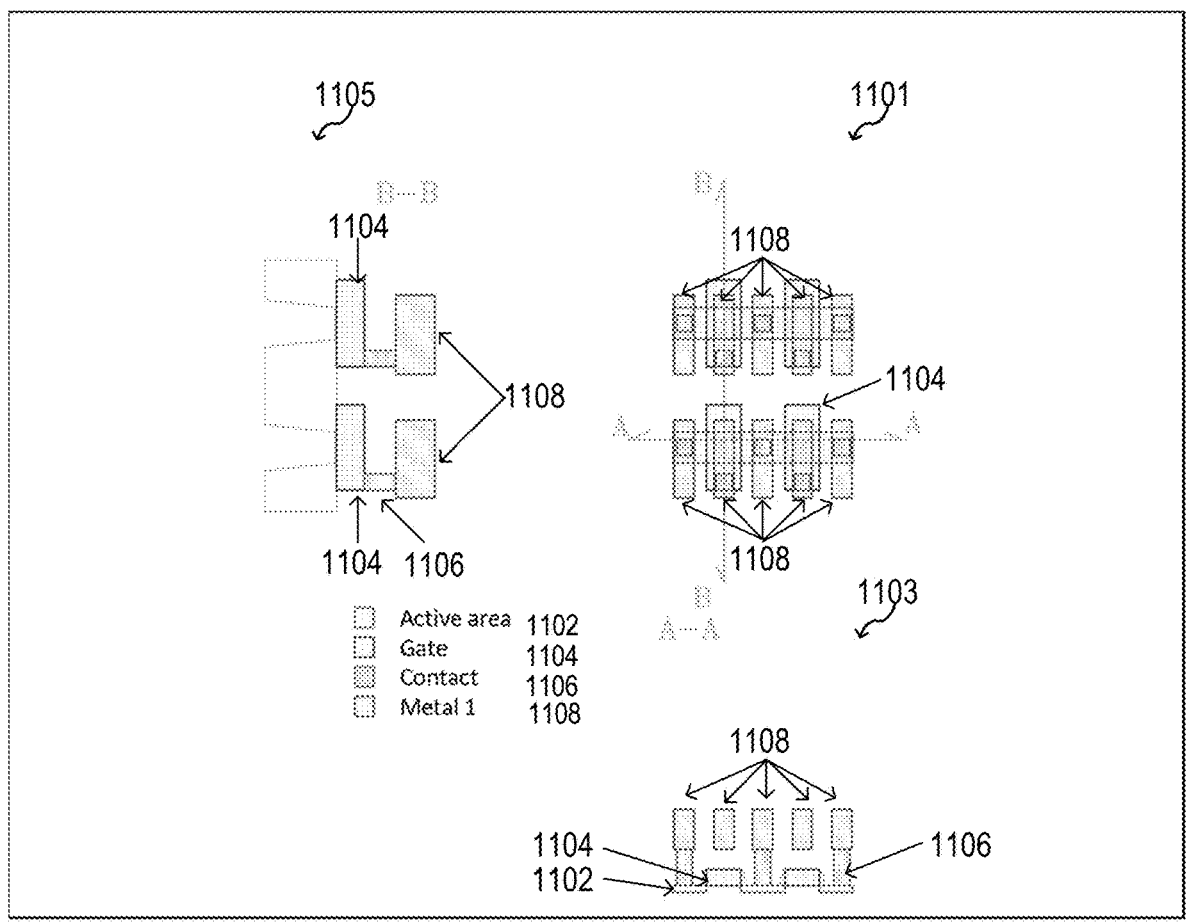
Figure 11E:
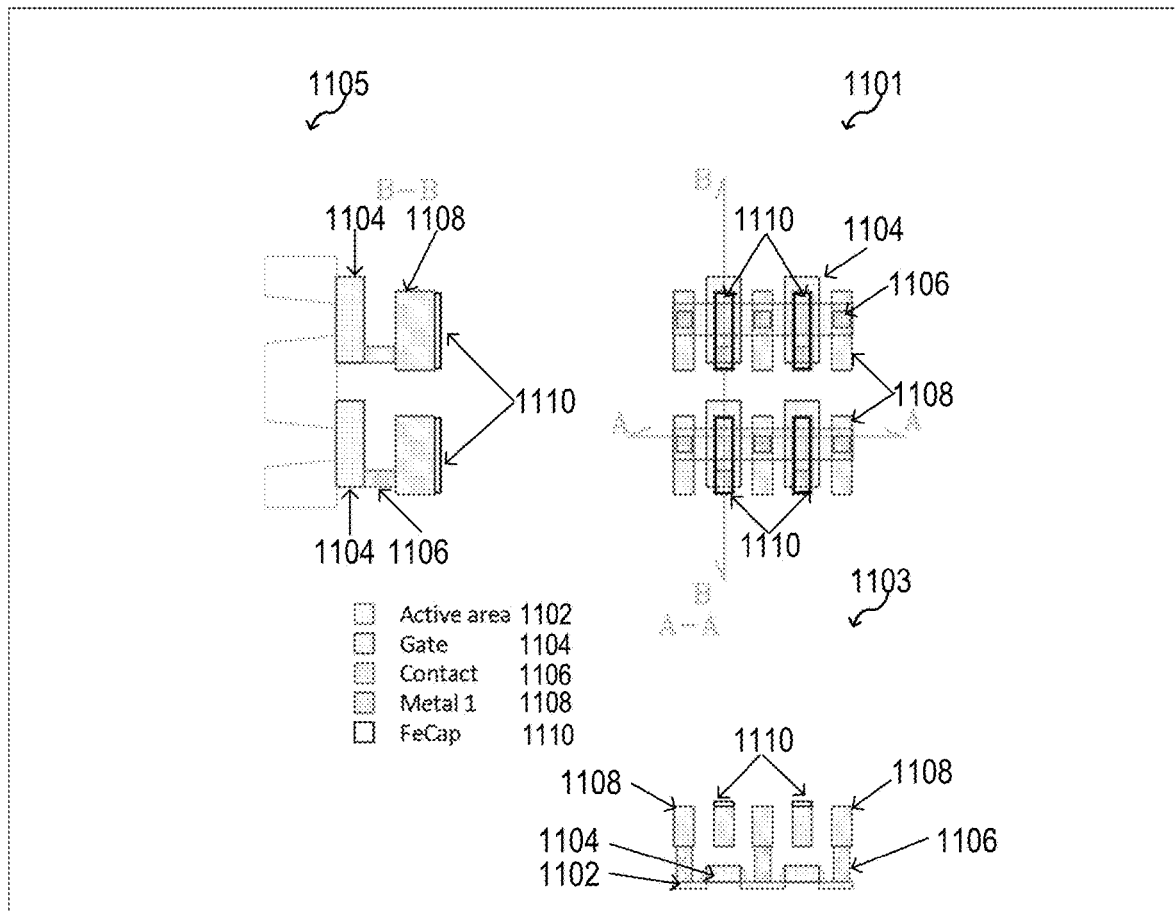
Figure 11F:
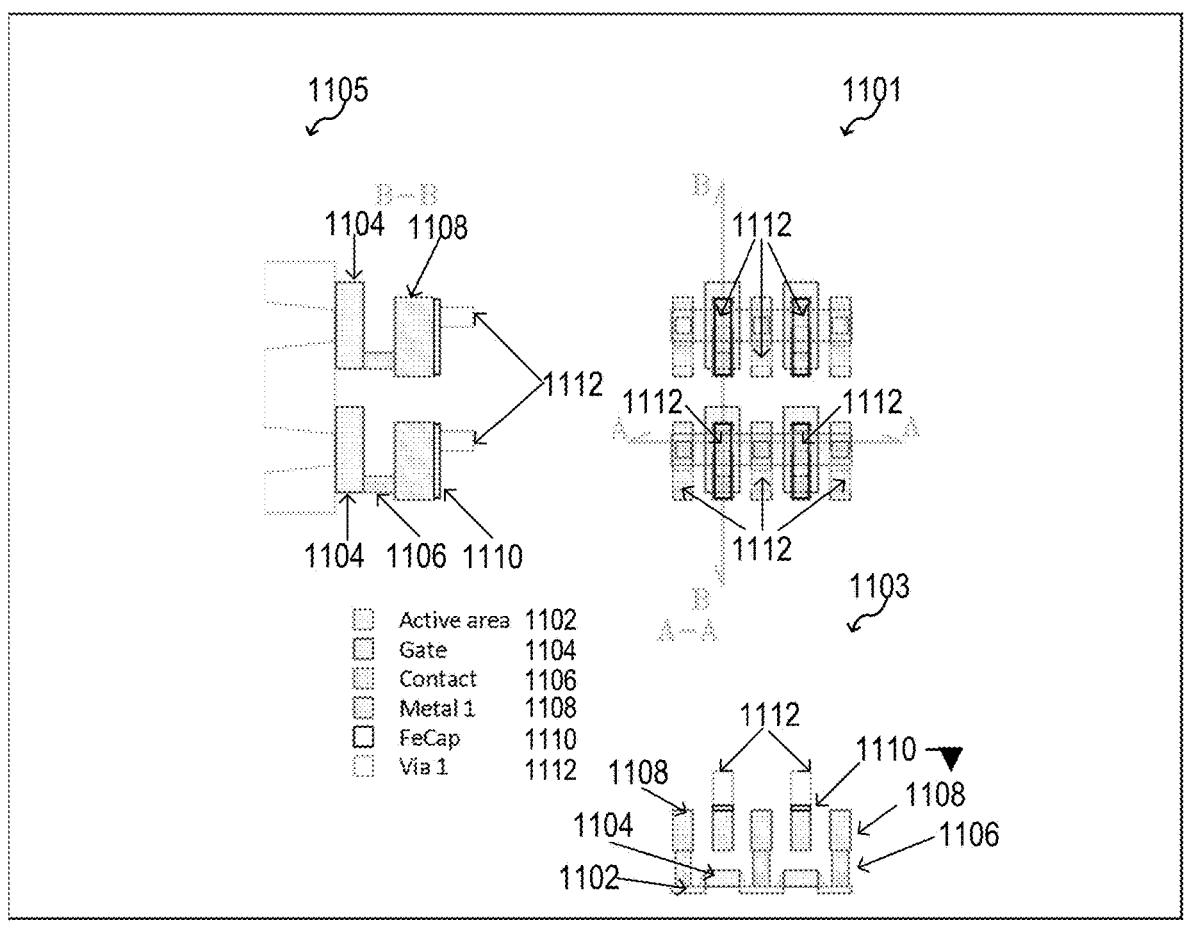
Figure 11G:
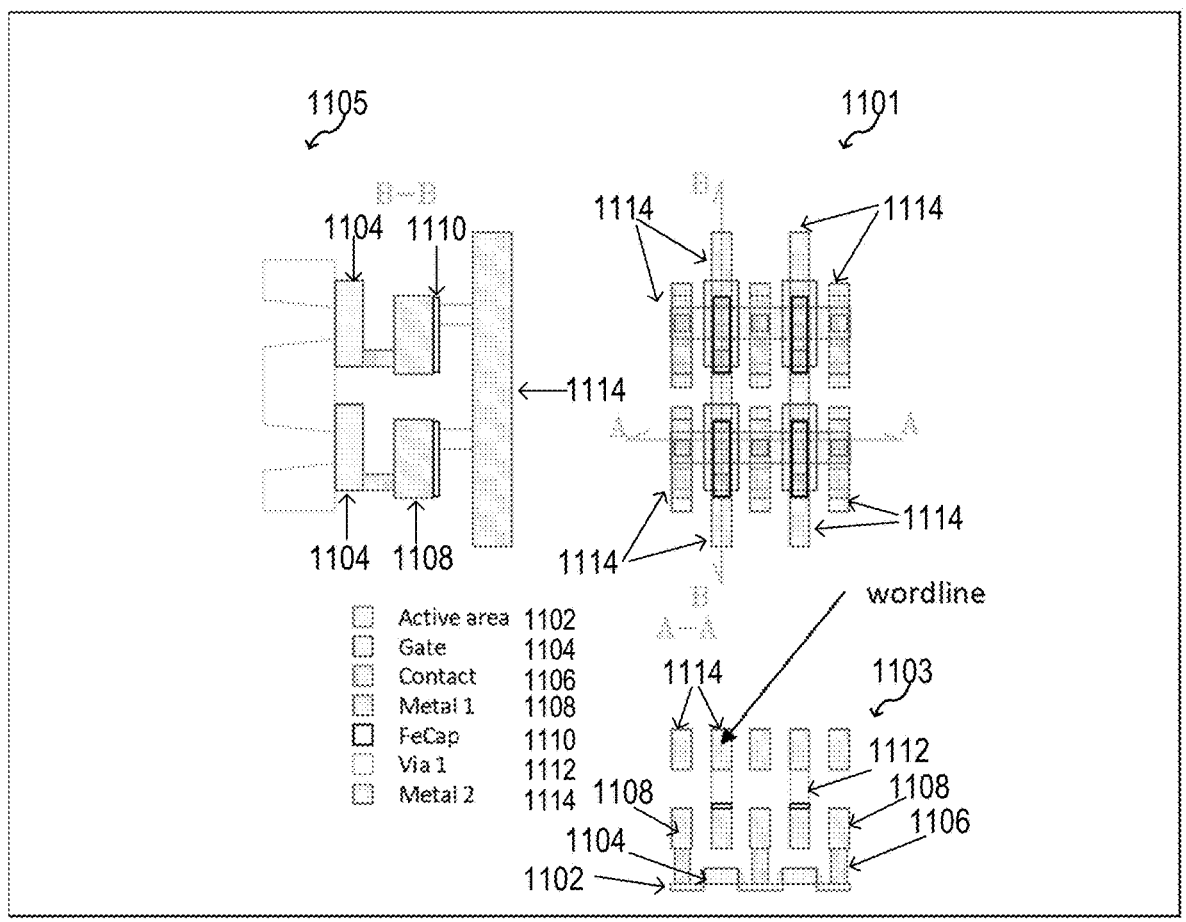
Figure 11H:
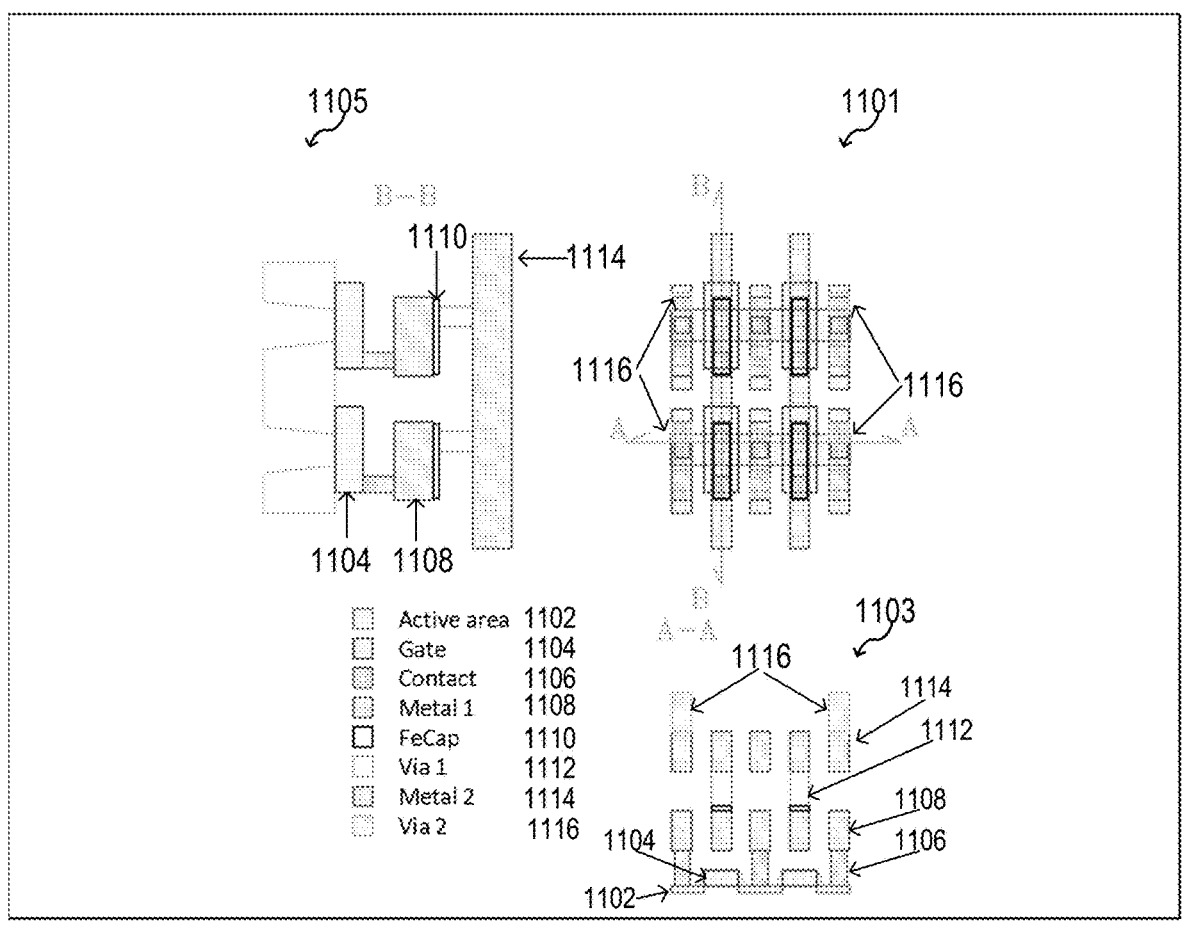
Figure 11I:
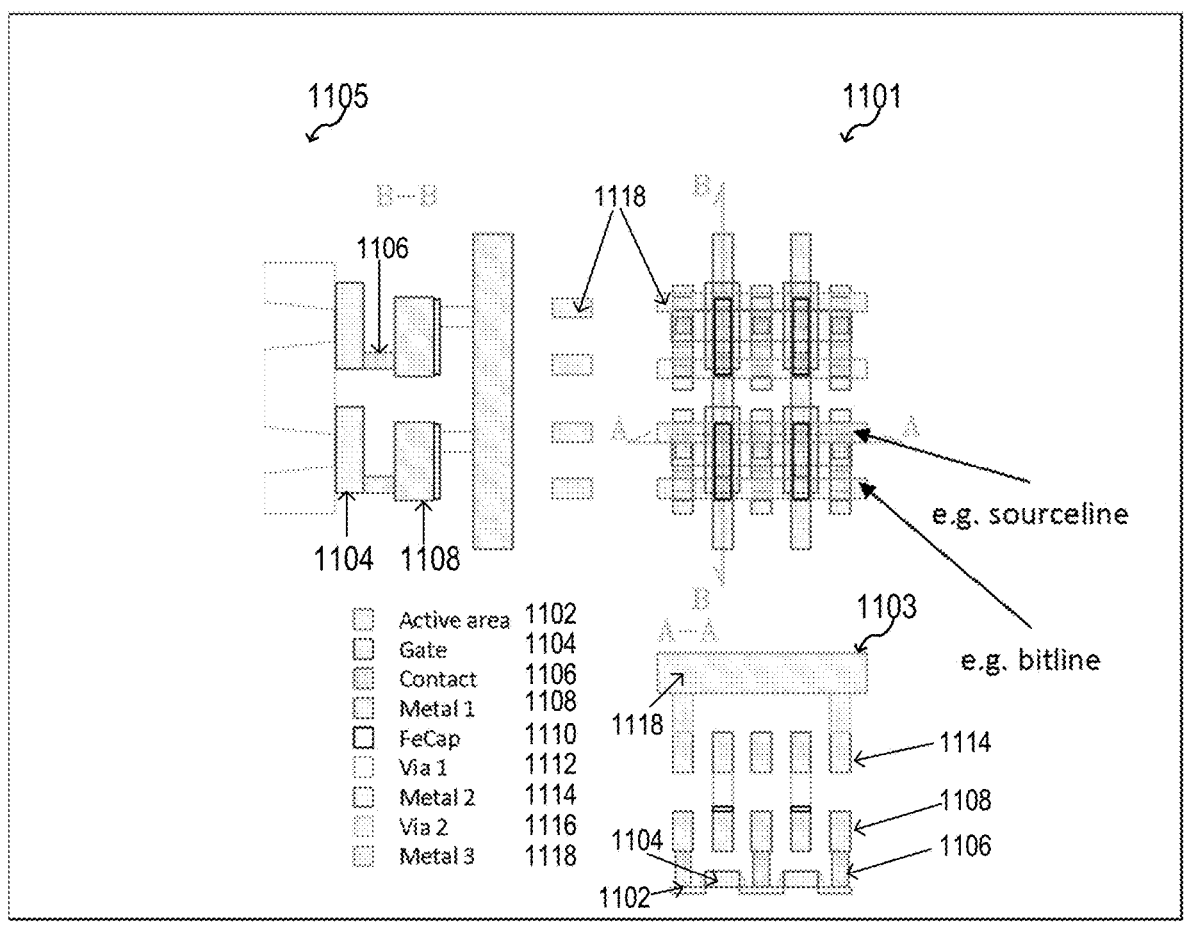
Figure 12A:
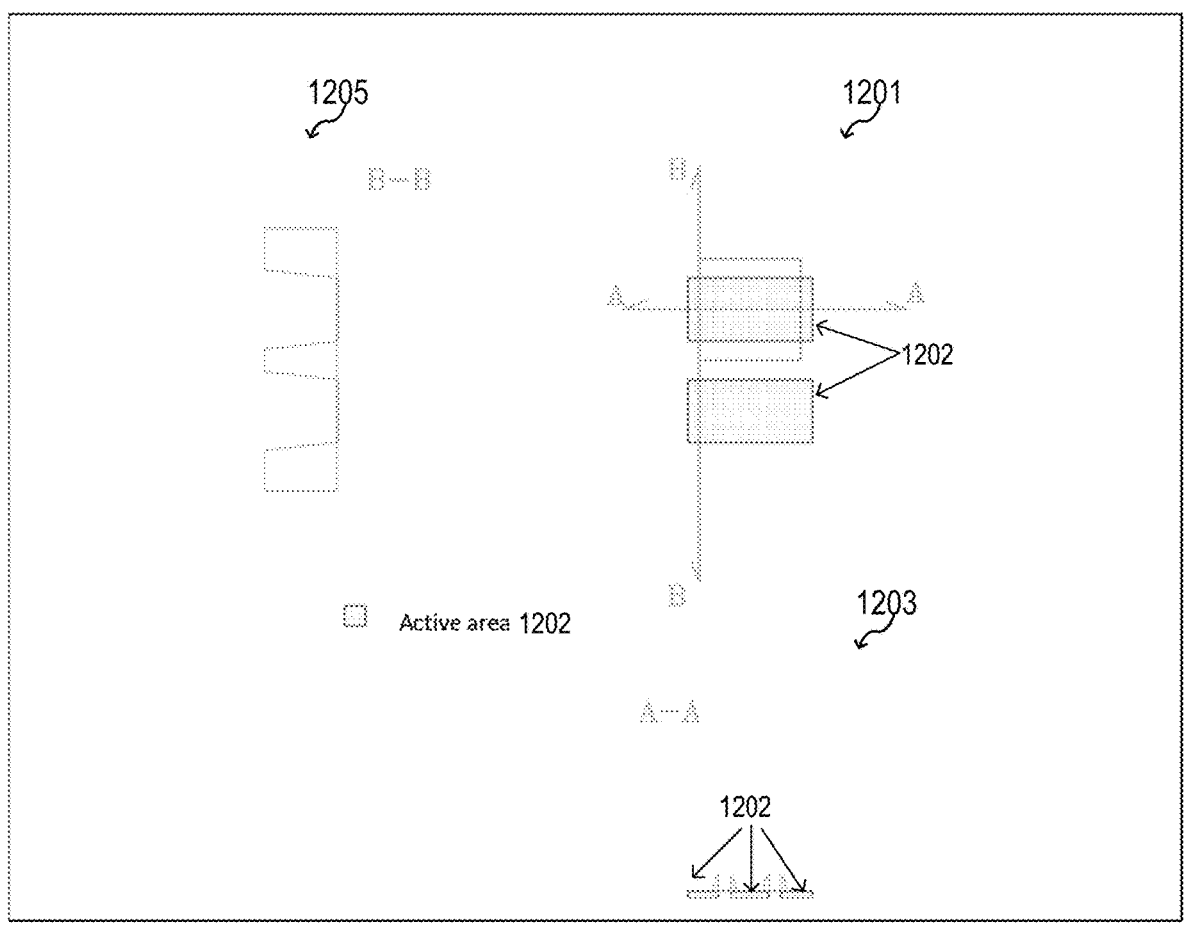
FIG. 12A to FIG. 12G show a layout for processing a memory cell or an electronic device including a memory cell in a schematic view, according to various embodiments.
Figure 12B:
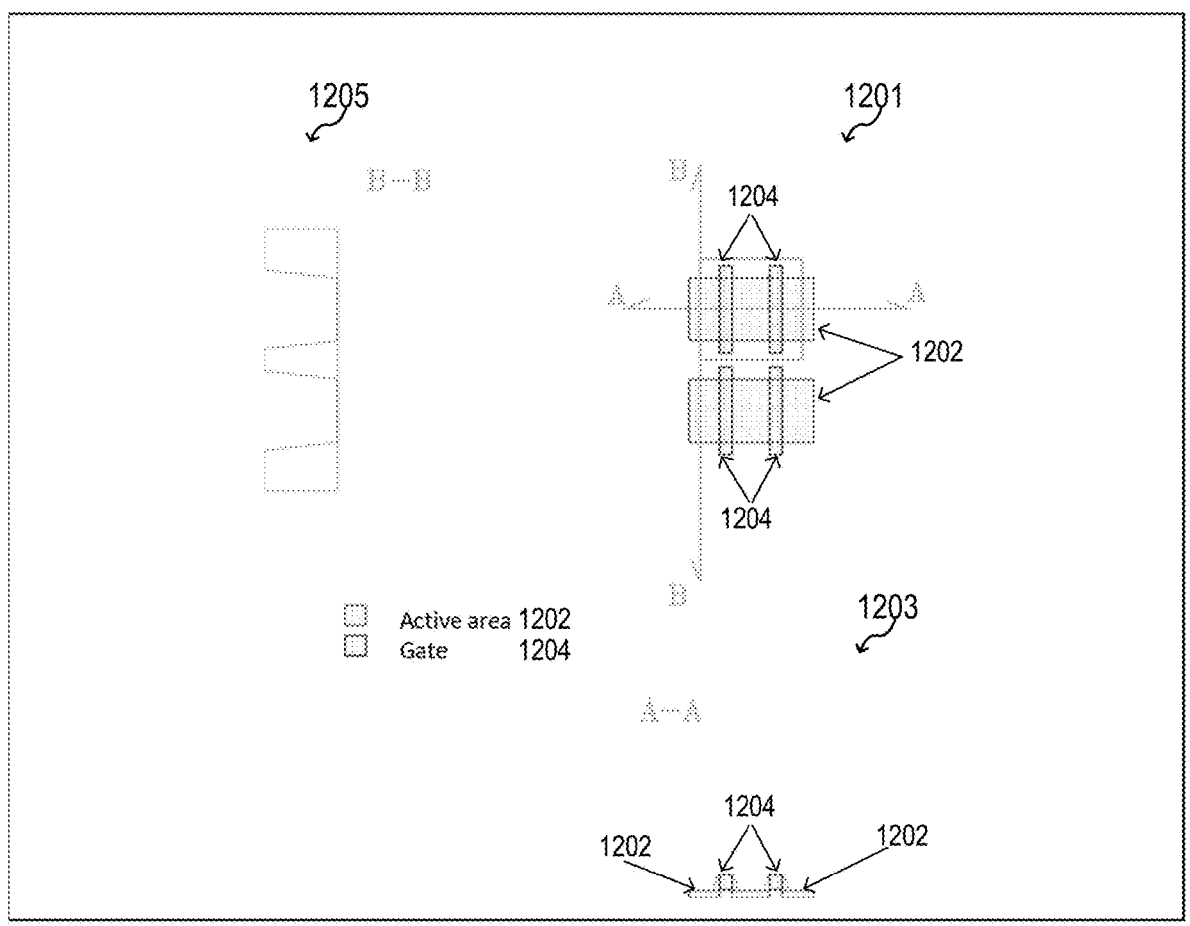
Figure 12C:
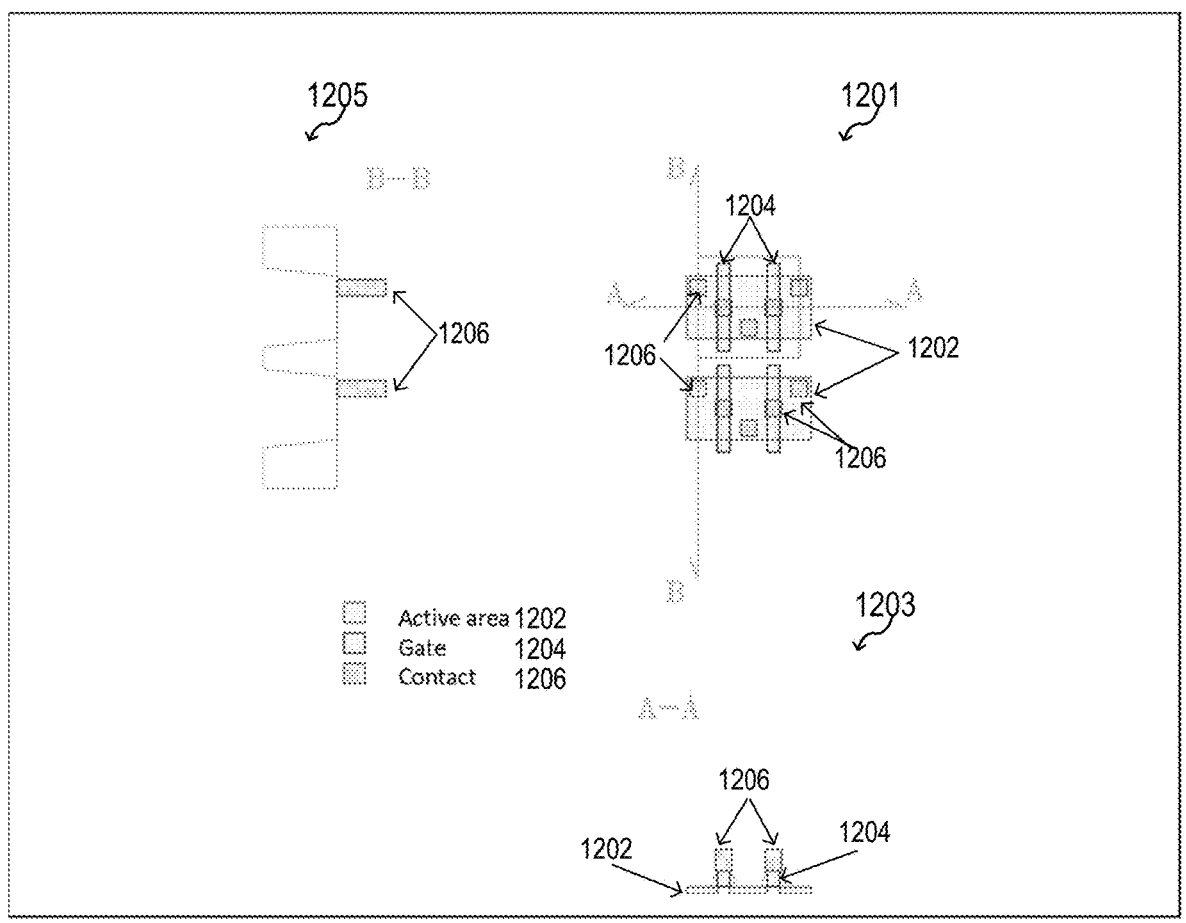
Figure 12D:
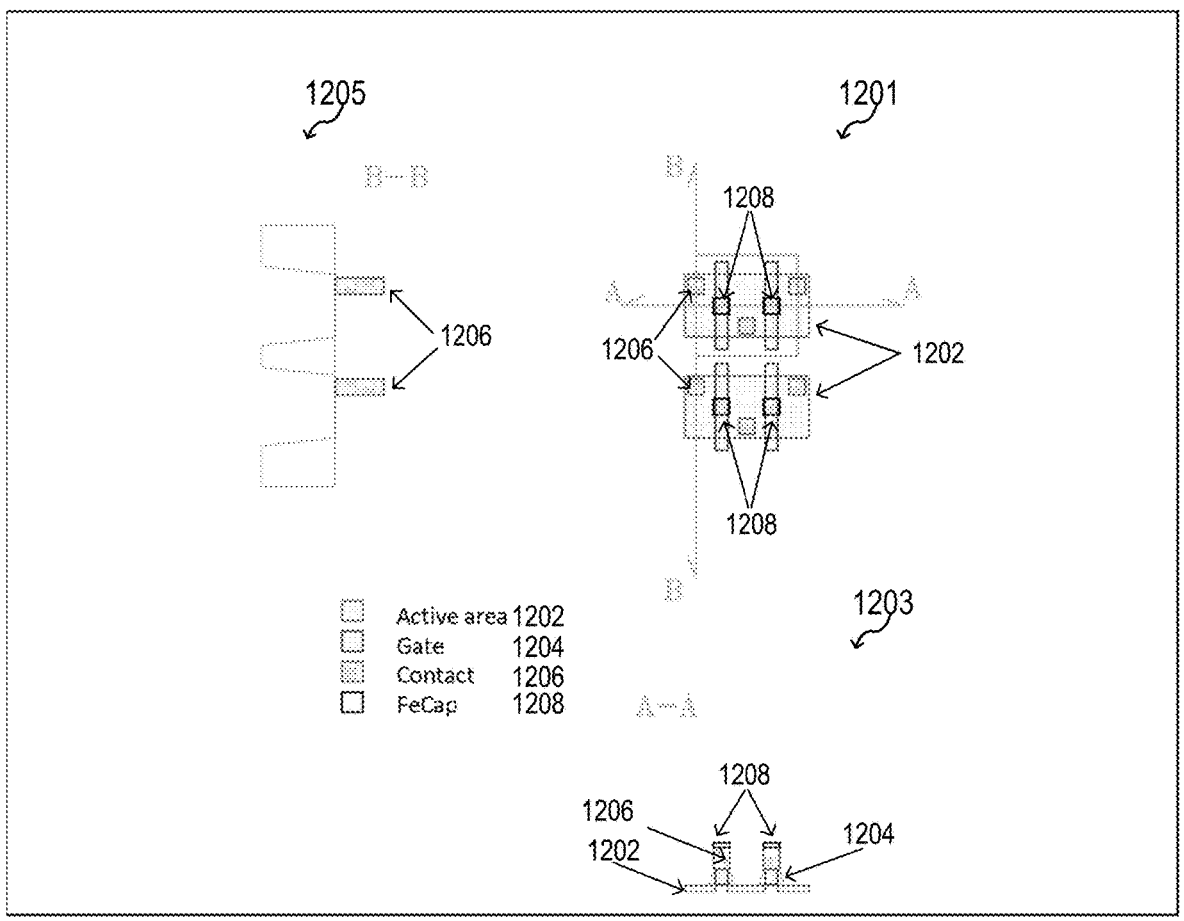
Figure 12E:
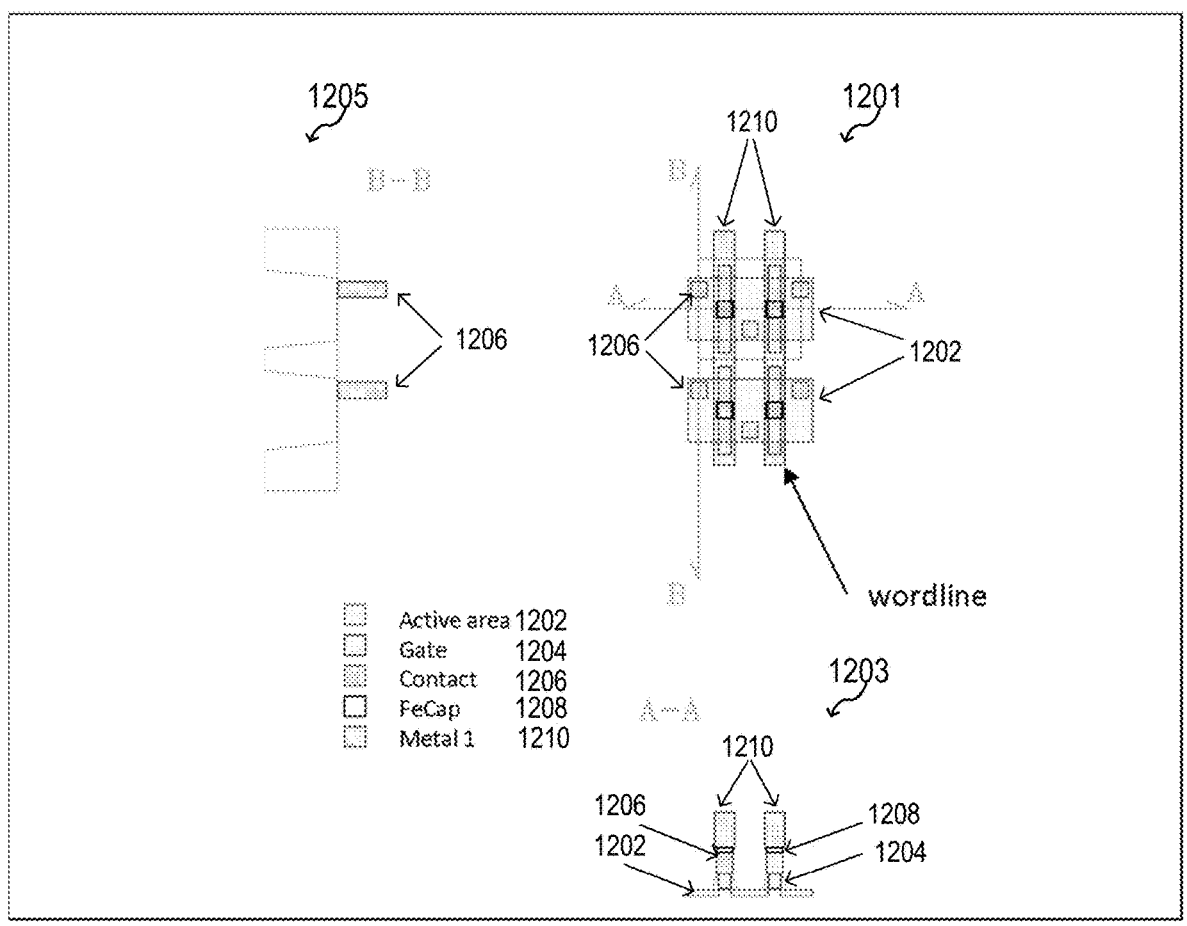
Figure 12F:
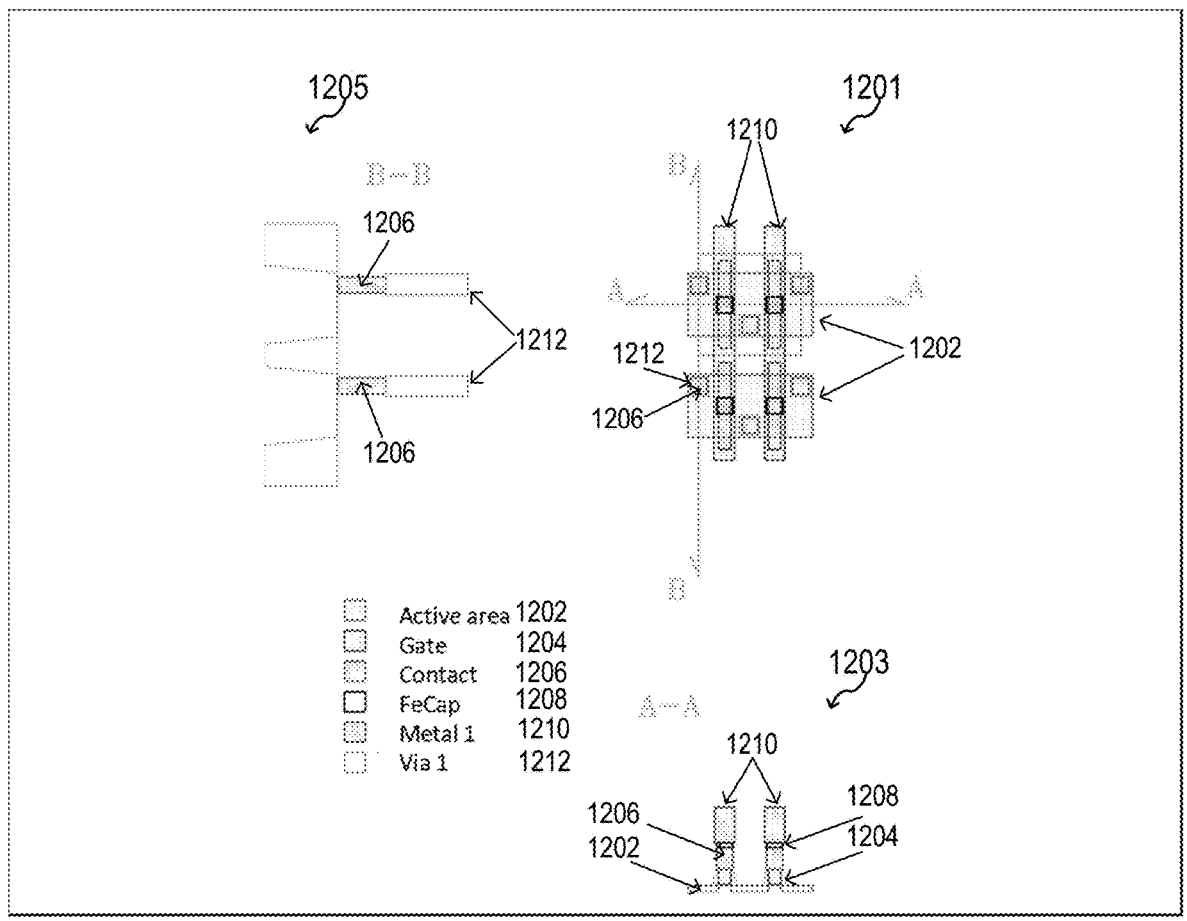
Figure 12G:
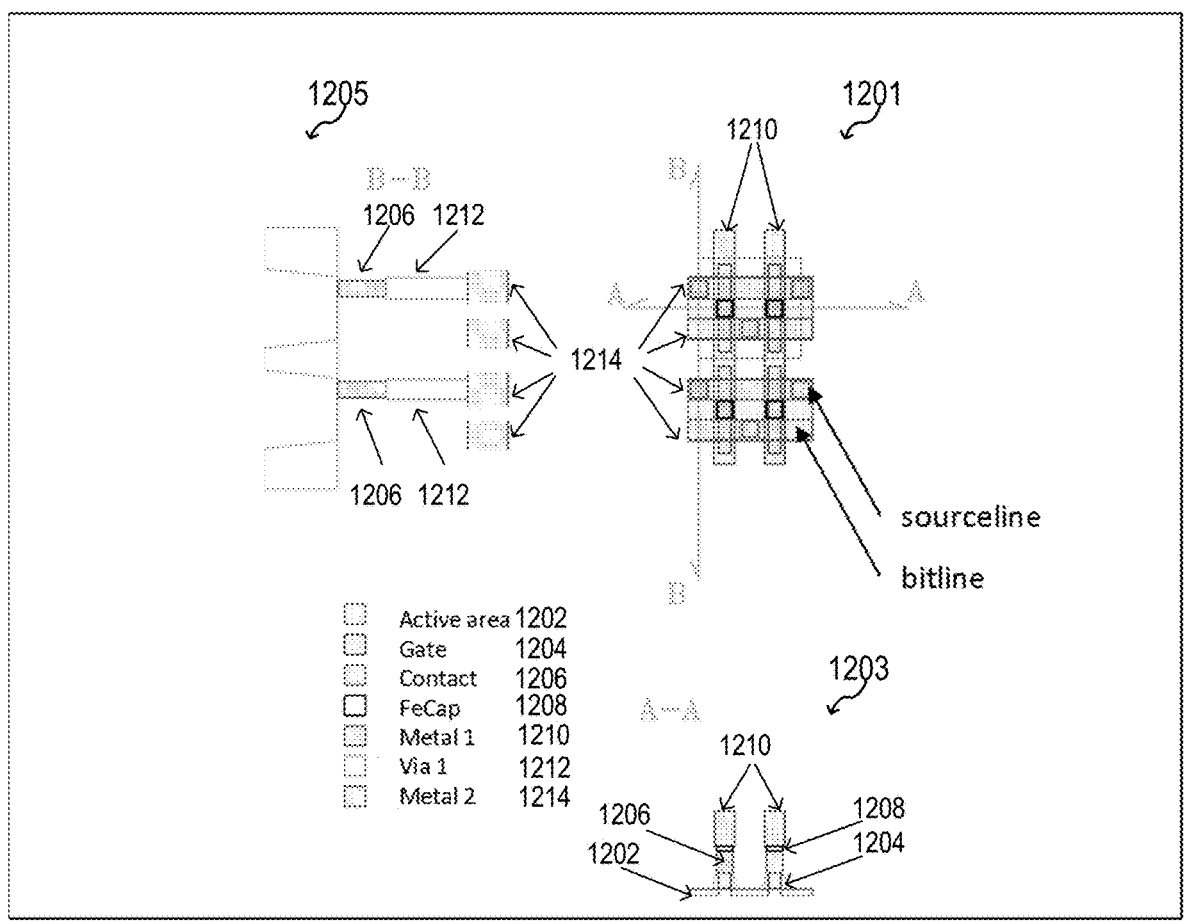

FIG. 7E shows the carrier 212 in a schematic cross-sectional view at a further processing stage, according to various embodiments. According to various embodiments, a planarization process may be carried out (e.g. CMP) after the desired gate structure 122 of the field-effect transistor structure 102 is formed.

In a subsequent processing, the logic area 200b may be finalized, if desired. In this case, the memory area may be protected by a hard mask. As an example, a dummy gate may be used to form the field-effect transistor structure 202 in the logic area, e.g., using an integration in a metal-last process flow, in a HK-last process flow, etc., as described herein. Further, the memory structure 104 may be formed over the field-effect transistor structure 102 in the same or similar way as described above, see, for example, FIG. 6B.

Besides serving as one possible implementation of the memory structure 104 integration above a transistor gate, the trench gate field-effect transistor structure 102 may enable an improved memory cell 100 operation. As an example, the capacitive voltage divider C1/C2 (see FIG. 1A) between memory structure 104 and the series connected field-effect transistor structure 102 may be modified by adapting (e.g., increasing) the transistor gate area. In this implementation, an increase of the gate area may be achieved by using the trench gate.

As an example, subsequent to the carrier processing illustrated in FIG. 7E, any one of the various integrations of the memory structure 104 over the field-effect transistor structure 102 may be carried out.

In one or more embodiments, the field-effect transistor structure 102 of the memory cell 100 (e.g., disposed in the memory area 200a) and/or the field-effect transistor structure 202 in the logic area 200b, may be formed via a gate last process (see, for example, FIG. 2D) or a HK-last process (see, for example, FIG. 2E). These processes are described exemplarily in more detail below.

FIG. 8A to FIG. 8D illustrates a carrier 212 during processing, e.g., during forming a field-effect transistor structure 102, 202 in a gate last process flow, according to various embodiments.

According to various embodiments, a dummy gate electrode structure 822e (e.g., disposed between one or more spacers 252) may be removed. In this case, the gate isolation structure 122i (e.g., an interface layer 122i-1 and a high-k material layer 122i-2) may not be removed. In the case that high-k material layer 122i-2 is represented by a sacrificial layer, it mainly serves the purpose of being an etch stop layer and being removed in succession. The opening 822r generated by removing the dummy gate electrode structure 822e may be filled with the gate electrode structure 122e, 222e. According to various embodiments, at least one metal layer (e.g., a titanium nitride layer) 122e-1 may be deposited into the opening 822r via a conformal deposition process. The remaining part of the opening 822r may be filled with another electrically conductive gate material, e.g., aluminum, poly-silicon, etc. A planarization may be carried out to remove electrically conductive material outside the opening 822r. As illustrated, for example, in FIG. 8D, at least one metal layer 122e-1 of the gate electrode structure 122e may have a u-shape.

FIG. 9A to FIG. 9D illustrates a carrier 212 during processing, e.g., during forming a field-effect transistor structure 102, 202 in a high-k last process flow, according to various embodiments.

According to various embodiments, a dummy gate electrode structure 922e (e.g., disposed between one or more spacers 252, and a dummy high-k or sacrificial layer 922i-2 may be removed. In this case, an interface layer 122i-1 of the gate isolation structure 122i (e.g., a silicon oxide layer) may not be removed. This allows, for example, to maintain a high quality interface to the semiconductor portion in the channel region 112c, 212c. The opening 922r generated by removing the dummy gate electrode structure 922e and the dummy high-k or sacrificial layer 922*i*-2 may be filled with the gate electrode structure 122*e*, 222*e*. According to various embodiments, a high-k material layer 122*i*-2 and at least one metal layer (e.g., a titanium nitride layer) 122*e*-1 of the gate electrode structure 122*e*, 222*e* may be deposited into the opening 922*r* via a conformal deposition process. The remaining part of the opening 922*r* may be filled with another electrically conductive gate material, e.g., aluminum, poly-silicon, etc. A planarization may be carried out to remove high-k material and/or electrically conductive material outside the opening 922*r*. As illustrated, for example, in FIG. 9D, the high-k material layer 122*i*-2 and at least one metal layer 122*e*-1 of the gate electrode structure 122*e* may have a u-shape.

In the following, various schematic memory cell 100 (or electronic device 200) layouts are provided, e.g., a first layout 1000 is provided in FIG. 10A to FIG. 10I, a second layout 1100 is provided in FIG. 11A to FIG. 11I, and a third layout 1200 is provided in FIG. 12A to FIG. 12G.

FIG. 10A to FIG. 10I show a top view 1001 at various stages during processing one or more memory cells 100, according to various embodiments. The overall cell size area of the two cells is illustrated with a frame and serves only as a guide to the eye. The active area 1002 may be a semiconductor portion (e.g., a silicon bulk region or a silicon layer). Cross sections 1003, 1005 are illustrated on the bottom (A-A) and left (B-B).

The layout 1000 illustrates relative positions, sizes, shapes, etc. of the structures used to provide the memory cell 100. As an example, the respective gates 1004 (also referred to as gate structures 122), the contacts 1006 (also referred to as gate contacts, and source/drain contacts), the wiring levels 1008, 1012, 1018 (e.g., metal 1, metal 2, metal 3), the via levels 1010, 1016 (e.g., via 1, via 2), and the memory structure 1014 (e.g., a ferroelectric capacitor, FeCap) are illustrated. The one or more memory cells 100 may be addressed by a sourceline, a wordline and a bitline. According to various embodiments, one or more memory cells 100 may share the same wordline.

FIG. 11A to FIG. 11I show a top view 1101 at various stages during processing one or more memory cells 100, according to various embodiments. The active area 1102 may be a semiconductor portion (e.g., a silicon bulk region or a silicon layer). Cross sections 1103, 1105 are illustrated on the bottom (A-A) and left (B-B).

The layout 1100 illustrates relative positions, sizes, shapes, etc. of the structures used to provide the memory cell 100. As an example, the respective gates 1104 (also referred to as gate structures 122), the contacts 1106 (also referred to as gate contacts, and source/drain contacts), the wiring levels 1108, 1114, 1118 (e.g., metal 1, metal 2, metal 3), the via levels 1112, 1116 (e.g., via 1, via 2), and the memory structure 1110 (e.g., a ferroelectric capacitor, FeCap) are illustrated. The one or more memory cells 100 may be addressed by a sourceline, a wordline and a bitline. According to various embodiments, one or more memory cells 100 may share the same wordline.

FIG. 12A to FIG. 12G show a top view 1201 at various stages during processing one or more memory cells 100, according to various embodiments. The active area 1202 may be a semiconductor portion (e.g., a silicon bulk region or a silicon layer). Cross sections 1203, 1205 are illustrated on the bottom (A-A) and left (B-B).

The layout 1200 illustrates relative positions, sizes, shapes, etc. of the structures used to provide the memory cell 100. As an example, the respective gates 1204 (also referred to as gate structures 122), the contacts 1206 (also referred to as gate contacts, and source/drain contacts), the wiring levels 1210, 1214 (e.g., metal 1, metal 2), the via level 1212 (e.g., via 1), and the memory structure 1208 (e.g., a ferroelectric capacitor, FeCap) are illustrated. The one or more memory cells 100 may be addressed by a sourceline, a wordline and a bitline. According to various embodiments, one or more memory cells 100 may share the same wordline.

Figure 13:
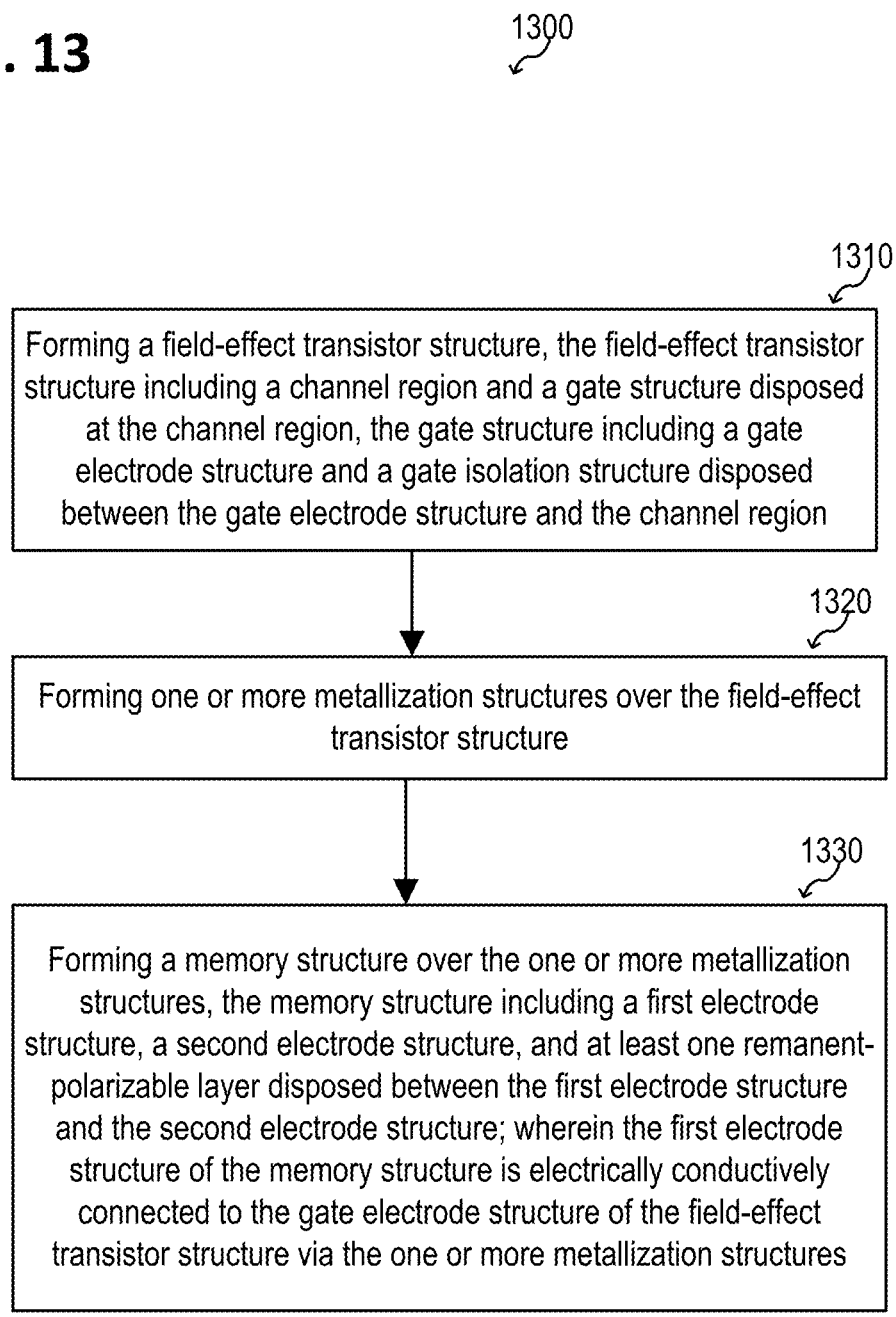
FIG. 13 shows a schematic flow diagram of a method for processing a memory cell, according to various embodiments.

FIG. 13 illustrates a schematic flow diagram of a method 1300 for processing a memory cell 100, according to various embodiments. The method 1300 may include: in 1310, forming a field-effect transistor structure, the field-effect transistor structure including a channel region and a gate structure disposed at the channel region, the gate structure including a gate electrode structure and a gate isolation structure disposed between the gate electrode structure and the channel region; in 1320, forming one or more metallization structures over the field-effect transistor structure; and, in 1330, forming a memory structure over the one or more metallization structures, the memory structure including a first electrode structure, a second electrode structure, and at least one remanent-polarizable layer disposed between the first electrode structure and the second electrode structure; wherein the first electrode structure of the memory structure is electrically conductively connected to the gate electrode structure of the field-effect transistor structure via the one or more metallization structures.

Figure 14A:
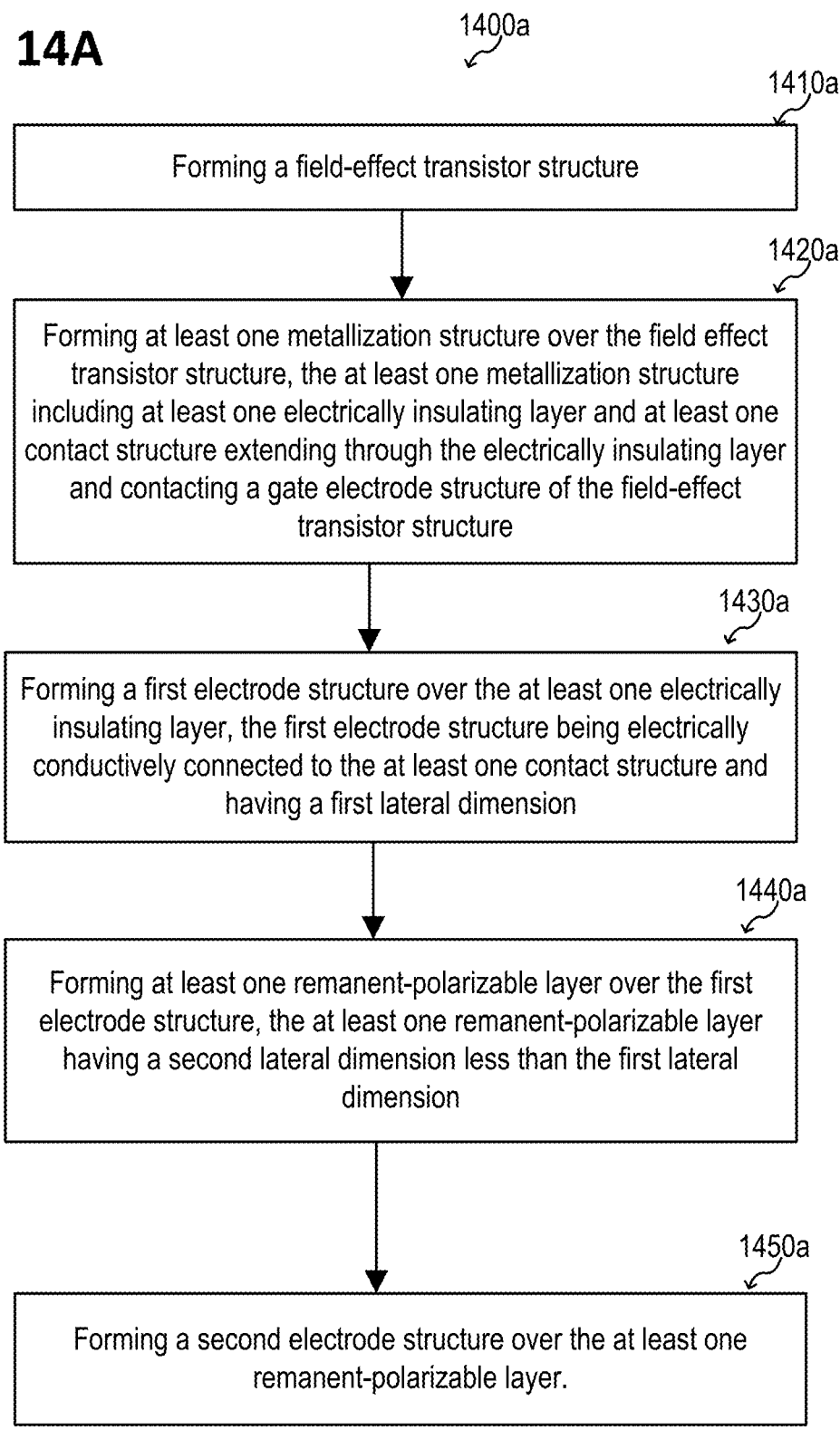

FIG. 14A illustrates a schematic flow diagram of a method 1400*a* for processing a memory cell 100, according to various embodiments. The method 1400*a* may include: in 1410*a*, forming a field-effect transistor structure (e.g., by forming a gate structure, the gate structure including a gate electrode structure and a gate isolation structure disposed between the gate electrode structure and the semiconductor layer); and, in 1420*a*, forming at least one metallization structure over the field-effect transistor structure, the at least one metallization structure including at least one electrically insulating layer and at least one contact structure extending through the electrically insulating layer and contacting a gate electrode structure of the field-effect transistor structure. The method 1400*a* may further include forming a memory structure including: in 1430*a*, forming a first electrode structure over the at least one electrically insulating layer, the first electrode structure being electrically conductively connected to the at least one contact structure and having a first lateral dimension; in 1440*a*, forming at least one remanent-polarizable layer over the first electrode structure, the at least one remanent-polarizable layer having a second lateral dimension less than the first lateral dimension; and, in 1450*a*, forming a second electrode structure over the at least one remanent-polarizable layer. According to various embodiments, a ratio of the lateral dimension of the second electrode structure to the lateral dimension of the first electrode structure may be less than 0.9, e.g., in the range from about 0.01 to about 0.9, e.g., in the range from about 0.1 to about 0.9, e.g., in the range from about 0.1 to about 0.6. According to various embodiments, a ratio of the lateral dimension of the at least one remanent-polarizable layer to the lateral dimension of the first electrode structure may be less than 0.9, e.g., in the range from about 0.01 to about 0.9, e.g., in the range from about 0.1 to about 0.9, e.g., in the range from about 0.1 to about 0.6.

FIG. 14B illustrates a schematic flow diagram of a method 1400*b* for processing a memory cell 100, according to various embodiments. The method 1400*a* may include: in 1410*b*, forming a field-effect transistor structure (e.g., by forming a gate structure, the gate structure including a gate electrode structure and a gate isolation structure disposed between the gate electrode structure and the semiconductor layer); and, in 1420b, forming at least one metallization structure over the field-effect transistor structure, the at least one metallization structure including at least one electrically insulating layer and at least one contact structure extending through the electrically insulating layer and contacting a gate electrode structure of the field-effect transistor structure. The method 1400b may further include forming a memory structure including: in 1430b, forming a first electrode structure over the at least one electrically insulating layer, the first electrode structure being electrically conductively connected to the at least one contact structure and having a first lateral dimension; in 1440b, forming at least one remanent-polarizable layer over the first electrode structure; and, in 1450b, forming a second electrode structure over the at least one remanent-polarizable layer, the second electrode structure having a second lateral dimension less than the first lateral dimension. According to various embodiments, a ratio of the lateral dimension of the second electrode structure to the lateral dimension of the first electrode structure may be less than 0.9, e.g., in the range from about 0.01 to about 0.9, e.g., in the range from about 0.1 to about 0.9, e.g., in the range from about 0.1 to about 0.6. According to various embodiments, a ratio of the lateral dimension of the second electrode structure to the lateral dimension of at least one remanent-polarizable layer may be less than 0.9, e.g., in the range from about 0.01 to about 0.9, e.g., in the range from about 0.1 to about 0.9, e.g., in the range from about 0.1 to about 0.6.

According to various embodiments, a lateral dimension may be a width or a diameter of the respective structure.

Figure 15A:
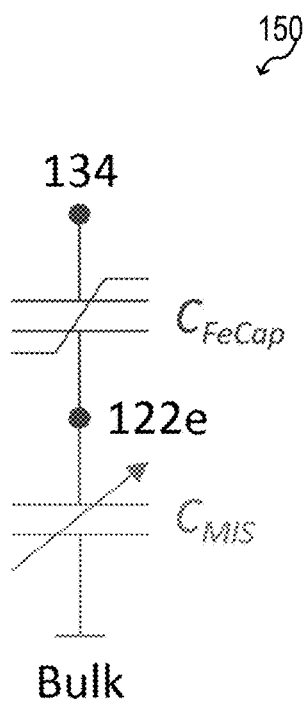
FIG. 15A shows an equivalent circuit for a memory cell, according to various embodiments.

FIG. 15A illustrates a field-effect transistor structure 102 and a memory structure 104 coupled to the field-effect transistor structure 102 configured as a capacitive voltage divider. In order to reduce the write voltage and increase endurance as well as retention of memory cell 100, it may be desirable to adjust the capacitive voltage divider, as described above.

According to various embodiments, the memory cell 100 may be illustrated by a series connection of a ferroelectric capacitor (e.g., a metal-ferroelectric-metal (MFM) capacitor, also referred to as FeCap or C2) and the variable capacitance, $C_{MIS}$, of the remaining gate stack (e.g., a metal-insulator-semiconductor (MIS) gate stack, also referred to as C1), as, for example, illustrated in FIG. 15A.

In a first approximation, the voltage which drops across the ferroelectric capacitor ($V_{FeCap}$) may be estimated by:

$$V_{FeCap} = V_{134} \cdot \frac{C_{MIS}}{C_{MIS} + C_{FeCap}}$$

wherein $V_{134}$ represents the voltage applied to the gate and the capacitances in general are defined as:

$$C = \varepsilon_0 \varepsilon_r \frac{A}{d}$$

with $\varepsilon^0$ and $\varepsilon^r$ being the vacuum and relative permittivity and A and d the area and the thickness of the capacitors respectively.

Assuming that Er may only be modified in very limited range since it is a material constant and furthermore assuming that variations of the film thicknesses d of the capacitors may be limited (e.g., due to write voltage and leakage current restrictions) as well, a suitable parameter for influencing the voltage drop across the ferroelectric capacitor that may be represented by the area of the capacitors and their relative proportions.

As an example, assuming both Er and d are identical for both ferroelectric capacitor and remaining gate stack, the capacitive voltage drop for an area ratio of 1:3 becomes:

$$V_{FeCap} = V_{134} \cdot \frac{C_{MIS}}{C_{MIS} + C_{FeCap}} \stackrel{3 \cdot A_{FeCap} = A_{MIS}}{=} V_{134} \cdot \frac{3}{4} = 75\% \cdot V_{134}.$$

Accordingly, modifying the area ratio of capacitors may allow improving the memory cell 100 performance (the write voltage, the endurance, the retention, etc.), as described above.

Figure 15B:
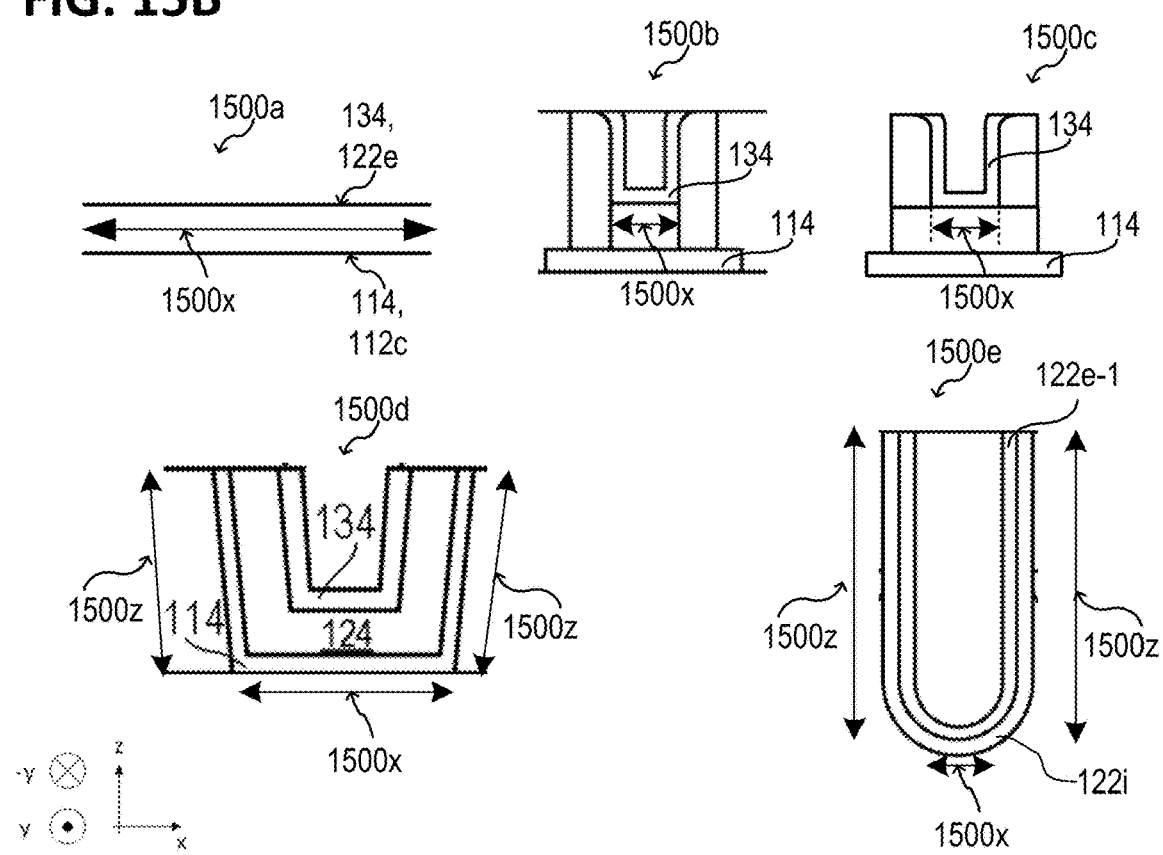
FIG. 15B shows various capacitor structures, according to various embodiments.

In FIG. 15B, the capacitor area contributions are illustrated for the various capacitor structures 1500a, 1500b, 1500c, 1500d, 1500e.

Planar capacitor structures 1500a, 1500b, 1500c may have an x-contribution 1500x associated with the (lateral) dimension of the capacitor structures 1500a, 1500b, 1500c in x-direction, and (out of plane) a y-contribution associated with the (lateral) dimension of the capacitor structures 1500a, 1500b, 1500c in y-direction perpendicular to the x-direction. The x-y-plane may be aligned with the main processing surface of the carrier on which the capacitor structures 1500a, 1500b, 1500c are formed. The capacitor structures 1500b, 1500c (see FIG. 3A and FIG. 3B) may have a reduced x-contribution 1500x compared to the capacitor structure 1500a due to the reduced width of the top electrode.

Non-planar (e.g., 3D-) capacitor structures 1500d, 1500e may have an x-contribution 1500x associated with the (lateral) dimension of the capacitor structures 1500d, 1500e in x-direction, (out of plane) a y-contribution associated with the (lateral) dimension of the capacitor structures 1500d, 1500e in y-direction perpendicular to the x-direction, and a z-contribution associated with the (vertical) dimension of the capacitor structures 1500d, 1500e in z-direction perpendicular to the x- and y-directions.

According to various embodiments, the effective area of the capacitor structures 1500a, 1500b, 1500c, 1500d, 1500e may be geometrically determined, e.g., via an orthogonal projection. As an example, in the case that a capacitor includes non-planar (e.g., angled, see FIG. 6E) sections, the capacitor area (also referred to as effective capacitor area) may be determined by considering sections of the capacitor in which the corresponding electrode sections are equidistant. As illustrated, for example, in FIG. 15B, the effective area contributions (e.g., in the x-y-plane, and in the z-y-plane) may be associated with the capacitance contributions 1500x, 1500z, as described above. In some aspects, e.g., as a first approximation, stray fields (e.g., arising in the corners of the capacitor and/or outside the effective area) may be neglected for determining the effective area and the capacitance contributions.

In the following, various examples are provided that may refer to one or more embodiments described herein.

Example 1 is a memory cell, including: a field-effect transistor structure including a channel region and a gate structure disposed at the channel region, the gate structure including a gate electrode structure and a gate isolation structure disposed between the gate electrode structure and the channel region; a memory structure including a first electrode structure (also referred to as bottom electrode), a second electrode structure (also referred to as top electrode), and at least one remanent-polarizable layer (e.g., based on at least one ferroelectric material) disposed between the first electrode structure and the second electrode structure; wherein the first electrode structure of the memory structure is electrically conductively connected to the gate electrode structure of the field-effect transistor structure. According to various embodiments, the memory structure may be ferroelectric capacitor (FeCap). According to various embodiments, the field-effect transistor structure may be a MIS (metal-insulator-semiconductor) structure. According to various embodiments, the gate electrode structure of the field-effect transistor structure may be configured as a floating gate.

In Example 2, the memory cell of example 1 may further include that the field-effect transistor structure further includes a semiconductor portion and at least a first source/drain region and a second source/drain region disposed in the semiconductor portion; and that the channel region extends in the semiconductor portion from the first source/drain region to the second source/drain region.

In Example 3, the memory cell of example 1 or 2 may further include that the first electrode structure of the memory structure is in direct physical contact with the gate electrode structure of the field-effect transistor structure.

In Example 4, the memory cell of example 3 may further include a contact metallization disposed over the field-effect transistor structure and the memory structure, the contact metallization including at least one memory contact structure electrically contacting the second electrode structure of the memory structure.

In Example 5, the memory cell of example 1 may further include one or more metallization structures disposed over the field-effect transistor structure, the one or more metallization structures configured to electrically connect the gate electrode structure of the field-effect transistor structure to the first electrode structure of the memory structure.

In Example 6, the memory cell of example 5 may further include that the one or more metallization structures include a contact metallization at least partially disposed between the field-effect transistor structure and the memory structure.

In Example 7, the memory cell of example 5 may further include that the one or more metallization structures include a contact metallization and a single- or multilevel metallization disposed over the contact metallization; and that both the contact metallization and at least one level of the single- or multilevel metallization are disposed between the field-effect transistor structure and the memory structure.

In Example 8, the memory cell of example 1 may further include a contact metallization disposed over the field-effect transistor structure, the contact metallization including at least one gate contact disposed between the field-effect transistor structure and the memory structure, the at least one gate contact electrically contacting the gate electrode structure of the field-effect transistor structure and extending to the first electrode structure of the memory structure.

In Example 9, the memory cell of example 8 may further include that the at least one gate contact is embedded into one or more electrically insulating layers and extends from a first side of the one or more electrically insulating layers facing the field-effect transistor structure to a second side of the one or more electrically insulating layers facing the memory structure.

In Example 10, the memory cell of example 8 or 9 may further include that the contact metallization further includes at least one memory contact structure disposed over the memory structure, the at least one memory contact structure electrically contacting the second electrode structure of the memory structure.

In Example 11, the memory cell of example 10 may further include that the at least one memory contact structure is embedded into one or more additional electrically insulating layers and extending from a first side of the one or more additional electrically insulating layers facing the memory structure to a second side of the one or more additional electrically insulating layers facing away from the memory structure.

In Example 12, the memory cell of any one of examples 8 to 11 may further include a single- or multilevel metallization disposed over the contact metallization and including a wiring structure embedded into one or more electrically insulating layers, the wiring structure being electrically conductively connected to the at least one memory contact structure.

In Example 13, the memory cell of example 12 may further include that the wiring structure includes one or more vias and/or one or more metal lines.

In Example 14, the memory cell of example 12 or 13 may further include that the contact metallization further includes at least one first source/drain contact and at least one second source/drain contact disposed over the field-effect transistor structure, the at least one first source/drain contact and the at least one second source/drain are configured to contact a first source/drain region and a second source drain region of the field-effect transistor structure.

In Example 15, the memory cell of example 14 may further include that the single level or multilevel metallization includes one or more additional wiring structures embedded into the one or more electrically insulating layers, the one or more additional wiring structures being electrically conductively connected to the at least one first source/drain contact and the at least one second source/drain contact. The single level or multilevel metallization may include a first source/drain wiring structure embedded into the one or more electrically insulating layers and a second source/drain wiring structure embedded into the one or more electrically insulating layers, the first source/drain wiring structure being electrically conductively connected to the at least one first source/drain contact and the second source/drain wiring structure being electrically conductively connected to the at least one second source/drain contact.

In Example 16, the memory cell of any one of examples 1 to 15 may further include that the at least one remanent-polarizable layer includes at least one ferroelectric material.

In Example 17, the memory cell of example 16 may further include that the at least one remanent-polarizable layer includes at least one of hafnium oxide or zirconium oxide.

In Example 18, the memory cell of any one of examples 1 to 17 may further include that the memory structure further includes at least one dielectric portion adjacent to the at least one remanent-polarizable layer and disposed between the first electrode structure and the second electrode structure.

In Example 19, the memory cell of any one of examples 1 to 18 may further include that the first electrode structure includes at least one layer of an electrically conductive material, and that a lateral dimension of the at least one layer is greater than a lateral dimension of the at least one remanent-polarizable layer and/or greater than a lateral dimension of the second electrode.

In Example 20, the memory cell of any one of examples 1 to 19 may further include that the memory structure has a concave shape.

In Example 21, the memory cell of example 20 may further include that the memory structure has one or more angled sections and/or one or more arcuated sections.

In Example 22, the memory cell of any one of examples 1 to 21 may further include the gate structure of the field-effect transistor structure includes at least one of the following types of gate structures: a high-k metal gate structure in metal-last configuration; a high-k metal gate structure in gate-first configuration; a high-k metal gate structure in high-k last configuration; a poly-silicon/silicon oxide gate structure; or a poly-silicon/silicon oxynitride gate structure.

In Example 23, the memory cell of any one of examples 1 to 22 may further include that the field-effect transistor structure includes at least one of the following types of field-effect transistor structures: a fully depleted silicon on insulator field-effect transistor structure; a fin field-effect transistor structure; a trench gate field-effect transistor structure; a nanosheet field-effect transistor structure; or a nanowire field-effect transistor structure.

In Example 24, the memory cell of any one of examples 1 to 23 may further include that the gate electrode structure, the gate isolation structure, and the channel region forming a first capacitor structure defining a capacitor area of a first area size; and that the first electrode structure, the at least one remanent-polarizable layer, and the second electrode structure forming a second capacitor structure defining a capacitor area of a second area size less than the first area size.

Example 25 is a memory cell, including: a field-effect transistor structure including a channel region and a gate structure disposed at the channel region, the gate structure including a gate electrode structure and a gate isolation structure disposed between the gate electrode structure and the channel region, the gate electrode structure and the gate isolation structure forming a first capacitor structure with a first capacitor area of a first area size; and a memory structure including a first electrode structure, a second electrode structure, and at least one remanent-polarizable layer disposed between the first electrode structure and the second electrode structure, the second electrode structure and the at least one remanent-polarizable layer forming a second capacitor structure with a second capacitor area of a second area size less than the first area size.

In Example 26, the memory cell of example 25 may further include that the capacitor area of the respective capacitor structure is defined by both a top and bottom electrode of the capacitor structure and their respective projections onto each other.

In Example 27, the memory cell of example 26 may further include that a ratio of the second area size to the first area size is less than 0.9. According to various embodiments, ratio of the second area size to the first area size may be less than 0.75, e.g., in the range from about 0.01 to about 0.9, e.g., in the range from about 0.1 to about 0.9.

In Example 28, the memory cell of example 27 may further include that the first capacitor area faces the channel region of the field-effect transistor structure; and that the second capacitor area faces the first electrode structure of the memory structure.

In Example 29, the memory cell of example 27 or 28 may further include that the first electrode structure of the memory structure is electrically conductively connected to the gate electrode structure of the field-effect transistor structure.

In Example 30, the memory cell of any one of examples 25 to 29 may further include that the memory structure is spaced apart from the gate electrode structure and electrically connected with the gate electrode structure via at least one metallization structure.

According to various embodiments, the first capacitor area may be defined by a projection of the gate electrode structure to the channel region; and the second capacitor area may be defined by a projection of the second electrode structure of the memory structure to the first electrode structure of the memory structure.

Example 31 is an electronic device, including: a carrier including a memory area and a logic area; a field-effect transistor structure disposed in the memory area and a field-effect transistor structure disposed in the logic area, each of the field-effect transistor structures including a channel region and a gate structure disposed at the channel region, the gate structure including a gate electrode structure and a gate isolation structure disposed between the gate electrode structure and the channel region; and a memory structure provided in the memory area, the memory structure including a first electrode structure, a second electrode structure, and at least one remanent-polarizable layer disposed between the first electrode structure and the second electrode structure; wherein the first electrode structure of the memory structure is electrically conductively connected to the gate electrode structure of the first field-effect transistor structure in the memory area.

Example 32 is an electronic device, including: a carrier including a memory area and a logic area; a field-effect transistor structure disposed in the memory area and a field-effect transistor structure disposed in the logic area, each of the field-effect transistor structures including a channel region and a gate structure disposed at the channel region, the gate structure including a gate electrode structure and a gate isolation structure disposed between the gate electrode structure and the channel region, wherein the gate electrode structure and the gate isolation structure forming a first capacitor structure with a first capacitor area of a first area size; a memory structure provided in the memory area, the memory structure including a first electrode structure, a second electrode structure, and at least one remanent-polarizable layer disposed between the first electrode structure and the second electrode structure, wherein the second electrode structure and the at least one remanent-polarizable layer forming a second capacitor structure with a second capacitor area of a second area size less than the first area size.

In Example 33, the electronic device of example 32 may further include that the first capacitor area is defined by a geometric (e.g., orthogonal) projection of the gate electrode structure to the channel region; and that the second capacitor area is defined by a geometric (e.g., orthogonal) projection of the second electrode structure of the memory structure to the first electrode structure of the memory structure.

In Example 34, the electronic device of example 31 or 32 may further include that the field-effect transistor structure disposed in the memory area has substantially the same structure as the field-effect transistor structure disposed in the logic area.

In Example 35, the electronic device of example 31 or 32 may further include that the field-effect transistor structure disposed in the memory area is of a different type than the field-effect transistor structure disposed in the logic area.

Example 36 is a method for processing a memory cell, the method including: forming a field-effect transistor structure including: forming a trench (e.g., into a semiconductor layer or over a semiconductor layer), and forming a gate structure in the trench, the gate structure including a gate electrode structure and a gate isolation structure disposed between the gate electrode structure and the semiconductor layer; and forming a memory structure including: forming a first electrode structure, a second electrode structure, and at least one remanent-polarizable layer disposed between the first electrode structure and the second electrode structure, wherein the first electrode structure of the memory structure is electrically conductively connected to the gate electrode structure of the first field-effect transistor structure in the memory area.

In Example 37, the method of example 36 may further include that the gate electrode structure and the gate isolation structure are formed to provide a first capacitor structure with a first capacitor area of a first area size; and that the second electrode structure and the at least one remanent-polarizable layer are formed to provide a second capacitor structure with a second capacitor area of a second area size less than the first area size.

Example 38 is a method for processing a memory cell, the method including: forming a field-effect transistor structure including: forming a gate structure, the gate structure including a gate electrode structure and a gate isolation structure disposed between the gate electrode structure and a semiconductor layer; and forming at least one metallization structure over the field-effect transistor structure, the at least one metallization structure including at least one electrically insulating layer and at least one contact structure extending through the electrically insulating layer and contacting the gate electrode structure; and further forming a memory structure including: forming a first electrode structure over the at least one electrically insulating layer, the first electrode structure being electrically conductively connected to the at least one contact structure and having a first lateral dimension; forming at least one remanent-polarizable layer over the first electrode structure, the at least one remanent-polarizable layer having a second lateral dimension less than the first lateral dimension; and forming a second electrode structure over the at least one remanent-polarizable layer.

In Example 39, the method of example 38 may further include that forming the at least one remanent-polarizable layer includes: forming at least one additional electrically insulating layer over the first electrode structure; patterning the at least one additional electrically insulating layer to form an opening that at least partially exposes the first electrode structure, wherein the opening defines second lateral dimension; and forming the at least one remanent-polarizable layer in the opening.

In Example 40, the method of example 39 may further include that patterning the at least one additional electrically insulating layer includes forming an auxiliary opening that at least partially exposes the first electrode structure and forming a sidewall spacer at an inner sidewall of the auxiliary opening to form the opening defining the second lateral dimension.

In Example 41, the method of any one of examples 39 or 40 may further include that the second electrode structure is formed at least partially in the opening.

In Example 42, the method of any one of examples 38 to 41 may further include that the second electrode structure has the second lateral dimension.

Example 43 is a memory cell, including: a field-effect transistor structure including a channel region and a gate structure disposed at the channel region, the gate structure including a gate electrode structure and a gate isolation structure disposed between the gate electrode structure and the channel region; and a memory structure including a memory electrode structure and at least one remanent-polarizable layer disposed between the gate electrode structure and the memory electrode structure.

In Example 44, the memory cell of example 43 may further include that the gate electrode structure in direct physical contact with both the gate isolation structure and the at least one remanent-polarizable layer.

Example 45 is a method for processing a memory cell, the method including: forming a field-effect transistor structure, the field-effect transistor structure including a channel region and a gate structure disposed at the channel region, the gate structure including a gate electrode structure and a gate isolation structure disposed between the gate electrode structure and the channel region; forming one or more metallization structures over the field-effect transistor structure; and forming a memory structure over the one or more metallization structures, the memory structure including a first electrode structure, a second electrode structure, and at least one remanent-polarizable layer disposed between the first electrode structure and the second electrode structure; wherein the first electrode structure of the memory structure is electrically conductively connected to the gate electrode structure of the field-effect transistor structure via the one or more metallization structures.

Example 46 is a memory structure, including: a first electrode structure, at least one remanent-polarizable layer disposed over the first electrode structure, a second electrode structure disposed over the at least one remanent-polarizable layer, a spacer structure disposed at an upper surface of the first electrode structure and laterally surrounding the at least one remanent-polarizable layer and the second electrode structure. Further, a lateral dimension of the second electrode structure may be less than the lateral dimension of the first electrode structure. Further, a lateral dimension of the at least one remanent-polarizable layer may be less than the lateral dimension of the first electrode structure.

Example 47 is a memory structure, including: a first electrode structure, at least one remanent-polarizable layer disposed over the first electrode structure, a second electrode structure disposed over the at least one remanent-polarizable layer, a spacer structure disposed at an upper surface of the at least one remanent-polarizable layer and laterally surrounding the second electrode structure. Further, a lateral dimension of the second electrode structure may be less than the lateral dimension of the first electrode structure. Further, a lateral dimension of the second electrode structure may be less than the lateral dimension of the at least one remanent-polarizable layer. Further, a lateral dimension of the at least one remanent-polarizable layer may be equal to the lateral dimension of the first electrode structure.

According to various embodiments, the at least one remanent-polarizable layer may consist of a monocrystalline portion (e.g., of a single crystal grain) of a remanent-polarizable material. Accordingly, the lateral and vertical dimension of the at least one remanent-polarizable layer may be defined by the lateral and vertical dimension of a single crystal grain of the remanent-polarizable material. The remanent-polarizable material may be a ferroelectric material, e.g., ferroelectric hafnium oxide. However, ferroelectric hafnium oxide may be also referred to as remanent-polarizable hafnium oxide.

Various embodiments may be related to the use of dummy structures. A dummy structure may be a structure that is used during processing as a space holder for a structure formed at a subsequent processing stage. The dummy structure may be replaced by any desired structure during processing. As an example, the dummy structure may be removed to form an opening with a desired shape and size, wherein this opening is utilized for further processes.

Various embodiments may be related to a remanent-polarizable layer or a remanent-polarizable material, however, the term "remanent-polarizable" may be understood in some aspects as "spontaneously-polarizable" and vice versa.

According to various embodiments, the memory structure 104 may include ferroelectric $HfO_2$ that allows the integration of a ferroelectric capacitor structure with a small feature size, e.g., the at least one remanent-polarizable layer may be ferroelectric $HfO_2$ layer that is still ferroelectric at a layer thickness of about 10 nm or less, e.g., in the range from about 2 nm to about 10 nm. Other ferroelectric materials may lose their ferroelectric properties for film thicknesses of around and below 10 nm. This may be relevant, for example, in technology nodes (e.g., <28 nm) in which the transistor geometries become smaller.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell, comprising:
a field-effect transistor structure comprising a channel region and a gate structure disposed on at least two opposing sides of the channel region, the gate structure comprising a gate electrode structure and a gate isolation structure disposed between the gate electrode structure and the channel region; and
a memory structure comprising a first electrode structure, a second electrode structure, and at least one remanent-polarizable layer disposed between the first electrode structure and the second electrode structure,
wherein the first electrode structure of the memory structure is electrically conductively connected to the gate electrode structure of the field-effect transistor structure.

2. The memory cell of claim 1,
wherein the channel region is a fin-shaped channel region, and
wherein the gate structure is disposed on at least two opposing planar surfaces of the fin-shaped channel region.

3. The memory cell of claim 1,
wherein the channel region comprises a nanosheet or nanowire, and
wherein the gate isolation structure completely surrounds a perimeter of the nanosheet or nanowire.

4. The memory cell of claim 1,
wherein at least part of the gate isolation structure has a curved shape.

5. The memory cell of claim 1,
wherein the field-effect transistor structure further comprises a semiconductor portion and at least a first source/drain region and a second source/drain region disposed in the semiconductor portion; and wherein the channel region extends in the semiconductor portion from the first source/drain region to the second source/drain region.

6. The memory cell of claim 1,
wherein the first electrode structure of the memory structure is in direct physical contact with the gate electrode structure of the field-effect transistor structure.

7. The memory cell of claim 6, further comprising:
a contact metallization disposed over the field-effect transistor structure and the memory structure, the contact metallization comprising at least one memory contact structure electrically contacting the second electrode structure of the memory structure.

8. The memory cell of claim 1, further comprising:
one or more metallization structures disposed over the field-effect transistor structure, the one or more metallization structures configured to electrically connect the gate electrode structure of the field-effect transistor structure to the first electrode structure of the memory structure.

9. The memory cell of claim 8,
wherein the one or more metallization structures comprise a contact metallization at least partially disposed between the field-effect transistor structure and the memory structure.

10. The memory cell of claim 8,
wherein the one or more metallization structures comprise a contact metallization and a single- or multilevel metallization disposed over the contact metallization; wherein both the contact metallization and at least one level of the single- or multilevel metallization are disposed between the field-effect transistor structure and the memory structure.

11. The memory cell of claim 1,
wherein the at least one remanent-polarizable layer comprises at least one ferroelectric material.

12. The memory cell of claim 1,
wherein the first electrode structure comprises at least one layer of an electrically conductive material, and wherein a lateral dimension of the at least one layer is greater than a lateral dimension of the at least one remanent-polarizable layer or greater than the lateral dimension of the second electrode structure.

13. The memory cell of claim 8,
wherein the memory structure has a concave shape.

14. The memory cell of claim 1,
wherein the memory structure has one or more angled sections and/or one or more arcuated sections.

15. The memory cell of claim 1,
wherein the field-effect transistor structure is a fin field-effect transistor structure.

16. The memory cell of claim 1,
wherein the field-effect transistor structure is a nanosheet field-effect transistor structure.

17. The memory cell of claim 1,
wherein the field-effect transistor structure is a nanowire field-effect transistor structure.

18. The memory cell of claim 1,
wherein the gate electrode structure, the gate isolation structure, and the channel region forming a first capacitor structure defining a capacitor area of a first area size; and
wherein the first electrode structure, the at least one remanent-polarizable layer, and the second electrode structure forming a second capacitor structure defining a capacitor area of a second area size less than the first area size.

19. A memory cell, comprising:
a field-effect transistor structure comprising a channel region and a gate structure disposed on at least two opposing sides of the channel region, the gate structure comprising a gate electrode structure and a gate isolation structure disposed between the gate electrode structure and the channel region, the gate electrode structure and the gate isolation structure forming a first capacitor structure with a first capacitor area of a first area size;

a memory structure comprising a first electrode structure, a second electrode structure, and at least one remanent-polarizable layer disposed between the first electrode structure and the second electrode structure, the second electrode structure and the at least one remanent-polarizable layer forming a second capacitor structure with a second capacitor area of a second area size less than the first area size.

20. A method for processing a memory cell, the method comprising:

forming a field-effect transistor structure, the field-effect transistor structure comprising a channel region and a gate structure disposed on at least two opposing sides of the channel region, the gate structure comprising a gate electrode structure and a gate isolation structure disposed between the gate electrode structure and the channel region;

forming one or more metallization structures over the field-effect transistor structure; and forming a memory structure over the one or more metallization structures, the memory structure comprising a first electrode structure, a second electrode structure, and at least one remanent-polarizable layer disposed between the first electrode structure and the second electrode structure; wherein the first electrode structure of the memory structure is electrically conductively connected to the gate electrode structure of the field-effect transistor structure via the one or more metallization structures.

* * * * *